US012733326B2

(12) United States Patent
Choi et al.

(10) Patent No.: US 12,733,326 B2
(45) Date of Patent: Sep. 8, 2026

(54) DISPLAY DEVICE

(71) Applicant: Samsung Display Co., LTD., Yongin-si (KR)

(72) Inventors: Hae Yun Choi, Hwaseong-si (KR); Min Woo Kim, Hwaseong-si (KR); Jin Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 999 days.

(21) Appl. No.: 17/719,238

(22) Filed: Apr. 12, 2022

(65) Prior Publication Data

US 2023/0052793 A1 Feb. 16, 2023

(30) Foreign Application Priority Data

Aug. 10, 2021 (KR) ........................ 10-2021-0105352

(51) Int. Cl.

| | |
|---|---|
| ***H10H 29/14*** | (2025.01) |
| ***H10H 20/84*** | (2025.01) |
| ***H10W 72/20*** | (2026.01) |

(52) U.S. Cl.

CPC .......... *H10H 29/142* (2025.01); *H10H 20/84* (2025.01); *H10W 72/20* (2026.01)

(58) Field of Classification Search

CPC .... H10H 29/84; H10H 29/841; H10H 29/842; H10H 29/8421; H10H 20/831; H10H 29/8321; H10K 59/124; H10K 50/813; H10K 50/822

See application file for complete search history.

(56) References Cited

U.S. PATENT DOCUMENTS

| | | | | |
|---|---|---|---|---|
| 6,483,236 | B1 * | 11/2002 | Hung | H10K 50/11 313/506 |
| 8,362,694 | B2 * | 1/2013 | Hanawa | H10K 59/131 313/506 |
| 11,227,905 | B2 | 1/2022 | Kim et al. | |
| 11,610,938 | B2 | 3/2023 | Kim et al. | |
| 12,094,920 | B2 | 9/2024 | Kim et al. | |
| 2002/0158835 | A1 * | 10/2002 | Kobayashi | H10K 59/80522 345/100 |
| 2004/0183436 | A1 * | 9/2004 | Ito | H10K 59/878 313/506 |
| 2020/0127173 | A1 | 4/2020 | Park et al. | |

FOREIGN PATENT DOCUMENTS

| | | | |
|---|---|---|---|
| KR | 2018-0118488 | A | 10/2018 |
| KR | 2020-0049945 | A | 5/2020 |
| KR | 10-2020-0069729 | A | 6/2020 |
| KR | 2020-0119444 | A | 10/2020 |
| KR | 10-2021-0054117 | A | 5/2021 |

* cited by examiner

*Primary Examiner* — Amar Movva

(74) *Attorney, Agent, or Firm* — Womble Bond Dickinson (US) LLP

(57) ABSTRACT

A display device including: a substrate including pixel electrodes; a passivation layer on the substrate, a groove in the passivation layer between the pixel electrodes; contact electrodes on the pixel electrodes; and a light-emitting element layer comprising a plurality of light-emitting elements respectively bonded onto the contact electrodes and having a plurality of semiconductor layers thereon. The groove does not overlap the plurality of light-emitting elements.

20 Claims, 56 Drawing Sheets

DA
EA1
EA2
EA3
EA4
SEM3
SEM2
INS1
RF1
SLT
MQW
EBL
SEM1
126
125
LE, 120
LE1
LE2
LE3
LE4
112
CINS
111
PXC
110
GR1
GR2
CC
DR3
DR1
DR2

100
DA
NEA
EA1
NEA
EA2
NEA
EA3
NEA
EA4
NEA
LE1
PW
LE2
LE3
LE4
OP
SEM3
SEM2
INS1
RF1
SLT
MQW
EBL
SEM1
126
125
GR
112
CINS
111
PXC
LE, 120
110
B
B'
DR1
DR2
DR3

DISPLAY DEVICE

CROSS-REFERENCE TO RELATED APPLICATION

This application claims priority to and the benefit of Korean Patent Application No. 10-2021-0105352, filed on Aug. 10, 2021, in the Korean Intellectual Property Office, the contents of which are herein incorporated by reference in their entirety.

BACKGROUND

1. Field

Aspects of embodiments of the present disclosure relate to a display device.

2. Description of the Related Art

With the advancement of the information age, the demand for a display device for displaying an image in various forms has increased. The display device may be a flat panel display device, such as a liquid crystal display device, a field emission display device, and a light-emitting display. The light-emitting display device may include an organic light-emitting display device including an organic light-emitting diode element as a light-emitting element, an inorganic light-emitting display device including an inorganic semiconductor element as a light-emitting element, and/or a micro light-emitting diode element as a light-emitting element.

Recently, a head mounted display including a light-emitting display device has been developed. The head mounted display (HMD) is a glasses type monitor device for a virtual reality (VR) or augmented reality (AR) application, which is worn by a user in the form of glasses or a helmet and forms a focused image at a distance close to eyes of the user.

A high-resolution, micro light-emitting diode display panel including a micro light-emitting diode element may be applied to a head mounted display. Because the micro light-emitting diode element emits light of a single color, the micro light-emitting diode display panel may include a wavelength conversion layer for converting a wavelength of light emitted from (or emitted by) the micro light-emitting diode element to display various colors.

BRIEF SUMMARY

Aspects and features of embodiments of the present disclosure i provide a display device that may reduce the occurrence of or prevent a short between light-emitting elements and, therefore, may reduce the occurrence of or prevent a defect caused by a short from occurring.

Aspects and features of the present disclosure are not limited to those mentioned above, and additional aspects and features of the present disclosure, which are not mentioned herein, will be clearly understood by those skilled in the art from the following description of the present disclosure.

According to an embodiment of the present disclosure, the display device includes a substrate including pixel electrodes, a passivation layer on the substrate and having a groove between the pixel electrodes, contact electrodes on the pixel electrodes, and a light-emitting element layer including a plurality of light-emitting elements respectively bonded onto the contact electrode and having a plurality of semiconductor layers thereon. The groove does not overlap the plurality of light-emitting elements.

In an embodiment, the groove may extend around a periphery of the plurality of light-emitting elements and is between the plurality of light-emitting elements.

In an embodiment, the groove may be between the contact electrodes, and a width of the groove may be smaller than a distance between the contact electrodes.

In an embodiment, the passivation layer may have openings that expose the pixel electrodes, and the groove may be between the openings.

In an embodiment, the groove may have a mesh shape.

In an embodiment, a length of the groove may be smaller than or equal to a width of the plurality of light-emitting elements.

In an embodiment, a depth of the groove may be smaller than or equal to a thickness of the passivation layer.

In an embodiment, the groove may include a plurality of grooves, and the plurality of grooves may include a first groove adjacent to the plurality of light-emitting elements and a second groove adjacent to the first groove.

In an embodiment, a width and a depth of the first groove may be greater than a width and a depth, respectively, of the second groove.

In an embodiment, the second groove may include a (2-1)th groove and a (2-2)th groove that are spaced apart from each other, and each of the (2-1)th groove and the (2-2)th groove may overlap the first groove in one direction on a plane.

In an embodiment, the first groove may include a (1-1)th groove and a (1-2)th groove that are spaced apart from each other, and each of the (1-1)th groove and the (1-2)th groove may overlap the(2-1)th groove in one direction on a plane.

In an embodiment, the first groove may extend around a periphery of one of the plurality of light-emitting elements, the second groove may extend around a periphery of another one of the plurality of light-emitting elements, and the first groove and the second groove may have a closed loop shape.

According to an embodiment of the present disclosure, the display device includes: a substrate including pixel electrodes; a passivation layer on the substrate and having a groove between the pixel electrodes; a contact electrode on the pixel electrode; and a light emitting element layer including: a plurality of light-emitting elements bonded onto the contact electrode and having a plurality of semiconductor layers thereon; and a partition wall between the plurality of light-emitting elements. The groove overlaps the partition wall.

In an embodiment, the partition wall may protrude toward the groove, and a width of the partition wall may be smaller than that of the light-emitting element.

In an embodiment, the partition wall may be in the groove.

In an embodiment, a width of the partition wall may be smaller than that of the at least one groove.

In an embodiment, each of the plurality of light-emitting elements and the partition wall may include a first semiconductor layer, an active layer on the first semiconductor layer, a second semiconductor layer on the active layer, and a third semiconductor layer on the second semiconductor layer.

In an embodiment, the second semiconductor layer and the third semiconductor layer may be common layers that are continuously in the plurality of light-emitting elements and in the partition wall.

In an embodiment, the display device may further include a first insulating layer extending around a periphery of the first semiconductor layer, the active layer, the second semiconductor layer, and the third semiconductor layer. The first insulating layer may expose a portion of the first semiconductor layer of the plurality of light-emitting elements and may cover the first semiconductor layer of the partition wall.

According to an embodiment of the present disclosure, the display device includes: a substrate having a first light emission area, a second light emission area, a third light emission area, and a fourth light emission area; pixel electrodes on the substrate and overlapping each of the first light emission area, the second light emission area, the third light emission area, and the fourth light emission area; a passivation layer on the substrate and having a groove between the pixel electrodes; and a plurality of light-emitting elements respectively bonded to the pixel electrodes and having a plurality of semiconductor layers thereon. The groove extends around a periphery of the first light emission area, the second light emission area, the third light emission area, and the fourth light emission area and does not overlap the first light emission area, the second light emission area, the third light emission area, and the fourth light emission area.

In the display device according to embodiments of the present disclosure, one or more grooves may be between respective light emission areas, such that a metal material of an electrode may not overflow to adjacent light-emitting elements during bonding between the light-emitting element and a semiconductor circuit board. Therefore, a defect caused by a short between adjacent light-emitting elements may be prevented.

Also, in the display device according to one embodiment of the present disclosure, a plurality of partition walls in a plurality of grooves may be disposed between the respective light emission areas, such that the metal material may be further prevented from overflowing to adjacent light-emitting elements.

In addition, the display device according to one embodiment of the present disclosure may have grooves and partition walls of various shapes between the respective light emission areas, thereby preventing the metal material from overflowing to adjacent light-emitting elements.

The aspects and features according to embodiments of the present disclosure are not limited to those mentioned above, and more various aspects and feature are included in the following description of the present disclosure.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
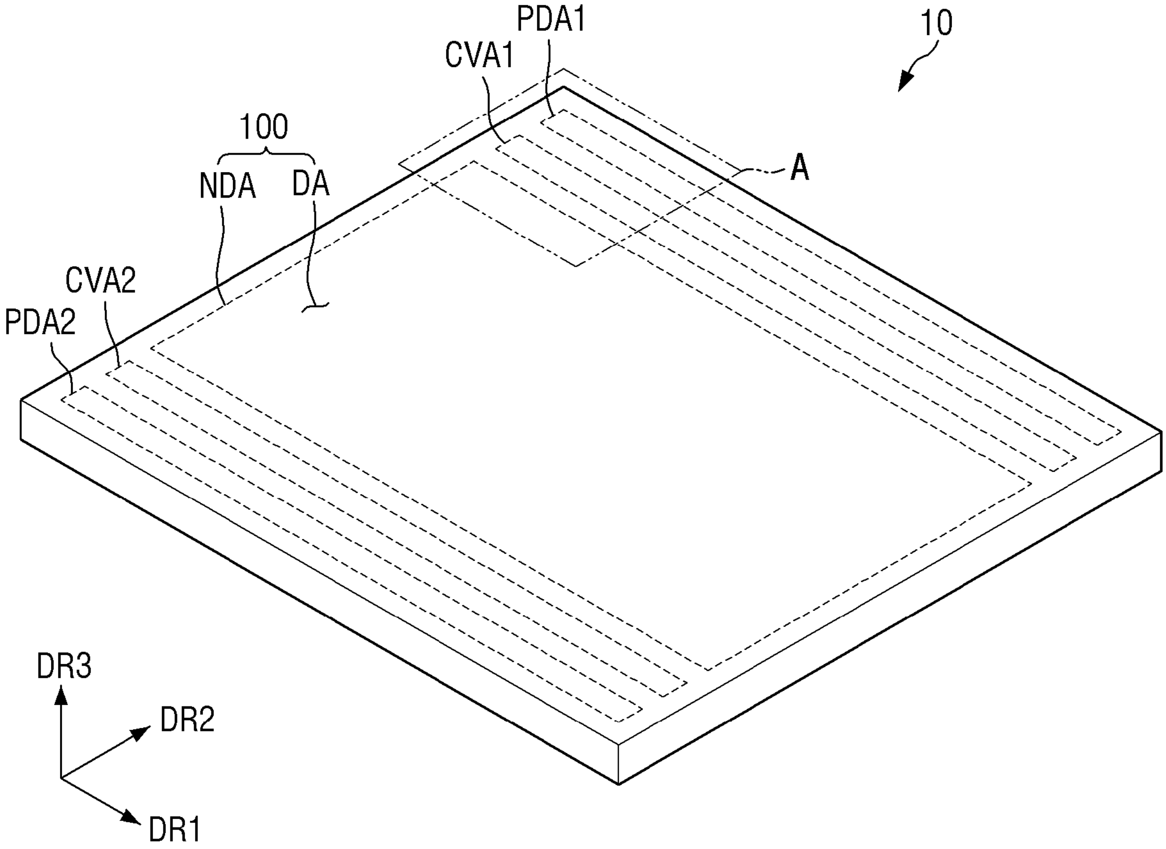
FIG. 1 is a layout view illustrating a display device according to one embodiment of the present disclosure.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on,"

"directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

In the figures, dimensions of the various elements, layers, etc. may be exaggerated for clarity of illustration. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Each of the features of the various embodiments of the present disclosure may be combined or combined with each other, in part or in whole, and technically various interlocking and driving are possible. Each embodiment may be implemented independently of each other or may be implemented together in an association.

Hereinafter, detailed embodiments of the present disclosure will be described with reference to the accompanying drawings.

Figure 2:
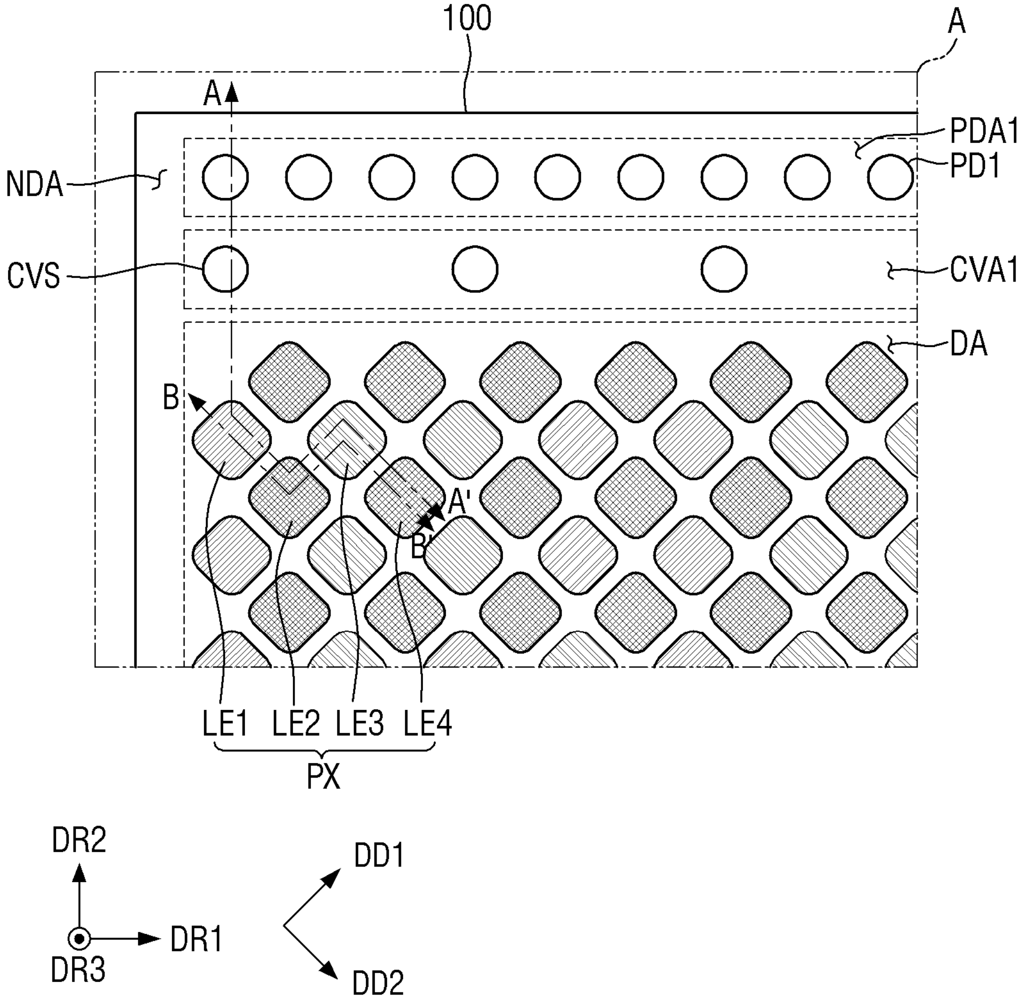
FIG. 2 is a detailed layout view illustrating the area A of FIG. 1.
Figure 3:
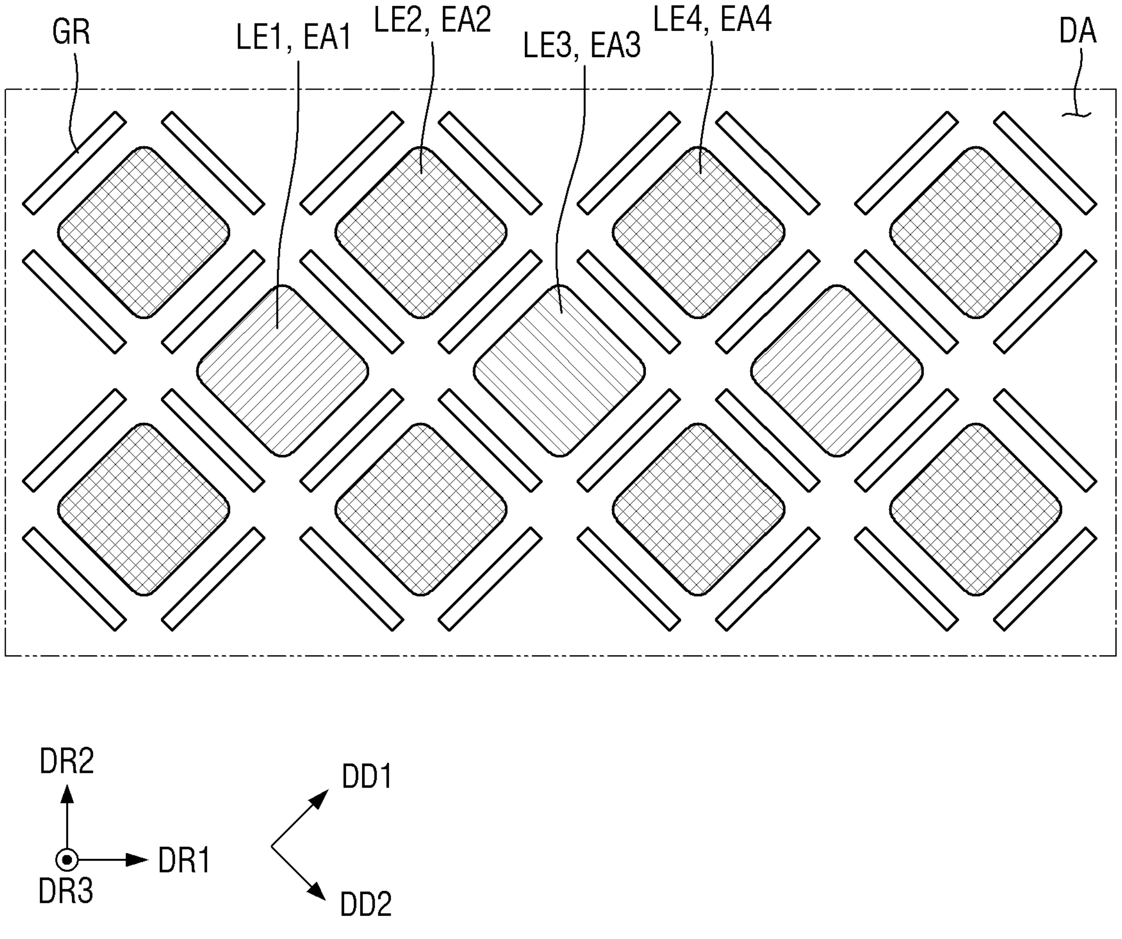
FIG. 3 is a layout view illustrating pixels of a display panel according to one embodiment of the present disclosure.

FIG. 1 is a layout view illustrating a display device according to one embodiment of the present disclosure. FIG. 2 is a detailed layout view illustrating the area A of FIG. 1. FIG. 3 is a layout view illustrating pixels of a display panel according to one embodiment of the present disclosure.

Although the display device illustrated in FIGS. 1 to 3 is a micro light-emitting diode display device (e.g., nano light-emitting diode display device) including a micro light-emitting diode (or nano light-emitting diode) as a light-emitting element, the present disclosure is not limited thereto.

Also, although the display device illustrated in FIGS. 1 to 3 is a light-emitting diode on silicon (LEDoS) display device having light-emitting diodes disposed on a semiconductor circuit board 110 formed by a semiconductor process using a silicon wafer as light-emitting elements, the present disclosure is not limited thereto.

In addition, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. As used herein, "left," "right," "up," and "down" indicate directions when the display panel 100 is viewed on the plane. For example, "right" indicates one side of the first direction DR1, "left" indicates the other side of the first direction DR1, "upper" indicates one side of the second direction DR2, and "lower" indicates the other side of the second direction DR2. In addition, "upper" or "top" indicates one side of the third direction DR3, and "lower" or "bottom" indicates the other side of the third direction DR3.

Referring to FIGS. 1 to 3, the display device 10 according to one embodiment includes a display panel 100 having a display area DA and a non-display area NDA.

The display panel 100 may have a rectangular plane shape having a long side of the first direction DR1 and a short side of the second direction DR2, but the plane shape of the display panel 100 is not limited thereto. The display panel 100 may have another polygonal shape in addition to the rectangular shape, such as a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In the example shown in FIG. 1, the plane shape of the display area DA is a rectangular shape. The display area DA may be disposed in a central area of the display panel 100. The non-display area NDA may be disposed in the vicinity of the display area DA. The non-display area NDA may be disposed to surround (e.g., to extend around a periphery of) the display area DA.

The display area DA of the display panel 100 may include a plurality of pixels PX. The pixels PX may be defined as a minimum (or smallest) light emission unit capable of displaying white light.

Each of the plurality of pixels PX may include first to fourth light-emitting elements LE1, LE2, LE3, and LE4 that emit light. In the illustrated embodiment of the present disclosure, each of the plurality of pixels PX includes four light-emitting elements LE1, LE2, LE3, and LE4, but embodiments of the present disclosure are not limited thereto. Also, in the illustrated embodiment of the present disclosure, each of the first to fourth light-emitting elements LE1, LE2, LE3, and LE4 has a rhombus plane shape, but embodiments of the present disclosure are not limited thereto.

The first light-emitting element LE1 may emit first light. The first light may be light of a blue wavelength band. For example, a main peak wavelength (B-peak) of the first light may range from about 370 nm to about 460 nm, but embodiments of the present disclosure are not limited thereto.

The second light-emitting element LE2 may emit second light. The second light may be light of a green wavelength band. For example, a main peak wavelength (G-peak) of the second light may range from about 480 nm to about 560 nm, but embodiments of the present disclosure are not limited thereto.

The third light-emitting element LE3 may emit third light. The third light may be light of a red wavelength band. For example, a main peak wavelength (R-peak) of the third light may range from about 600 nm to about 750 nm, but embodiments of the present disclosure are not limited thereto.

The fourth light-emitting element LE4 may emit the second light in the same manner as the second light-emitting element LE2. The second light may be light of a green wavelength band. For example, the main peak wavelength (G-peak) of the second light may range from about 480 nm to about 560 nm, but embodiments of the present disclosure are not limited thereto.

In the display area DA, the first light-emitting elements LE1 and the third light-emitting elements LE3 may be alternately disposed in the first direction DR1. The second light-emitting elements LE2 and the fourth light-emitting elements LE4 may be alternately disposed in the first direction DR1. The first light-emitting elements LE1, the second light-emitting elements LE2, the third light-emitting elements LE3, and the fourth light-emitting elements LE4 may be alternately disposed in a first diagonal direction DD1 and a second diagonal direction DD2. The first diagonal direction DD1 may be a diagonal direction of (or between) the first direction DR1 and the second direction DR2, and the second diagonal direction DD2 may be a direction orthogonal to the first diagonal direction DD1.

In each of the plurality of pixels PX, the first light-emitting element LE1 and the third light-emitting element LE3 may be disposed in (or adjacent in) the first direction DR1, and the second light-emitting element LE2 and the fourth light-emitting element LE4 may be disposed in (or adjacent in) the first direction DR1. In each of the plurality of pixels PX, the first light-emitting element LE1 and the second light-emitting element LE2 may be disposed in (or adjacent in) the second diagonal direction DD2, the second light-emitting element LE2 and the third light-emitting element LE3 may be disposed in (or adjacent in) the first diagonal direction DD1, and the third light-emitting element LE3 and the fourth light-emitting element LE4 may be disposed in (or adjacent in) the second diagonal direction DD2.

A size of a first light emission area EA1 of the first light-emitting element LE1, a size of a second light emission area EA2 of the second light-emitting element LE2, a size of a third light emission area EA3 of the third light-emitting element LE3, and a size of a fourth light emission area EA4 of the fourth light-emitting element LE4 may be substantially the same as one another, but embodiments of the present disclosure are not limited thereto. For example, the size of the first light emission area EA1, the size of the second light emission area EA2, and the size of the third light emission area EA3 may be different from one another, and the size of the second light emission area EA2 may be the same as that of the fourth light emission area EA4.

Also, a distance between the first light emission area EA1 and the second light emission area EA2, which are adjacent to each other, a distance between the second light emission area EA2 and the third light emission area EA3, which are adjacent to each other, a distance between the first light emission area EA1 and the fourth light emission area EA4, which are adjacent to each other, and a distance between the third light emission area EA3 and the fourth light emission area EA4, which are adjacent to each other, may be substantially the same as one another, but embodiments of the present disclosure are not limited thereto. For example, the distance between the first light emission area EA1 and the second light emission area EA2, which are adjacent to each other, may be different from the distance between the second light emission area EA2 and the third light emission area EA3, which are adjacent to each other, and the distance between the first light emission area EA1 and the fourth light emission area EA4, which are adjacent to each other, may be different from the distance between the third light emission area EA3 and the fourth light emission area EA4, which are adjacent to each other. In such an embodiment, the distance between the first light emission area EA1 and the second light emission area EA2, which are adjacent to each other, may be substantially the same as the distance between the first light emission area EA1 and the fourth light emission area EA4, which are adjacent to each other, and the distance between the second light emission area EA2 and the third light emission area EA3, which are adjacent to each other, may be substantially the same as the distance between the third light emission area EA3 and the fourth light emission area EA4, which are adjacent to each other.

In addition, the first light emission area EA1 may emit the first light, the second light emission area EA2 and the fourth light emission area EA4 may emit the second light, and the third light emission area EA3 may emit the third light, but embodiments of the present disclosure are not limited thereto. For example, the first light emission area EA1 may emit the first light, the second light emission area EA2 and the fourth light emission area EA4 may emit the third light, and the third light emission area EA3 may emit the second light. In other embodiments, the first light emission area EA1 may emit the second light, the second light emission area EA2 and the fourth light emission area EA4 may emit the first light, and the third light emission area EA3 may emit the third light.

Also, the first light emission area EA1, the second light emission area EA2, the third light emission area EA3, and the fourth light emission area EA4 may have a circular plane shape, but embodiments of the present disclosure are not limited thereto. For example, the first light emission area EA1, the second light emission area EA2, the third light emission area EA3, and the fourth light emission area EA4 may have a polygonal shape, such as a triangular shape, a rectangular shape, a pentagonal shape, a hexagonal shape, and an octagonal shape, an oval shape, or an irregular shape.

A groove GR may be disposed among the first light emission area EA1, the second light emission area EA2, the third light emission area EA3, and the fourth light emission area EA4. The groove GR may be disposed between the first light emission area EA1 and the second light emission area EA2, between the second light emission area EA2 and the third light emission area EA3, between the third light emission area EA3 and the fourth light emission area EA4, and between the fourth light emission area EA4 and the first light emission area EA1. A detailed description of the groove GR will be provided later.

The non-display area NDA may include a first common voltage supply area CVA1, a second common voltage supply area CVA2, a first pad area PDA1, and a second pad area PDA2.

The first common voltage supply area CVA1 may be disposed between the first pad area PDA1 and the display area DA. The second common voltage supply area CVA2 may be disposed between the second pad area PDA2 and the display area DA. Each of the first common voltage supply area CVA1 and the second common voltage supply area CVA2 may include a plurality of common voltage supply portions CVS connected to a common electrode CE. A common voltage may be supplied to the common electrode CE through the plurality of common voltage supply portions CVS.

The plurality of common voltage supply portions CVS in the first common voltage supply area CVA1 may be electrically connected to any one of first pads PD1 of the first pad area PDA1. For example, the plurality of common voltage supply portions CVS in the first common voltage supply area CVA1 may be supplied with a common voltage from any one of the first pads of the first pad area PDA1.

The plurality of common voltage supply portions CVS in the second common voltage supply area CVA2 may be electrically connected to any one of second pads PD2 of the second pad area PDA2. For example, the plurality of common voltage supply portions CVS in the second common voltage supply area CVA2 may be supplied with a common voltage from any one of the second pads PD2 of the second pad area PDA2.

Although FIGS. 1 and 2 illustrate an embodiment in which the common voltage supply areas CVA1 and CVA2 are disposed at both sides (e.g., opposite sides) of the display area DA, embodiments of the present disclosure are not limited thereto. For example, the common voltage supply areas CVA1 and CVA2 may be disposed to surround (e.g., to extend around the periphery of) the display area DA.

The first pad area PDA1 may be disposed above the display panel 100. The first pad area PDA1 may include the first pads PD1 connected to an external circuit board CB.

The second pad area PDA2 may be disposed below the display panel 100. The second pad area PDA2 may include second pads PD2 for connection with the external circuit board CB. In some embodiments, the second pad area PDA2 may be omitted.

Figure 4:
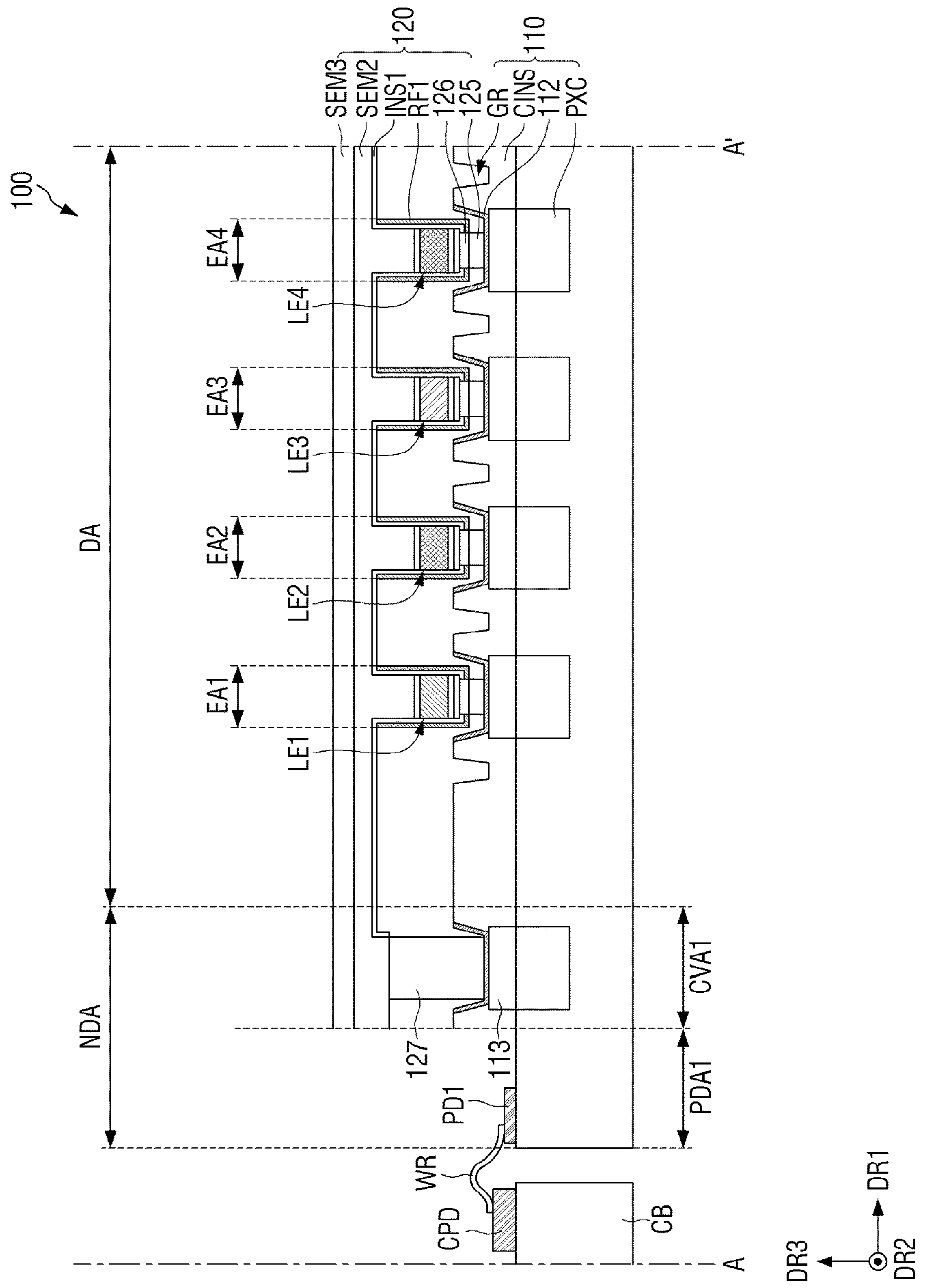
FIG. 4 is a cross-sectional view illustrating an example of a display panel taken along the line A-A' of FIG. 2.
Figure 5:
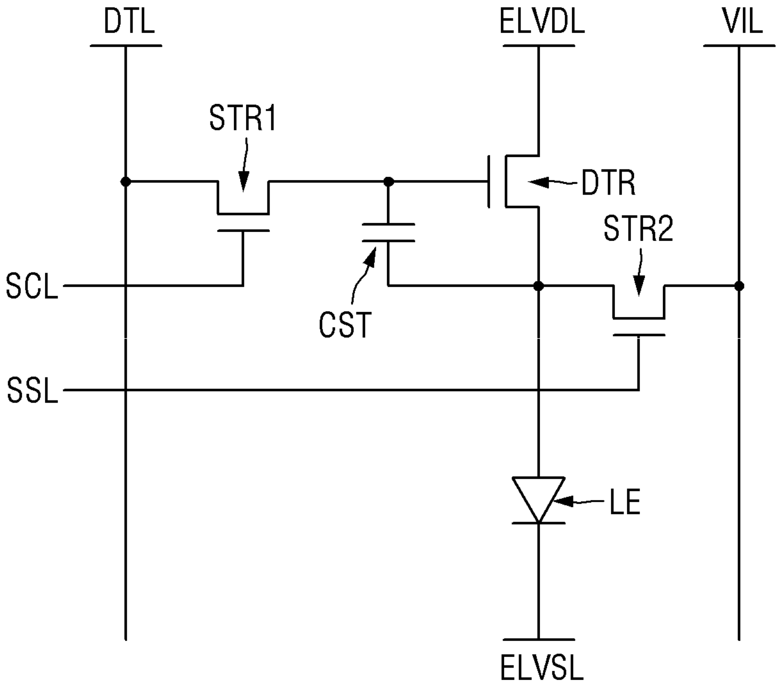
FIG. 5 is an equivalent circuit view illustrating one pixel of a display device according to one embodiment of the present disclosure.
Figure 6:
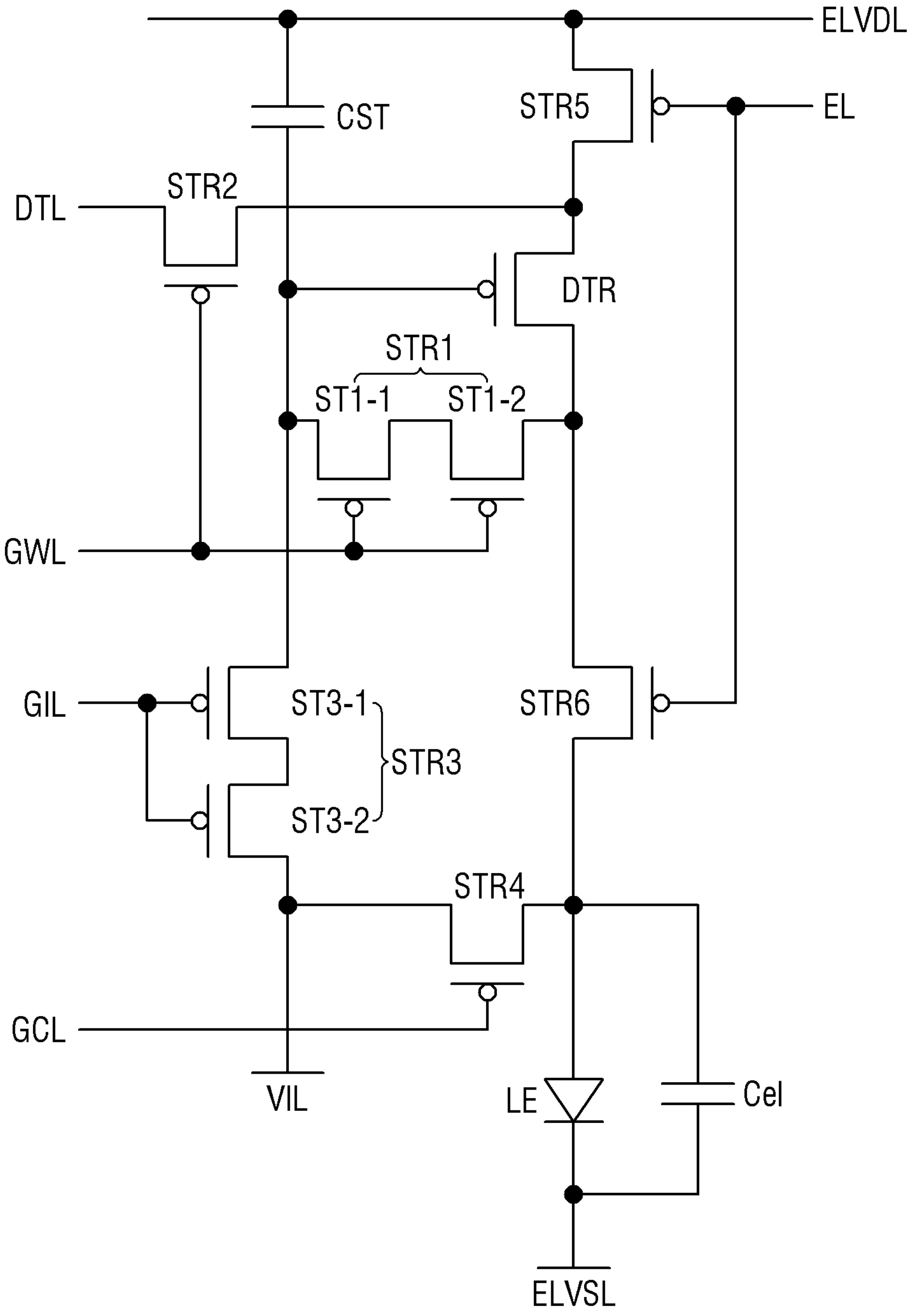
FIG. 6 is an equivalent circuit view illustrating one pixel of a display device according to another embodiment of the present disclosure.
Figure 7:
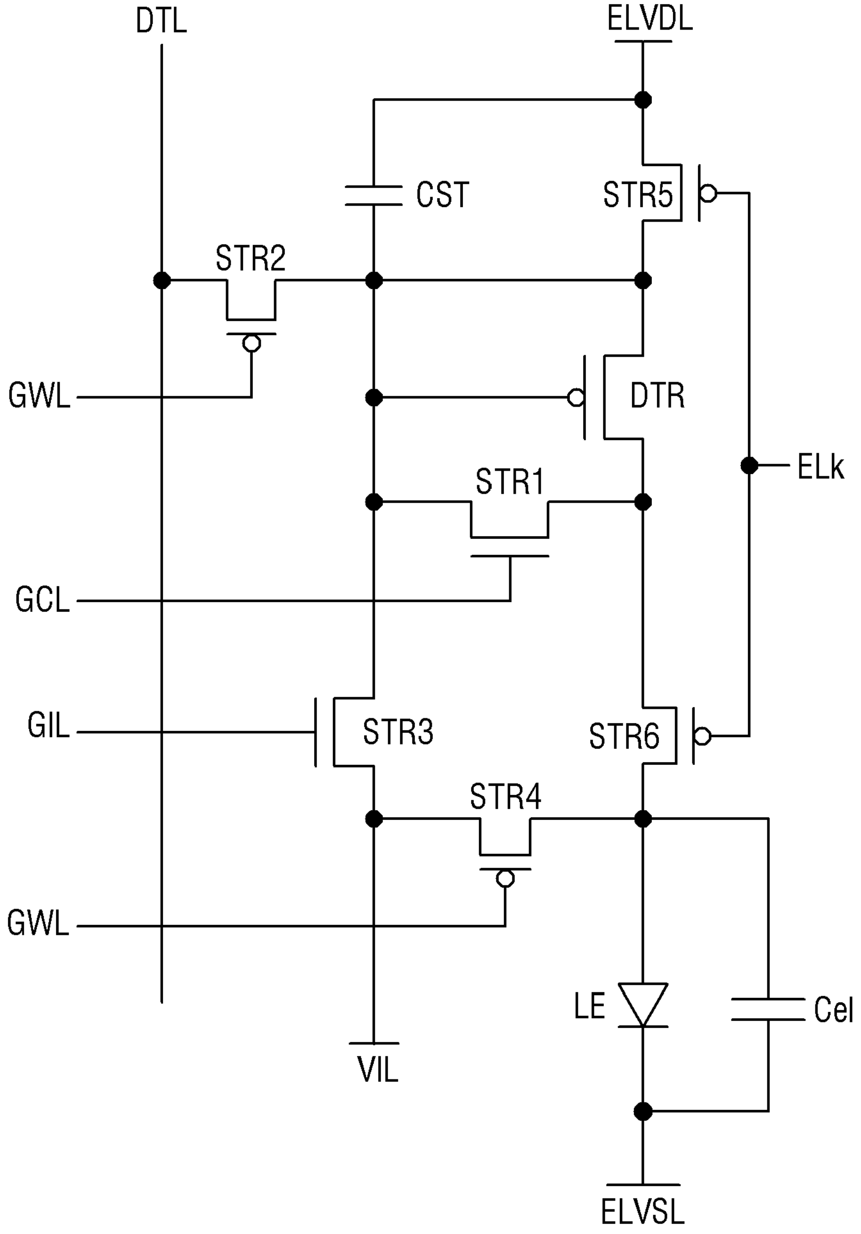
FIG. 7 is an equivalent circuit view illustrating one pixel of a display device according to other embodiment of the present disclosure.
Figure 8:
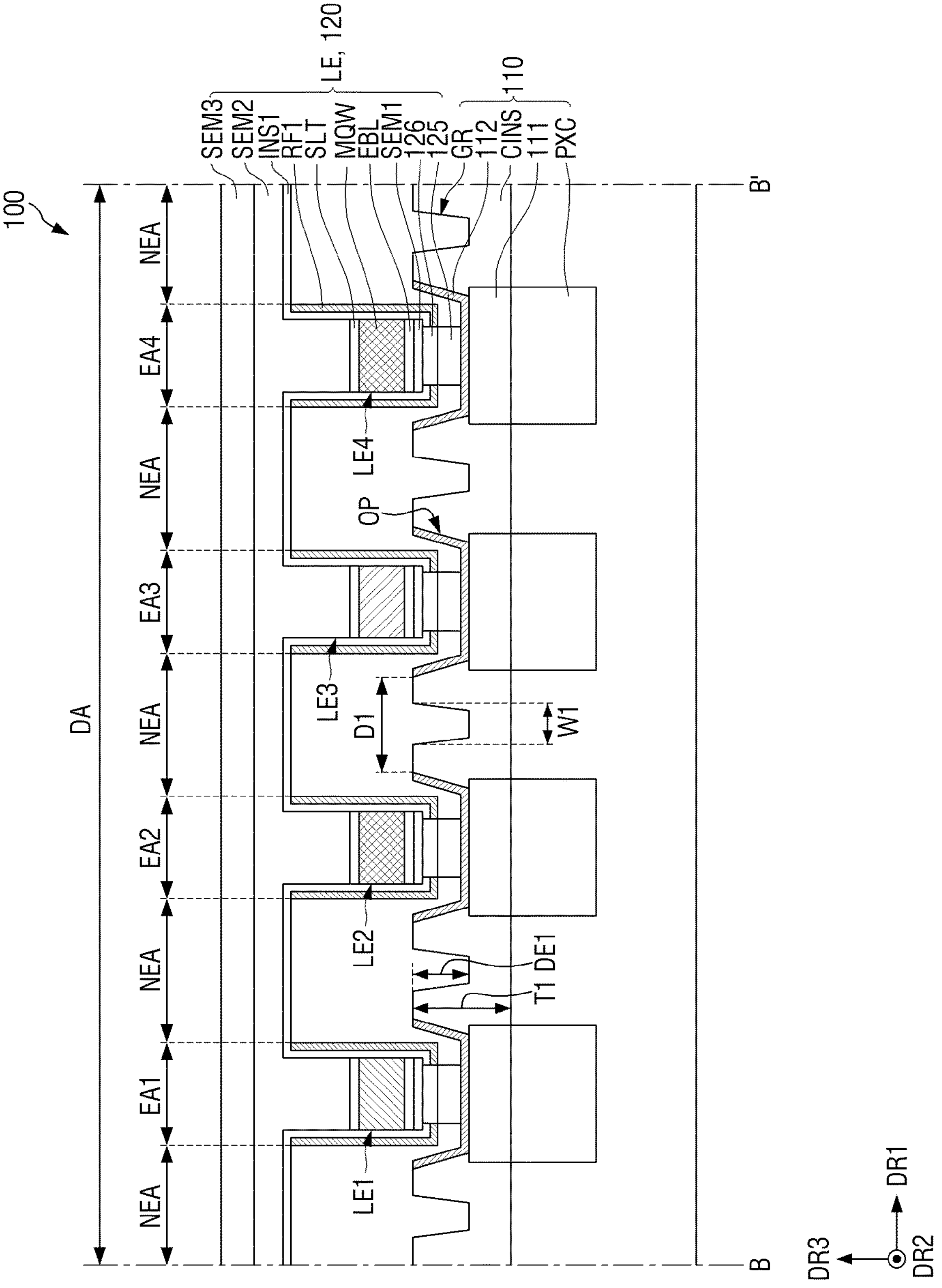
FIG. 8 is a cross-sectional view illustrating an example of a display panel taken along the line B-B' of FIG. 2.
Figure 9:
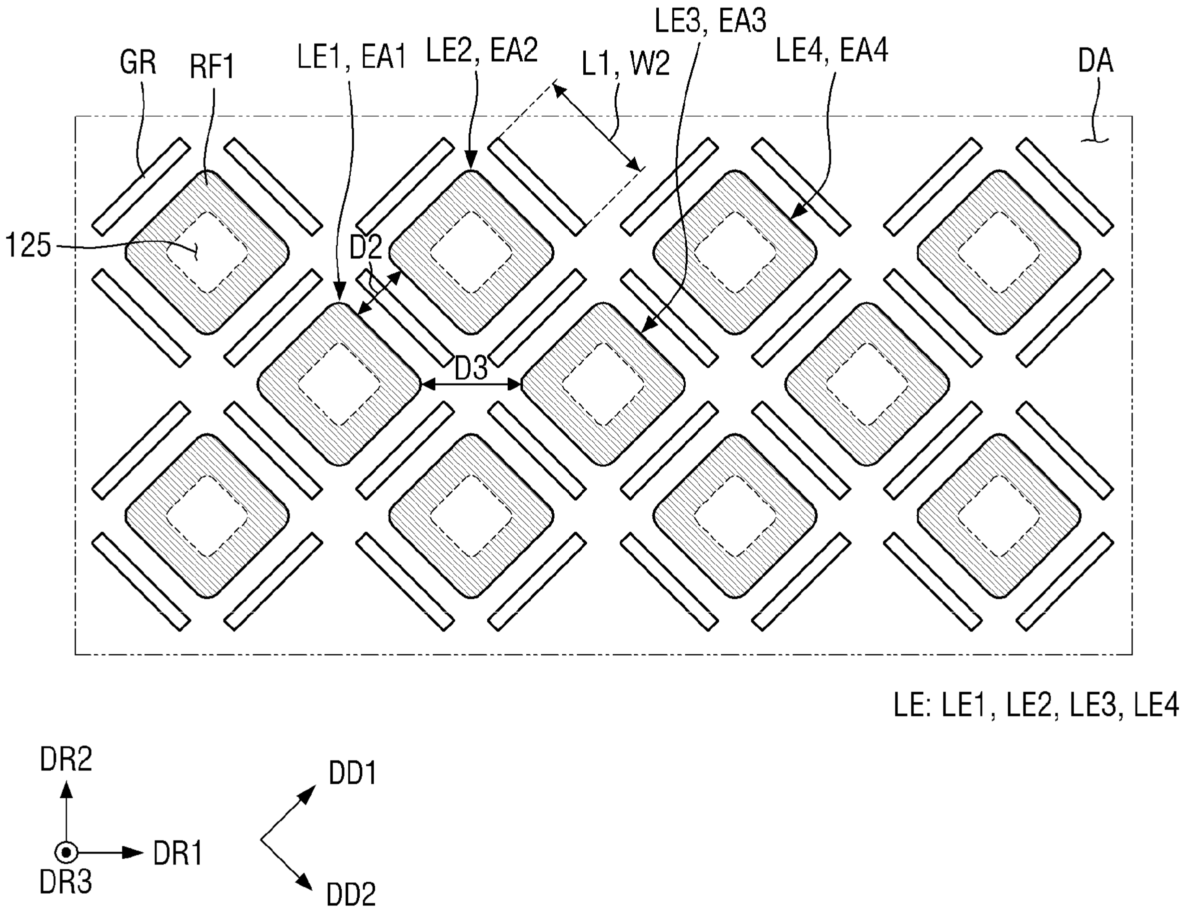
FIG. 9 is a plan view illustrating an example of a light-emitting element layer of a display panel according to one embodiment of the present disclosure.
Figure 10:
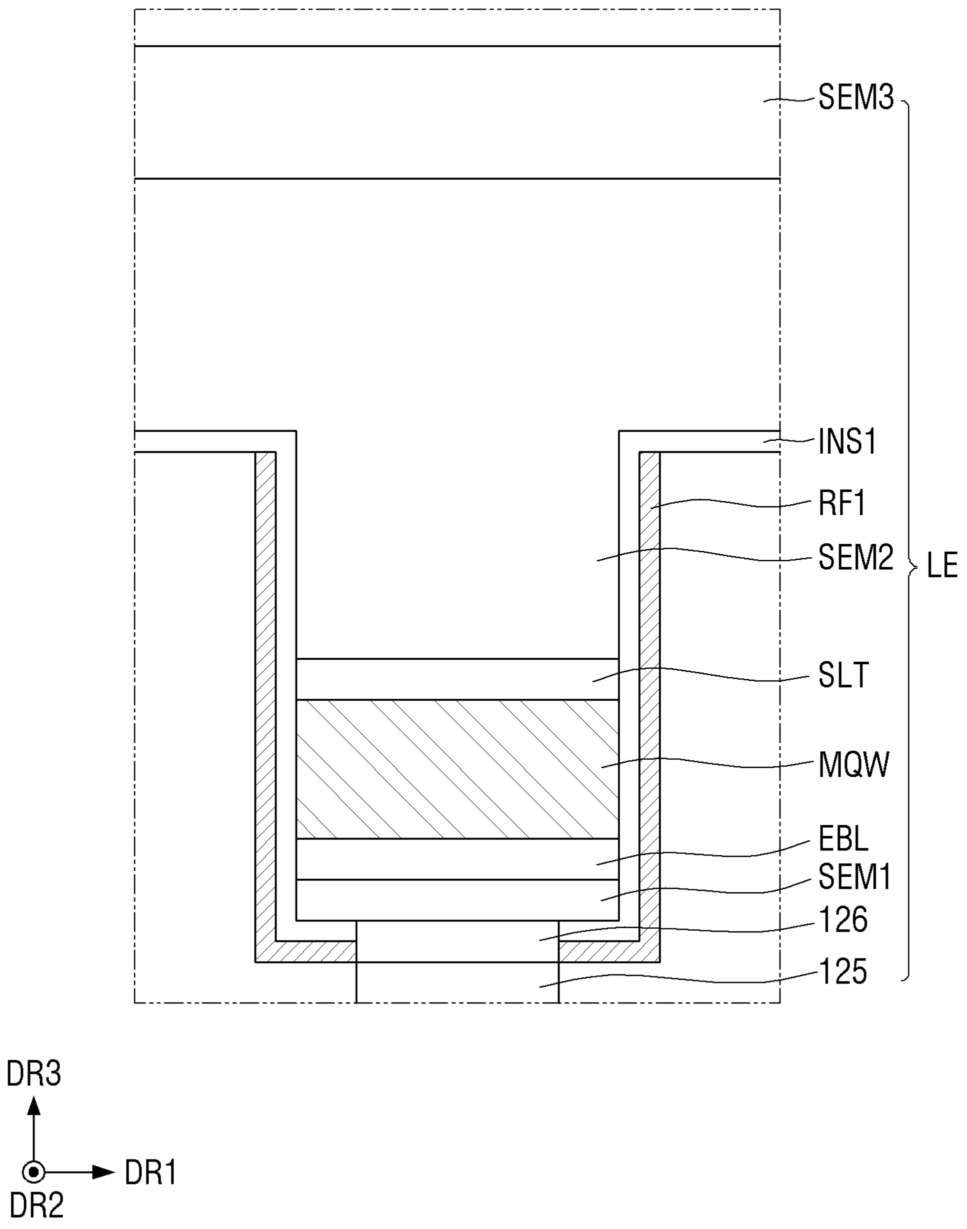
FIG. 10 is a cross-sectional view illustrating an example of a light-emitting element of a display panel according to one embodiment of the present disclosure.

FIG. 4 is a cross-sectional view illustrating an example of a display panel taken along the line A-A' of FIG. 2. FIG. 5 is an equivalent circuit view illustrating one pixel of a display device according to one embodiment of the present disclosure. FIG. 6 is an equivalent circuit view illustrating one pixel of a display device according to another embodiment of the present disclosure. FIG. 7 is an equivalent circuit view illustrating one pixel of a display device according to other embodiment of the present disclosure. FIG. 8 is a cross-sectional view illustrating an example of a display panel taken along the line B-B' of FIG. 2. FIG. 9 is a plan view illustrating an example of a light-emitting element layer of a display panel according to one embodiment of the present disclosure. FIG. 10 is a cross-sectional view illustrating an example of a light-emitting element of a display panel according to one embodiment of the present disclosure.

Referring to FIGS. 4 to 10, the display panel 100 according to one embodiment may include a semiconductor circuit board 110 and a light-emitting element layer 120.

The semiconductor circuit board 110 may include a plurality of pixel circuits PXC, pixel electrodes 111, contact electrodes 112, first pads PD1, a common contact electrode 113, and a passivation layer CINS.

The semiconductor circuit board 110 is, in one embodiment, a silicon wafer substrate formed using a semiconductor process and may be termed a "first substrate." The plurality of pixel circuits PXC of the semiconductor circuit board 110 may be formed using a semiconductor process.

The plurality of pixel circuits PXC may be disposed in the display area DA and the non-display area NDA. Each of the plurality of pixel circuits PXC may be connected to a corresponding pixel electrode 111. For example, the plurality of pixel circuits PXC and the plurality of pixel electrodes 111 may be connected to each other in a one-to-one correspondence. Each of the plurality of pixel circuits PXC may overlap the light-emitting element LE in the third direction DR3.

Each of the plurality of pixel circuits PXC may include at least one transistor formed by a semiconductor process. Each of the plurality of pixel circuits PXC may further include at least one capacitor formed by a semiconductor process. The plurality of pixel circuits PXC may include, for example, a CMOS circuit. Each of the pixel circuits PXC may apply a pixel voltage or an anode voltage to the pixel electrode 111.

Referring to FIG. 5, the plurality of pixel circuits PXC according to one embodiment may include three transistors DTR, STR1, and STR2 and one storage capacitor CST.

The light-emitting element LE emits light in accordance with a current supplied through a driving transistor DTR. The light-emitting element LE may be an inorganic light-emitting diode, an organic light-emitting diode, a micro light-emitting diode, a nano light-emitting diode, etc.

A first electrode (e.g., anode electrode) of the light-emitting element LE may be connected to a source electrode of the driving transistor DTR, and its second electrode (e.g., cathode electrode) may be connected to a second power line ELVSL supplied with a low potential voltage (e.g., a second power voltage) lower than a high potential voltage (e.g., a first power voltage) of a first power line ELVDL.

The driving transistor DTR adjusts the current flowing from the first power line ELVDL supplied with the first power voltage to the light-emitting element LE in accordance with a voltage difference between a gate electrode and a source electrode. The gate electrode of the driving transistor DTR may be connected to a first electrode of a first transistor STR1, its source electrode may be connected to the first electrode of the light-emitting element LE1, and its drain electrode may be connected to the first power line ELVDL, to which the first power voltage is applied.

The first transistor STR1 is turned on by a scan signal of a scan line SCL to connect a data line DTL to the gate electrode of the driving transistor DTR. A gate electrode of the first transistor STR1 may be connected to the scan line SCL, its first electrode may be connected to the gate electrode of the driving transistor DTR, and its second electrode may be connected to the data line DTL.

The second transistor STR2 is turned on by a sensing signal of a sensing signal line SSL to connect an initialization voltage line VIL to the source electrode of the driving transistor DTR. A gate electrode of the second transistor STR2 may be connected to the sensing signal line SSL, its first electrode may be connected to the initialization voltage line VIL, and its second electrode may be connected to the source electrode of the driving transistor DTR.

In one embodiment, the first electrode of each of the first and second transistors STR1 and STR2 may be a source electrode, and the second electrode thereof may be a drain electrode but are not limited thereto and may be swapped (e.g., vice versa).

The capacitor CST is formed between the gate electrode and the source electrode of the driving transistor DTR. The storage capacitor CST stores a differential voltage of a gate voltage and a source voltage of the driving transistor DTR.

The driving transistor DTR and the first and second transistors STR1 and STR2 may be formed of thin film transistors. In FIG. 5, the driving transistor DTR and the first and second switching transistors STR1 and STR2 are N-type metal oxide semiconductor field effect transistors (MOSFETs), but they are not limited thereto. For example, the driving transistor DTR and the first and second switching transistors STR1 and STR2 may be P-type MOSFETs, or some of the transistors may be N-type MOSFET and the remainder of the transistors may be P-type MOSFET.

Referring to FIG. 6, the first electrode of the light-emitting element LE of the pixel circuit PXC according to another embodiment may be connected to a first electrode of a fourth transistor STR4 and a second electrode of a sixth transistor STR6, and its second electrode may be connected to the second power line ELVSL. A parasitic capacitance Cel may be formed between the first electrode and the second electrode of the light-emitting element LE.

Each pixel PX includes a driving transistor DTR, switch elements, and a capacitor CST. In FIG. 6, the switch elements include first to sixth transistors STR1, STR2, STR3, STR4, STR5, and STR6.

The driving transistor DTR includes a gate electrode, a first electrode, and a second electrode. The driving transistor DTR controls a drain-source current Ids (hereinafter, referred to as "driving current") flowing between the first electrode and the second electrode in accordance with a data voltage applied to the gate electrode.

The capacitor CST is formed between the second electrode of the driving transistor DTR and the second power line ELVSL. One electrode of the capacitor CST may be connected to the second electrode of the driving transistor DTR, and the other electrode thereof may be connected to the second power line ELVSL.

When the first electrode of each of the first to sixth transistors STR1, STR2, STR3, STR4, STR5, and STR6 and the driving transistor DTR is a source electrode, the second electrode thereof may be a drain electrode. Alternatively, when the first electrode of each of the first to sixth transistors STR1, STR2, STR3, STR4, STR5, and STR6 and the driving transistor DTR is a drain electrode, the second electrode thereof may be a source electrode.

An active layer of each of the first to sixth transistors STR1, STR2, STR3, STR4, STR5, and STR6 and the driving transistor DTR may be formed of any one of poly silicon, amorphous silicon, and oxide semiconductor. When a semiconductor layer of each of the first to sixth transistors STR1, STR2, STR3, STR4, STR5, and STR6 and the driving transistor DTR is formed of poly silicon, a process for forming the same may be a low temperature poly silicon (LTPS) process.

In FIG. 6, the first to sixth transistors STR1, STR2, STR3, STR4, STR5, and STR6 and the driving transistor DTR are formed of P-type MOSFETs, but they are not limited thereto and may be formed of N-type MOSFETs.

Furthermore, a first power voltage of the first power line ELVDL, a second power voltage of the second power line ELVSL, and a third power voltage of a third power line VIL may be set in consideration of characteristics of the driving transistor DTR, characteristics of the light-emitting element LE, etc.

Referring to FIG. 7, the pixel circuit PXC according to another embodiment of the present disclosure is different from that according to the embodiment shown in FIG. 6 in that the driving transistor DTR, the second transistor STR2, the fourth transistor STR4, the fifth transistor STR5, and the sixth transistor STR6 are formed of P-type MOSFETs, and the first transistor STR1 and the third transistor STR3 are formed of N-type MOSFETs.

The active layer of each of the driving transistor DTR, the second transistor STR2, the fourth transistor STR4, the fifth transistor STR5, and the sixth transistor STR6, which are formed of P-type MOSFETs, may be formed of poly silicon, and the active layer of each of the first transistor STR1 and the third transistor STR3, which are formed of N-type MOSFETs, may be formed of an oxide semiconductor.

The embodiment shown in FIG. 7 is different from the embodiment shown in FIG. 4 in that a gate electrode of the second transistor STR2 and a gate electrode of the fourth transistor STR4 are connected to a write scan line GWL, and the gate electrode of the first transistor ST1 is connected to a control scan line GCL. In FIG. 7, because the first transistor STR1 and the third transistor STR3 are formed of N-type MOSFETs, a scan signal of a gate high voltage may be applied to the control scan line GCL and an initialization scan line GIL. In contrast, because the second transistor STR2, the fourth transistor STR4, the fifth transistor STR5, and the sixth transistor ST6 are formed of P-type MOSFETs, a scan signal of a gate low voltage may be applied to the write scan line GWL and a light-emitting line EL.

It should be noted that the equivalent circuit view of the pixel according to the above-described embodiment of the present disclosure is not limited to those shown in FIGS. 5 to 7. The equivalent circuit view of the pixel according to an embodiment of the present disclosure may be formed as other known circuit structures, which can be adopted by those skilled in the art, in addition to the embodiments shown in FIGS. 5 to 7.

The plurality of pixel electrodes 111 may be disposed on a corresponding pixel circuit PXC. Each of the pixel electrodes 111 may overlap the first to fourth light emission areas EA1, EA2, EA3, and EA4. Each of the pixel electrodes 111 may be an exposed electrode exposed from the pixel circuit PXC. Each of the pixel electrodes 111 may integrally be formed with the pixel circuit PXC. Each of the pixel electrodes 111 may be supplied with a pixel voltage or an anode voltage from the pixel circuit PXC. The pixel electrodes 111 may include a metal material, such as aluminum (Al).

The passivation layer CINS may be disposed on the plurality of pixel circuits PXC. The passivation layer CINS may protect the plurality of pixel circuits PXC and may planarize a step difference of the plurality of pixel circuits PXC. The passivation layer CINS may expose the pixel electrodes 111 so that the pixel electrodes 111 may be connected to the light-emitting element layer 120. The passivation layer CINS may include an inorganic insulating material, such as silicon oxide ($SiO_x$), silicon nitride ($SiN_x$), silicon oxynitride ($SiO_xN_y$), aluminum oxide ($Al_xO_y$) and aluminum nitride (AlN).

The contact electrodes 112 may be disposed on a corresponding pixel electrode 111. The contact electrodes 112 may bond the pixel electrodes 111 to the light-emitting elements LE. The contact electrodes 112 may be disposed on (or in) openings OP in the passivation layer CINS that expose the pixel electrodes 111. The contact electrodes 112 may contact an upper surface of the pixel electrodes 111 and may contact a side of the passivation layer CINS.

The contact electrodes 112 may include a metal material. For example, the contact electrodes 112 may include at least one of gold (Au), copper (Cu), tin (Sn), or silver (Ag). For example, the contact electrodes 112 may include a 9:1 alloy, an 8:2 alloy, or a 7:3 alloy of gold and tin or may include an alloy of copper, silver, and tin (e.g., SAC305).

The common contact electrode 113 may be disposed in the first common voltage supply area CVA1 of the non-display area NDA. The common contact electrode 113 may be disposed on both sides of the display area DA. The common contact electrode 113 may be connected to any one of the first pads PD1 of the first pad area PDA1 through a circuit area formed in the non-display area NDA to receive a common voltage. The common contact electrode 113 may include the same material as that of the pixel electrodes 111. For example, the common contact electrode 113 and the pixel electrodes 111 may be formed by the same process.

Each of the first pads PD1 may be connected to a pad electrode CPD of the circuit board CB through a conductive connection member, such as a corresponding wire WR. For example, the first pads PD1, the wires WR, and the pad electrodes CPD of the circuit board CB may be connected to one another in one-to-one correspondence.

The circuit board CB may be a flexible printed circuit board (FPCB), a printed circuit board (PCB), a flexible printed circuit (FPC), or a flexible film, such as a chip on film (COF).

Because the second pads of the second pad area PDA2 may be substantially the same as the first pads PD1 described above, their description will be omitted.

The light-emitting element layer 120 may include light-emitting elements LE, a first insulating layer INS1, a connection electrode 125, an ohmic contact layer 126, a common connection electrode 127, and a first reflective layer RF1.

The light-emitting element layer 120 may have first light emission areas EA1, second light emission areas EA2, third light emission areas EA3, and fourth light emission areas EA4, which correspond to the respective light-emitting elements LE. The light-emitting element LE may be disposed in each of the first light emission areas EA1, the second light emission areas EA2, the third light emission areas EA3, and the fourth light emission area EA4 in one-to-one correspondence.

The light-emitting element LE may be disposed on the contact electrode 112 in each of the first light emission areas EA1, the second light emission areas EA2, the third light emission areas EA3, and the fourth light emission areas EA4. The light-emitting element LE may be a vertical light-emitting diode element longitudinally extended in the third direction DR3. For example, a length of the light-emitting element LE in the third direction DR3 may be longer than in a horizontal direction. The length of the light-emitting element LE in the horizontal direction indicates a length in the first direction DR1 or a length in the second direction DR2. For example, the length of the light-emitting element LE in the third direction DR3 may be about 1 μm to about 5 μm.

The light-emitting element LE may be a micro light-emitting diode element. The light-emitting element LE may include a connection electrode 125, an ohmic contact layer 126, a first semiconductor layer SEM1, an electron blocking layer EBL, an active layer MQW, a superlattice layer SLT, a second semiconductor layer SEM2, and a third semiconductor layer SEM3 in the third direction DR3 as shown in, for example, FIG. 10. The connection electrode 125, the ohmic contact layer 126, the first semiconductor layer SEM1, the electron blocking layer EBL, the active layer MQW, the superlattice layer SLT, the second semiconductor layer SEM2, and the third semiconductor layer SEM3 may sequentially be deposited in the third direction DR3.

As shown in FIG. 10, the light-emitting element LE may have a rectangular shape with a width greater than a height, but it is not limited thereto. The light-emitting element LE may have a cylindrical shape, a disk shape, a rod shape, a wire shape, a tube shape, or a polygonal pillar shape, such as a cube, a rectangular parallelepiped, and a hexagonal pillar, or may have various suitable shapes, such as having an outer surface shape partially inclined and extended in one direction.

The connection electrode 125 may be disposed on the contact electrode 112. The connection electrode 125 may be bonded to the contact electrode 112 to apply a light-emitting signal to the light-emitting element LE. The light-emitting element LE may include at least one connection electrode 125. In FIG. 10, the light-emitting element LE includes one connection electrode 125, but it is not limited thereto. In other embodiments, the light-emitting element LE may include a greater number of connection electrodes 125 or may be omitted. The following description of the light-emitting element LE may equally be applied to other embodiment in which the number of connection electrodes 125 is varied or another structure is further included in the light-emitting element LE.

The connection electrode 125 may reduce resistance between the light-emitting element LE and the contact electrode 112 when the light-emitting element LE is electrically connected to the contact electrode 112 in the display panel 100 according to one embodiment. The connection electrode 125 may include a conductive metal. For example, the connection electrode 125 may include at least one of gold (Au), copper (Cu), tin (Sn), titanium (Ti), aluminum (Al), or silver (Ag). For example, the connection electrode 125 may include a 9:1 alloy, an 8:2 alloy, or a 7:3 alloy of gold and tin or may include an alloy (of copper, silver, and tin (e.g., SAC305).

The ohmic contact layer 126 may be disposed on the connection electrode 125. The ohmic contact layer 126 may be disposed between the connection electrode 125 and the first semiconductor layer SEM1. The ohmic contact layer 126 may be an ohmic connection electrode, but it is not limited thereto. The ohmic contact layer 126 may be a Schottky connection electrode. The ohmic contact layer 126 may include indium tin oxide (ITO), but it is not limited thereto and may include at least one selected from gold (Au), copper (Cu), tin (Sn), titanium (Ti), aluminum (Al), or silver (Ag) or may be formed as an alloy thereof or as multi-layered structure including some of them.

The first semiconductor layer SEM1 may be disposed on the ohmic contact layer 126. The first semiconductor layer SEM1 may be a p-type semiconductor and may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer SEM1 may be any one or more of AlGaInN, GaN, AlGaN, InGaN, AlN, and InN, which are doped with a p-type dopant. The first semiconductor layer SEM1 may be doped with a p-type dopant, and the p-type dopant may be Mg, Zn, Ca, Se, Ba, or the like. For example, the first semiconductor layer SEM1 may be a p-GaN doped with p-type Mg. A thickness of the first semiconductor layer SEM1 may range from about 30 nm to about 200 nm, but it is not limited thereto.

The electron blocking layer EBL may be disposed on the first semiconductor layer SEM1. The electron blocking layer EBL may be a layer for suppressing or preventing too many electrons from flowing to the active layer MQW. For example, the electron blocking layer EBL may be p-AlGaN doped with p-type Mg. A thickness of the electron blocking layer EBL may range from about 10 nm to about 50 nm, but it is not limited thereto. In some embodiments, the electron blocking layer EBL may be omitted.

The active layer MQW may be disposed on the electron blocking layer EBL. The active layer MQW may emit light by the combination of electron-hole pairs in accordance with an electrical signal applied through the first semiconductor layer SEM1 and the second semiconductor layer SEM2. The active layer MQW may emit first light (e.g., light of a blue wavelength band) or second light (e.g., light of a green wavelength band).

The active layer MQW may include a single or multiple quantum well structure material. When the active layer MQW includes a multiple quantum well structure material, a plurality of well layers and a plurality of barrier layers may be alternately deposited. In such an embodiment, the well layer may be formed of, but is not limited to, InGaN, and the barrier layer may be formed of, but is not limited to, GaN or AlGaN. A thickness of the well layer may be about 1 nm to about 4 nm, and a thickness of the barrier layer may be about 3 nm to about 10 nm.

In other embodiments, the active layer MQW may have a structure in which semiconductor materials having a high band gap energy and semiconductor materials having a low band gap energy are alternately deposited and may include different group III to group V semiconductor materials depending on a wavelength range of light that is to be emitted. The light emitted from the active layer MQW is not limited to the first light, and the active layer MQW may emit second light (e.g., light of a green wavelength band) or third light (e.g., light of a red wavelength band). In an embodiment, when the semiconductor material included in the active layer MQW is indium, a color of light that is emitted may be varied depending on indium content. For example, when the content of indium is about 15%, the active layer MQW may emit light of a blue wavelength band. When the content of indium is about 25%, the active layer MQW may emit light of a green wavelength band. When the content of indium is about 35% or more, the active layer MQW may emit light of a red wavelength band.

The superlattice layer SLT may be disposed on the active layer MQW. The superlattice layer SLT may be a layer for mitigating stress between the second semiconductor layer SEM2 and the active layer MQW. For example, the superlattice layer SLT may be formed of InGaN or GaN. A thickness of the superlattice layer SLT may be about 50 nm to about 200 nm. In some embodiments, the superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer SEM2 may be any one or more of AlGaInN, GaN, AlGaN, InGaN, AlN, and InN, which are doped with a n-type dopant. The second semiconductor layer SEM2 may be doped with an n-type dopant, and the n-type dopant may be Si, Ge, Sn, or the like. For example, the second semiconductor layer SEM2 may be an n-GaN doped with n-type Si. A thickness of the second semiconductor layer SEM2 may range from about 2 μm to about 4 μm but is not limited thereto.

As shown in FIGS. 4 and 8, the second semiconductor layer SEM2 may be a common layer that is commonly connected to the plurality of light-emitting elements LE. At least a portion of the second semiconductor layer SEM2 may be disposed in each of the light-emitting elements LE in the third direction DR3 to form a patterned shape, and the other portion of the second semiconductor layer SEM2 may be continuously extended in the first direction DR1 and commonly disposed in the plurality of light-emitting elements LE. The second semiconductor layer SEM2 allows the common voltage applied through the common contact electrode 113 to be commonly applied to the plurality of light-emitting elements LE.

The third semiconductor layer SEM3, which will be described later, is disposed as a common layer together with the second semiconductor layer SEM2 but does not have conductivity, whereby a signal may be applied through the second semiconductor layer SEM2 having conductivity. The second semiconductor layer SEM2 and the third semiconductor layer SEM3 may be extended from the display area DA to the non-display area NDA. A thickness of an area of the second semiconductor layer SEM2 that overlaps the first semiconductor layer SEM1 of the light-emitting element LE may be greater than a thickness of an area of the second semiconductor layer SEM2 that is offset from (e.g., that does not overlap) the first semiconductor layer SEM1.

The third semiconductor layer SEM3 may be disposed on the second semiconductor layer SEM2. The third semiconductor layer SEM3 may be an undoped semiconductor. The third semiconductor layer SEM3 may include the same material as that of the second semiconductor layer SEM2 but may not be doped with an n-type or p-type dopant. In an embodiment, the third semiconductor layer SEM3 may be at least one of undoped InAlGaN, GaN, AlGaN, InGaN, AlN or InN, but it is not limited thereto.

The third semiconductor layer SEM3 may be a common layer commonly connected to the plurality of light-emitting elements LE. The third semiconductor layer SEM3 may be continuously extended in the first direction DR1 and commonly disposed in the plurality of light-emitting elements LE. The third semiconductor layer SEM3 may be a base layer of the plurality of light-emitting elements LE. In the manufacturing process of the light-emitting element layer, which will be described later, layers constituting the light-emitting elements LE are formed on the third semiconductor layer SEM3, such that the third semiconductor layer SEM3 acts as a base layer.

The common connection electrode 127 may be disposed in the first common voltage supply area CVA1 of the non-display area NDA. The common connection electrode 127 may be disposed on one surface of the second semiconductor layer SEM2. The common connection electrode 127 may transfer a common voltage signal of the light-emitting elements LE from the common contact electrode 113. The common connection electrode 127 may be made of the same material as that of the connection electrodes 125. For connection with the common contact electrode 113, the common connection electrode 127 may be formed to be thick in the third direction DR3.

The light-emitting elements LE may receive a pixel voltage (e.g., an anode voltage) from the pixel electrode 111 through the connection electrode 125 and the contact electrode 112 and may receive a common voltage through the second semiconductor layer SEM2. The light-emitting element LE may emit light with a luminance (e.g., a predetermined luminance) in accordance with a voltage difference between the pixel voltage and the common voltage.

The first insulating layer INS1 may be disposed on a side and an upper surface of the second semiconductor layer SEM2, sides of each of the light-emitting elements LE, and a side of the ohmic contact layer 126. The first insulating layer INS1 may insulate the second semiconductor layer SEM2, the light-emitting elements LE, and the ohmic contact layer 126 from the other layers.

The first insulating layer INS1 may be disposed to surround (e.g., to extend around peripheral surfaces of) the light-emitting elements LE. The first insulating layer INS1 may include an inorganic insulating material, such as silicon oxide ($SiO_x$), silicon nitride ($SiN_x$), silicon oxynitride ($SiO_xN_y$), aluminum oxide ($Al_xO_y$) and aluminum nitride (AlN). A thickness of the first insulating layer INS1 may be about 0.1 μm, but it is not limited thereto.

The first reflective layer RF1 reflects light moving in up and down directions and left and right side directions but not in an upper direction from among the light emitted from the light-emitting element LE. The first reflective layer RF1 may be disposed in the display area DA. The first reflective layer RF1 may be disposed in the display area DA to overlap the first light emission area EA1, the second light emission area EA2, the third light emission area EA3, and the fourth light emission area EA4.

The first reflective layer RF1 may be disposed on the sides of the ohmic contact layers 126 and the sides of each of the light-emitting elements LE. The first reflective layer RF1 may be disposed directly on the first insulating layer INS1 and may be disposed on a side of the first insulating layer INS1. The first reflective layer RF1 may be disposed to be spaced apart from the connection electrode 125 and the light-emitting elements LE.

As shown in FIG. 9, the first reflective layer RF1 may be disposed in the display area DA to surround (e.g., to surround in a plan view or to extend around a periphery of) the light-emitting elements LE. Each of the light-emitting elements LE may be surrounded by the first insulating layer INS1, and the first insulating layer INS1 may be surrounded by the first reflective layer RF1. The first reflective layers RF1 may be disposed to be spaced apart from each other and may be disposed to be spaced apart from another first reflective layers RF1 of other ones of the light-emitting elements LE, which are adjacent thereto. For example, the first reflective layers RF1 may be disposed to be spaced apart from each other in the first direction DR1 and the second direction DR2. The first reflective layer RF1 and the first insulating layer INS1 are shown as having a plane shape of a rectangular closed loop, but they are not limited thereto and may have various shapes depending on the plane shape of the light-emitting element LE.

The first reflective layer RF1 may include a metal material having high reflectance, such as aluminum (Al). A thickness of the first reflective layer RF1 may be about 0.1 μm, but it is not limited thereto.

The light-emitting elements LE may be bonded to the semiconductor circuit board 110 to form the display panel 100. In the manufacturing process, to be described later, the light-emitting elements LE and the semiconductor circuit board 110 may be bonded to each other by being pressurized by applying heat through a laser to the connection electrode 125 of the light-emitting elements LE and the contact electrode 112 of the semiconductor circuit board 110. If the pressurized pressure is too great or the irradiation time of the laser is lengthened, metal materials of the connection electrode 125 of the light-emitting elements LE and the contact electrode 112 of the semiconductor circuit board 110 may be melted and overflow to the light-emitting elements LE adjacent thereto. When the metal materials are solidified, a defect, such as a short occurring between the light-emitting elements LE adjacent to each other, may occur.

In the illustrated embodiment, a plurality of grooves GR may be disposed in (e.g., formed in) the passivation layer CINS of the semiconductor circuit board 110 to prevent a short between the light-emitting elements LE from occurring.

Referring to FIGS. 8 and 9, the plurality of grooves GR may be disposed in the passivation layer CINS. The plurality of grooves GR may be formed in a shape that is recessed from an upper surface of the passivation layer CINS to (or toward) a lower surface of the display panel 100.

The plurality of grooves GR may be disposed between the respective light emission areas EA1, EA2, EA3, and EA4. For example, the plurality of grooves GR may be disposed between the first light emission area EA1 and the second light emission area EA2, between the second light emission area EA2 and the third light emission area EA3, between the third light emission area EA1 and the fourth light emission area EA4, between the first light emission area EA1 and the second and fourth light emission areas EA2 and EA4, which are disposed near the first light emission area EA1, and between the third light emission area EA3 and the second and fourth light emission areas EA2 and EA4, which are disposed near the third light emission area EA3. The plurality of grooves GR may be disposed so as not to overlap (e.g., may be offset from) the first light emission area EA1, the second light emission area EA2, the third light emission area EA3, and the fourth light emission area EA4. The plurality of grooves GR may be disposed to overlap (e.g., may be formed in) a non-light emission area NEA, that is, the other area except the first light emission area EA1, the second light emission area EA2, the third light emission area EA3, and the fourth light emission area EA4 in the display area DA.

The plurality of grooves GR may overlap the second semiconductor layer SEM2 and the third semiconductor layer SEM3 of each light-emitting element LE. The second semiconductor layer SEM2 and the third semiconductor layer SEM3 of each light-emitting element LE may be disposed on a front surface facing the semiconductor circuit substrate 110 as common layers, thereby overlapping the plurality of grooves GR. The plurality of grooves GR may not overlap the connection electrode 125, the ohmic contact layer 126, the first semiconductor layer SEM1, the electron blocking layer EBL, the active layer MQW, and the superlattice layer SLT of each light-emitting element LE.

The plurality of grooves GR may have a width (e.g., a predetermined width) against (or to prevent) overflowing of the metal material. A width W1 of the plurality of grooves GR may be smaller than a distance D1 between the contact electrodes 112 (e.g., between adjacent ends of the contact electrodes 112) of the semiconductor circuit board 110. In addition, the width W1 of the plurality of grooves GR may be smaller than a distance D1 between the openings OP in which the contact electrodes 112 of the semiconductor circuit board 110 are disposed. In this case, the distance D1 between the contact electrodes 112 and the distance D1 between the openings OP may be the same as each other, but they are not limited thereto. Because the width W1 of the plurality of grooves GR is smaller than the distance D1 between the contact electrodes 112 or the distance D1 between the openings OP, the contact electrodes 112 or the openings OP may not be reduced in size due to the plurality of grooves GR to facilitate bonding with the light-emitting element LE.

As shown in FIG. 9, the plurality of grooves GR may have a length (e.g., a predetermined length) against (or to prevent) overflowing of the metal material. A length L1 of the plurality of grooves GR may be the same as a width W2 of each of the light emission areas EA1, EA2, EA3, and EA4 or a width W2 of each of the light-emitting elements LE1, LE2, LE3, and LE4, but it is not limited thereto. The length L1 of the plurality of grooves GR may be greater than or smaller than the width W2 of each of the light emission areas EA1, EA2, EA3, and EA4 or the width W2 of each of the light-emitting elements LE1, LE2, LE3, and LE4. In addition, the plurality of grooves GR may be disposed to be spaced apart from each other.

Also, the plurality of grooves GR may have a depth (e.g., a predetermined depth) DE1 against (or to prevent) overflowing of the metal material. The depth DE1 of the plurality of grooves GR may be smaller than or equal to a thickness T1 of the passivation layer CINS. As the depth DE1 of the plurality of grooves GR increases (or becomes deeper), the metal material may be filled in the groove GR and prevented from overflowing to the light-emitting element LE adjacent thereto. The depth DE1 of the plurality of grooves GR may be the same as the thickness T1 of the passivation layer CINS to provide a maximum depth DE1.

The depth DE1 of the groove GR (see, e.g., FIG. 8) forms a valley of a depth (e.g., a predetermined depth) but is not limited thereto. For example, the groove GR may be formed as an opening (or a hole) passing through the passivation layer CINS. For example, the groove GR may be formed as a hole that completely passes through the upper surface and the lower surface of the passivation layer CINS, thereby providing maximum depth.

As shown in FIG. 9, a distance D2 between the first light-emitting element LE1 and the second light-emitting element LE2 disposed in the first diagonal direction DD1 of the first light-emitting element LE1 may be shorter than a distance D3 between the first light-emitting element LE1 and the third light-emitting element LE3 spaced apart from the first light-emitting element LE1 in the first direction DR1. Therefore, the plurality of grooves GR may be disposed in an area where respective sides of the light emission areas EA1, EA2, EA3, and EA4 face each other, or an area where respective sides of the light-emitting elements LE1, LE2, LE3, and LE4 face each other. The plurality of grooves GR may not be disposed in an area where respective vertices of the light emission areas EA1, EA2, EA3, and EA4 face each other, or an area where respective vertices of the light-emitting elements LE1, LE2, LE3, and LE4 face each other. However, the present disclosure is not limited thereto.

As described above, in the display panel 100 according to the illustrated embodiment, the plurality of grooves GR are disposed between the respective light emission areas EA1, EA2, EA3, and EA4 to prevent the metal material from overflowing to the light-emitting elements LE adjacent thereto when the connection electrode 125 of the light-emitting element LE and the contact electrode 112 of the semiconductor circuit board 110 are bonded to each other. Therefore, a defect caused by short of each light-emitting element LE may be avoided.

Hereinafter, the display panel 100 according to other embodiments of the present disclosure will be described with reference to other drawings.

Figure 11:
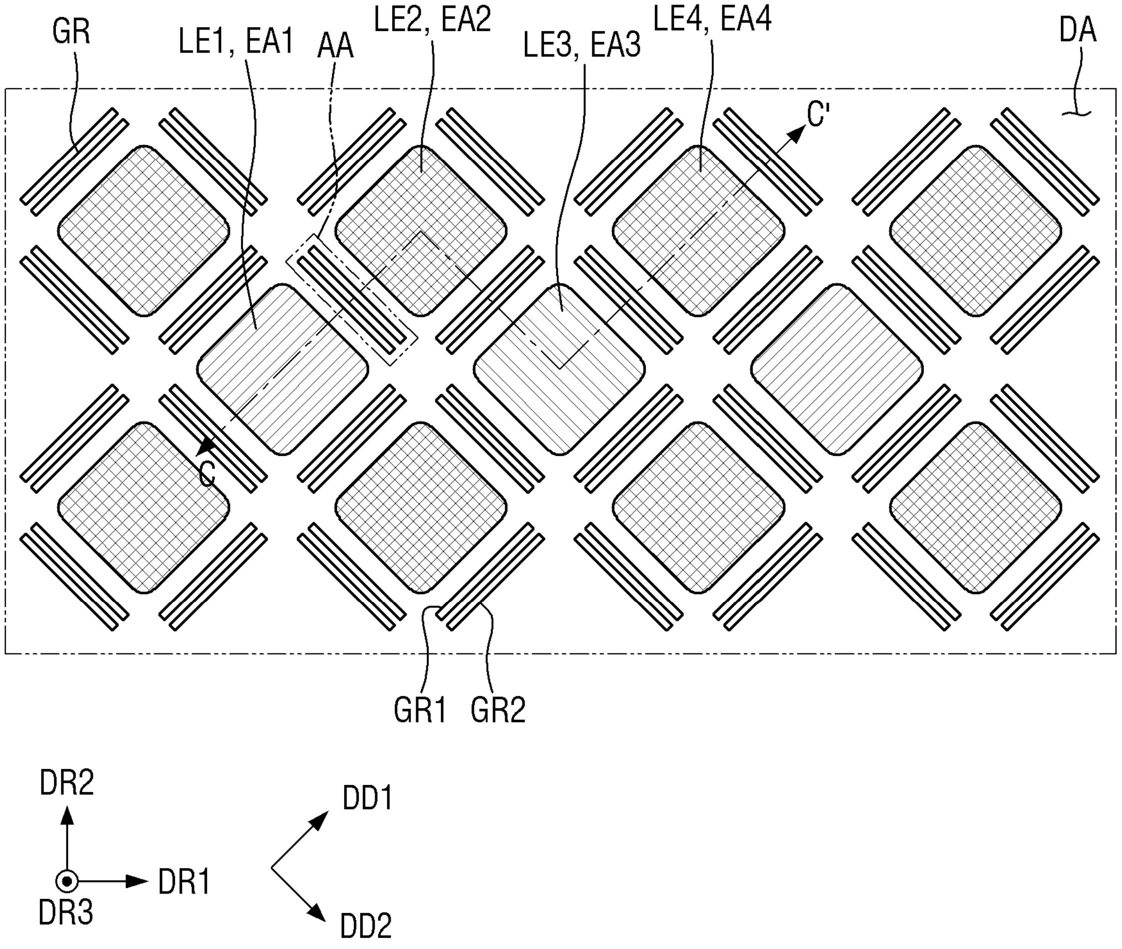
FIG. 11 is a cross-sectional view illustrating a display panel according to another embodiment of the present disclosure.
Figure 12:
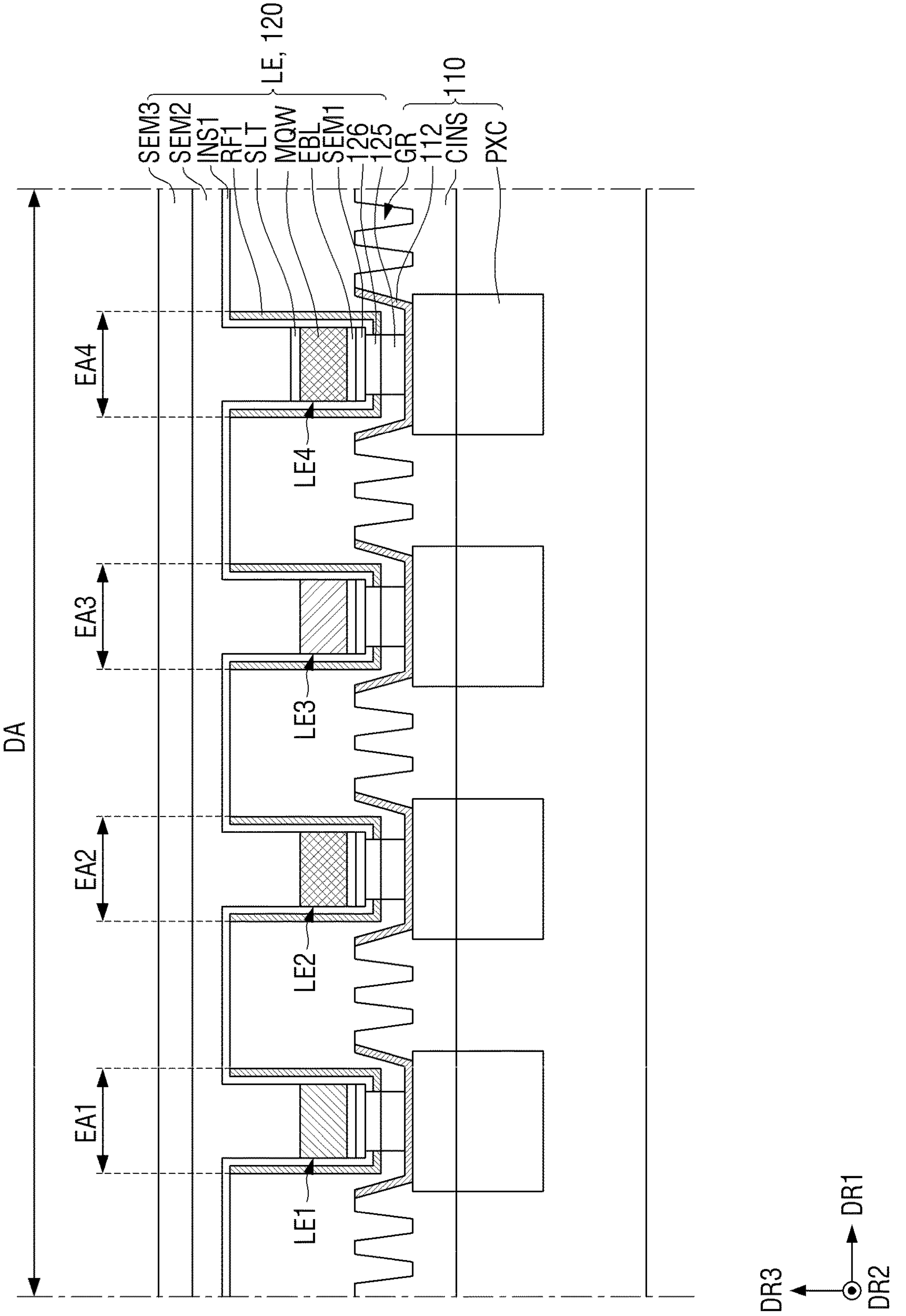
FIG. 12 is a plan view illustrating a display panel according to another embodiment of the present disclosure.
Figure 13:
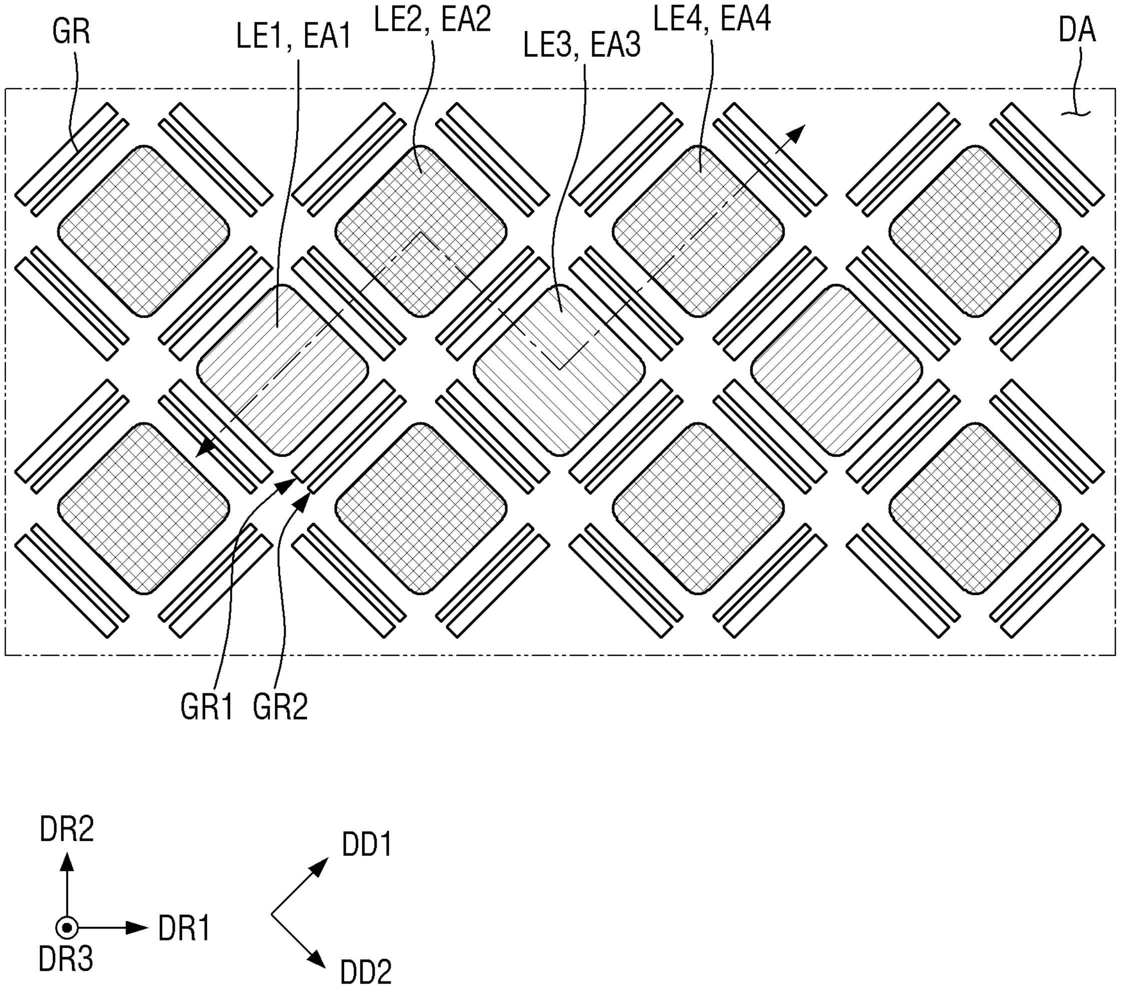
FIG. 13 is a plan view illustrating a display panel according to another embodiment of the present disclosure.
Figure 14:
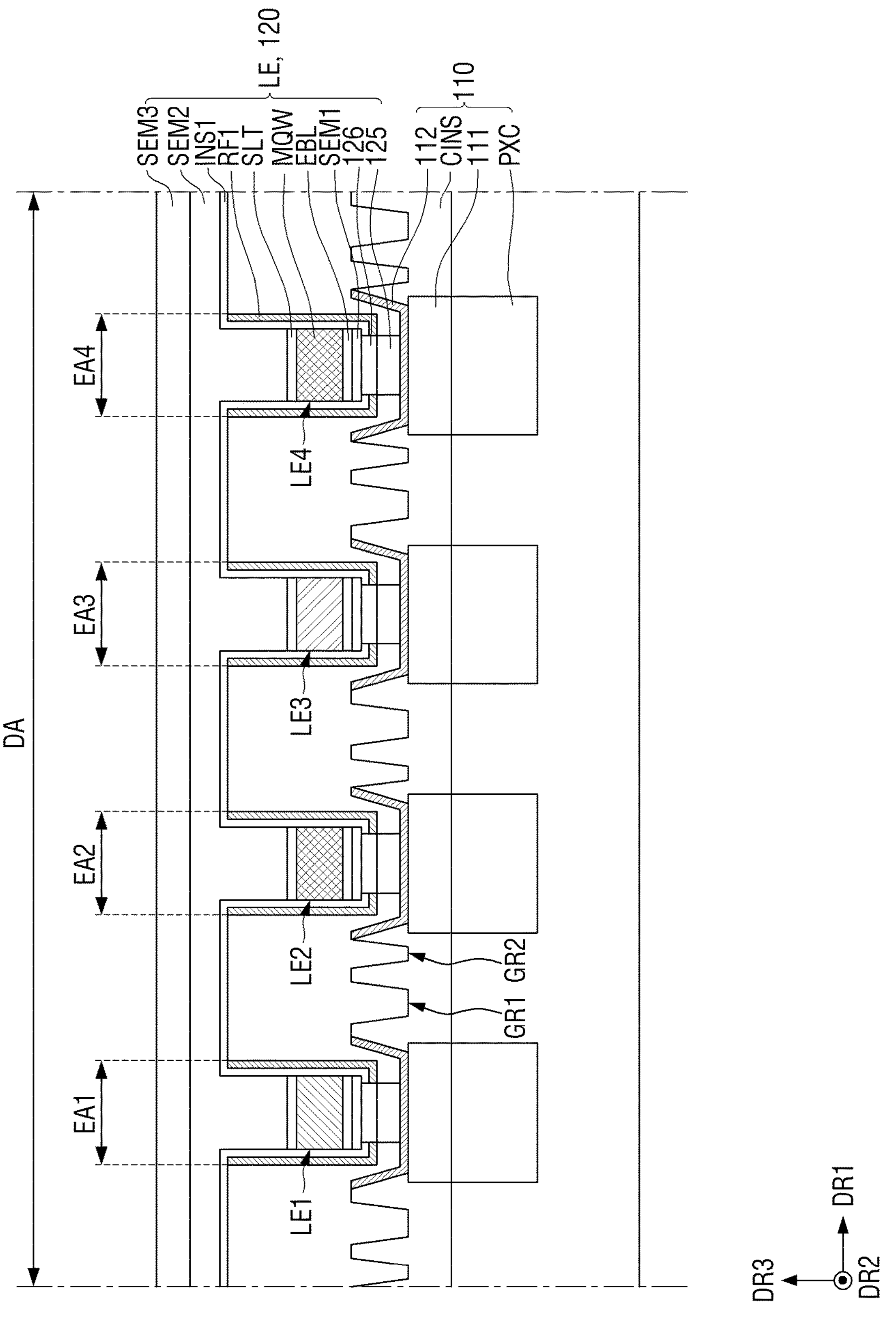
FIG. 14 is a cross-sectional view illustrating a display panel according to another embodiment of the present disclosure.
Figure 15A:
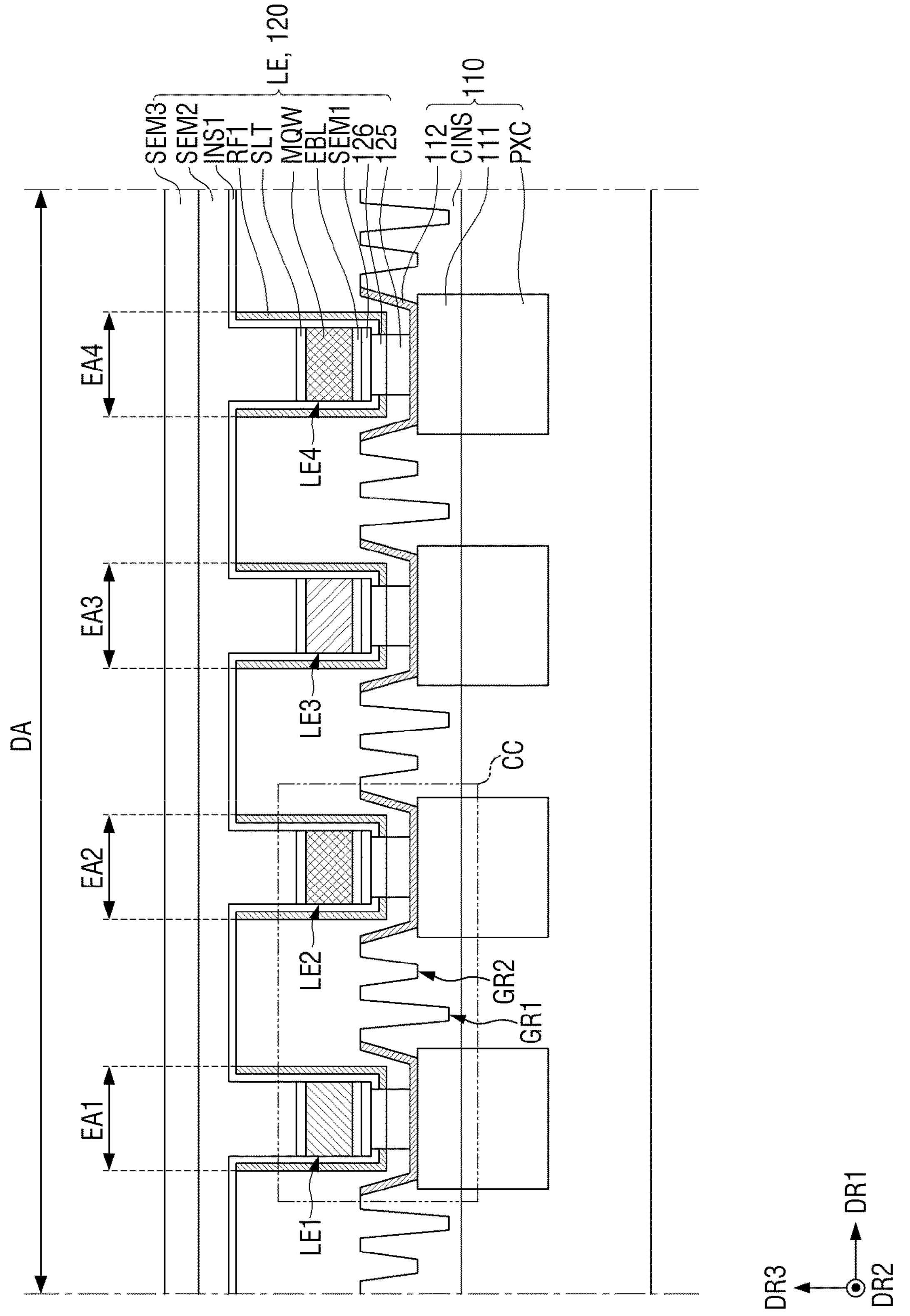
FIGS. 15A to 15C are cross-sectional views illustrating a display panel according to another embodiment of the present disclosure.
Figure 15B:
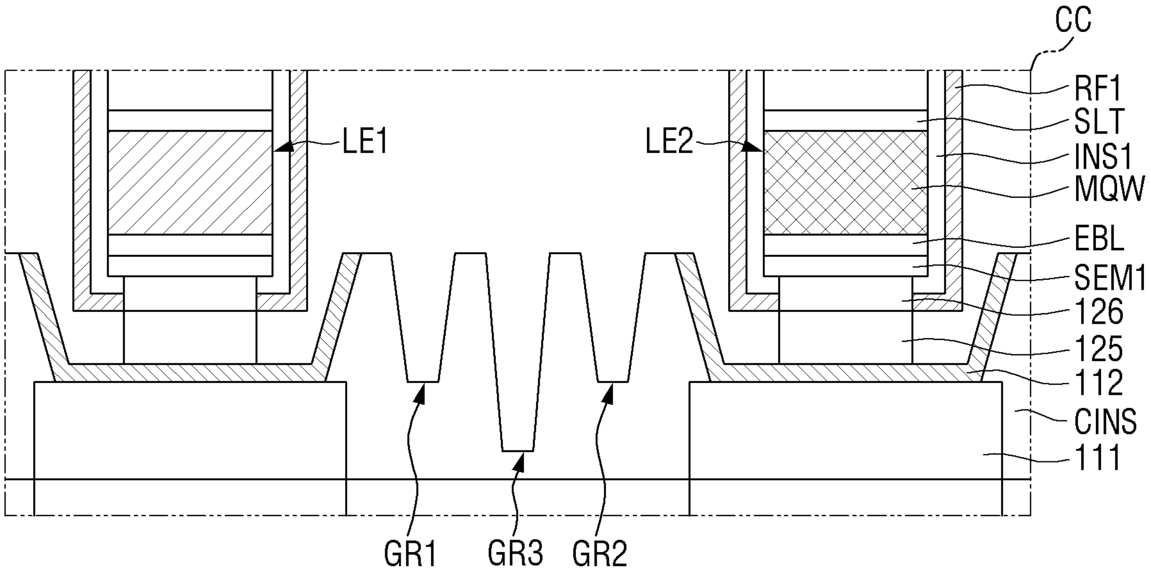
Figure 15C:
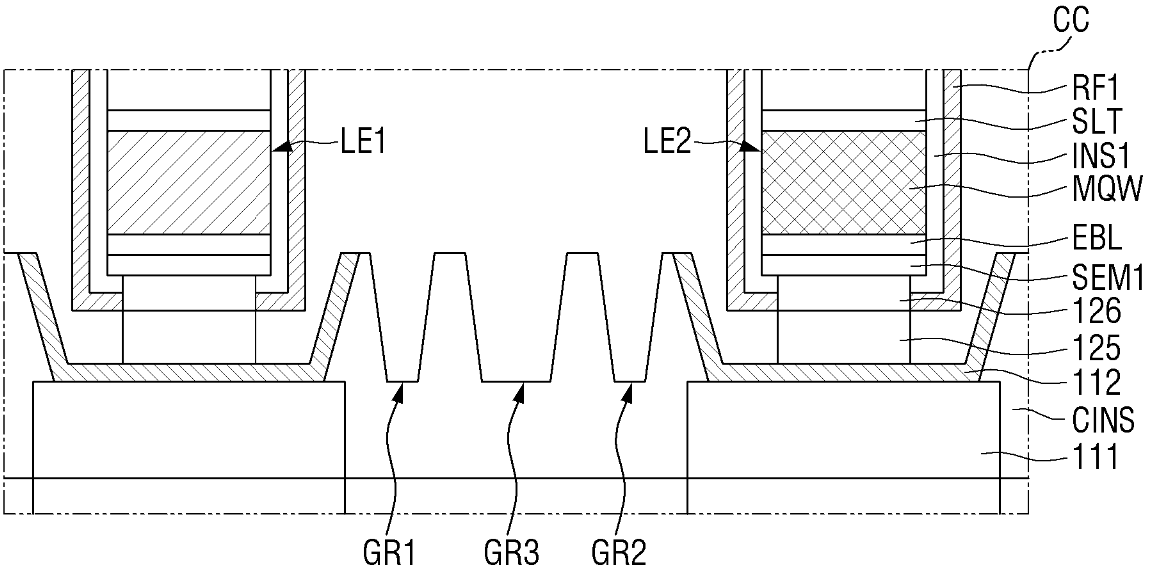

FIG. 11 is a cross-sectional view illustrating a display panel according to another embodiment of the present disclosure. FIG. 12 is a plan view illustrating a display panel according to another embodiment of the present disclosure. FIG. 13 is a plan view illustrating a display panel according to another embodiment of the present disclosure. FIG. 14 is a cross-sectional view illustrating a display panel according to another embodiment of the present disclosure. FIGS. 15A to 15C are cross-sectional views illustrating a display panel according to another embodiment of the present disclosure. FIGS. 15B and 15C are modified examples of the area CC of FIG. 15A.

Referring to FIGS. 11 to 15C, the display panel 100 is different from the embodiment shown in FIGS. 4 and 8 to 10 in that the number of grooves GR disposed between the respective light emission areas EA1, EA2, EA3, and EA4 is two or more, and the grooves GR have different widths and depths. Hereinafter, the same configurations as in the embodiment shown in FIGS. 4 and 8 to 10 will be described briefly or omitted, and differences from the embodiment shown in FIGS. 4 and 8 to 10 will be described in detail.

As shown in FIGS. 11 and 12, two or more grooves GR may be disposed between the sides of each of the light emission areas EA1, EA2, EA3, and EA4. The plurality of grooves GR may have the same width and length but are not limited thereto. The plurality of grooves GR may be disposed to be spaced apart from each of the light emission areas EA1, EA2, EA3, and EA4 at the same distance.

In an embodiment, the plurality of grooves GR may include a first groove GR1 disposed between the sides of each of the light emission areas EA1, EA2, EA3 and EA4, and a second groove GR2 adjacent to the first groove GR1. The first and second grooves GR1 and GR2 may have the same length and width.

In addition, the plurality of grooves GR may be disposed to be spaced apart from each of the light emission areas EA1, EA2, EA3. and EA4 at the same distance. For example, the first groove GR1 adjacent to the first light emission area EA1 and the second groove GR2 adjacent to the second light emission area EA2 may be disposed to be adjacent to each other. In such an embodiment, a distance between the first light emission area EA1 and the first groove GR1 may be equal to a distance between the second light emission area EA2 and the second groove GR2, but they are not limited thereto. The distance between the first light emission area EA1 and the first groove GR1 may be different from the distance between the second light emission area EA2 and the second groove GR2.

Distances between the first groove GR1 and the second groove GR2 may be equal to each other between the respective light emission areas EA1, EA2, EA3, and EA4 but are not limited thereto. The distances between the first groove GR1 and the second groove GR2 may be different from each other between the respective light emission areas EA1, EA2, EA3, and EA4. In addition, the depth of the first groove GR1 and the depth of the second groove GR2 may be equal to each other but are not limited thereto.

In the illustrated embodiment, because two or more grooves GR are disposed between the respective light emission areas EA1, EA2, EA3, and EA4, when the connection electrode 125 of the light-emitting element LE and the contact electrode 112 of the semiconductor circuit board 110 are bonded to each other, the metal material may be prevented from overflowing to the light-emitting elements LE adjacent thereto. Therefore, a defect caused by short of each light-emitting element LE may be avoided.

As shown in FIGS. 13 and 14, in another embodiment, the widths of the first and second grooves GR1 and GR2 may be different from each other.

For example, each of the first and second grooves GR1 and GR2 may be adjacent to the first light emission area EA1, and the first groove GR1 may be more adjacent to (or nearer) the first light emission area EA1 than the second groove GR2 is. In such an embodiment, the width of the first groove GR1 may be greater than that of the second groove GR2. Similarly, the width of the first groove GR1 adjacent to the third light emission area EA3 may be greater than that of the second groove GR2 adjacent thereto. On the other hand, the width of the first groove GR1 adjacent to the second light emission area EA2 and the fourth light emission area EA4 may be smaller than that of the second groove GR2 adjacent thereto.

Although the respective light emission areas EA1, EA2, EA3, and EA4 are shown as having the same plane size, they are not limited thereto. The first light emission area EA1 and the third light emission area EA3 may be larger than the second light emission area EA2 and the fourth light emission area EA4. Therefore, the metal material may overflow more (or may be more susceptible to overflowing) during bonding in the first and third light emission areas EA1 and EA3. Therefore, in the illustrated embodiment, the width of the first groove GR1 adjacent to the first and third light emission areas EA1 and EA3 may be greater than that of the second groove GR2 adjacent thereto, whereby the metal material may be further prevented from overflowing.

Also, as shown in FIG. 15A, in another embodiment, the depths of the first and second grooves GR1 and GR2 may be different from each other.

For example, each of the first and second grooves GR1 and GR2 may be adjacent to the first light emission area EA1, and the first groove GR1 may be more adjacent to (e.g., nearer to) the first light emission area EA1 than the second groove GR2 is. In such an embodiment, the depth of the first groove GR1 may be greater than that of the second groove GR2. Similarly, the depth of the first groove GR1 adjacent to the third light emission area EA3 may be greater than that of the second groove GR2 adjacent thereto. On the other hand, the depth of the first groove GR1 adjacent to the second light emission area EA2 and the fourth light emission area EA4 may be smaller than that of the second groove GR2 adjacent thereto.

Similarly, although the respective light emission areas EA1, EA2, EA3, and EA4 have shown as having the same plane size, they are not limited thereto. The first light emission area EA1 and the third light emission area EA3 may be larger than the second light emission area EA2 and the fourth light emission area EA4. Therefore, the metal material may further overflow during bonding from the first and third light emission areas EA1 and EA3. Therefore, in the illustrated embodiment, the depth of the first groove GR1 adjacent to the first and third light emission areas EA1 and EA3 may be greater than that of the second groove GR2 adjacent thereto, whereby the metal material may be further prevented from overflowing.

Although FIG. 15A shows that two grooves GR1 and GR2 have their respective depths different from each other, three or more grooves may be formed.

As shown in FIG. 15B, three grooves GR1, GR2, and GR3 may be disposed between the respective light emission areas EA1, EA2, EA3, and EA4 or the respective light-emitting elements LE1, LE2, LE3, and LE4. For example, from among the three grooves GR1, GR2, and GR3, the first groove GR1 adjacent to the first light-emitting element LE1 and the second groove GR2 adjacent to the second light-emitting element LE2 may have the same depth. The third groove GR3 disposed between the first groove GR1 and the second groove GR2 may have a depth deeper than that of each of the first groove GR1 and the second groove GR2, but it is not limited thereto. The depth of the first groove GR1 may be deeper than any other groove, and the depth of the third groove GR3 may be deeper than any other groove.

In addition, as shown in FIG. 15C, from among the three grooves GR1, GR2, and GR3, the first groove GR1 adjacent to the first light-emitting element LE1 and the second groove GR2 adjacent to the second light-emitting element LE2 may have the same width. The third groove GR3 disposed between the first groove GR1 and the second groove GR2 may be wider than the first groove GR1 and the second groove GR2, but it is not limited thereto. The first groove GR1 may be wider than any other groove, and the third groove GR3 may be wider than any other groove.

In addition, the depths and widths of the grooves GR1, GR2, and GR3 disclosed in the embodiments described above may be applied by being combined with each other. For example, the depth and width of the first groove GR1 may be the same as those of the second groove GR2. Also, the depth and the width of the third groove GR3 may be formed to be deeper and wider than those of the first and second grooves GR1 and GR2. Therefore, because an area for accommodating the third groove GR3 is greater than the first groove GR1 and the second groove GR2, the first groove GR1 and the second groove GR2 may perform a buffering action on an overflow of the metal material to more effectively prevent an overflow defect of the metal material from occurring.

Figure 16:
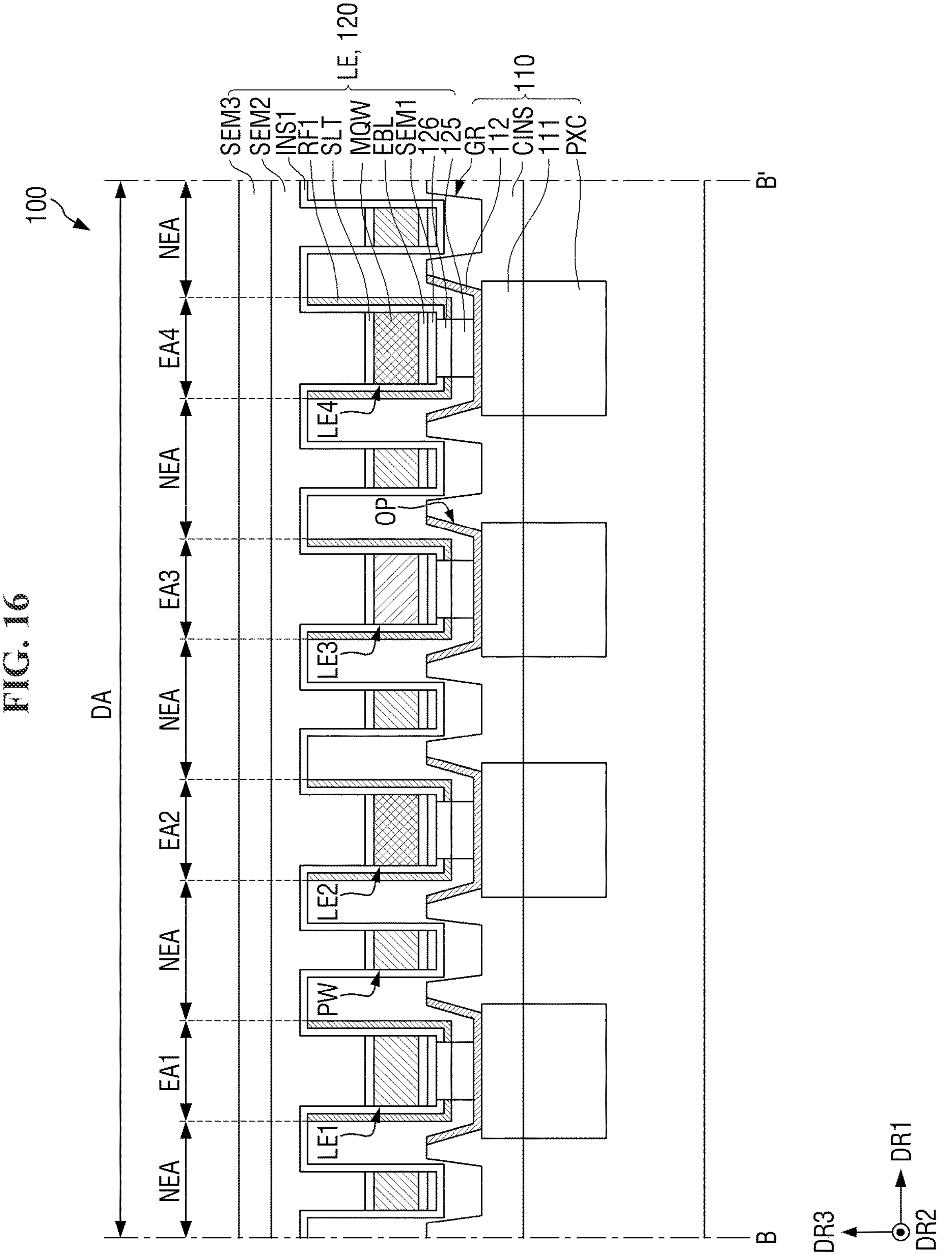
FIG. 16 is a cross-sectional view illustrating a display panel according to another embodiment of the present disclosure.
Figure 17:
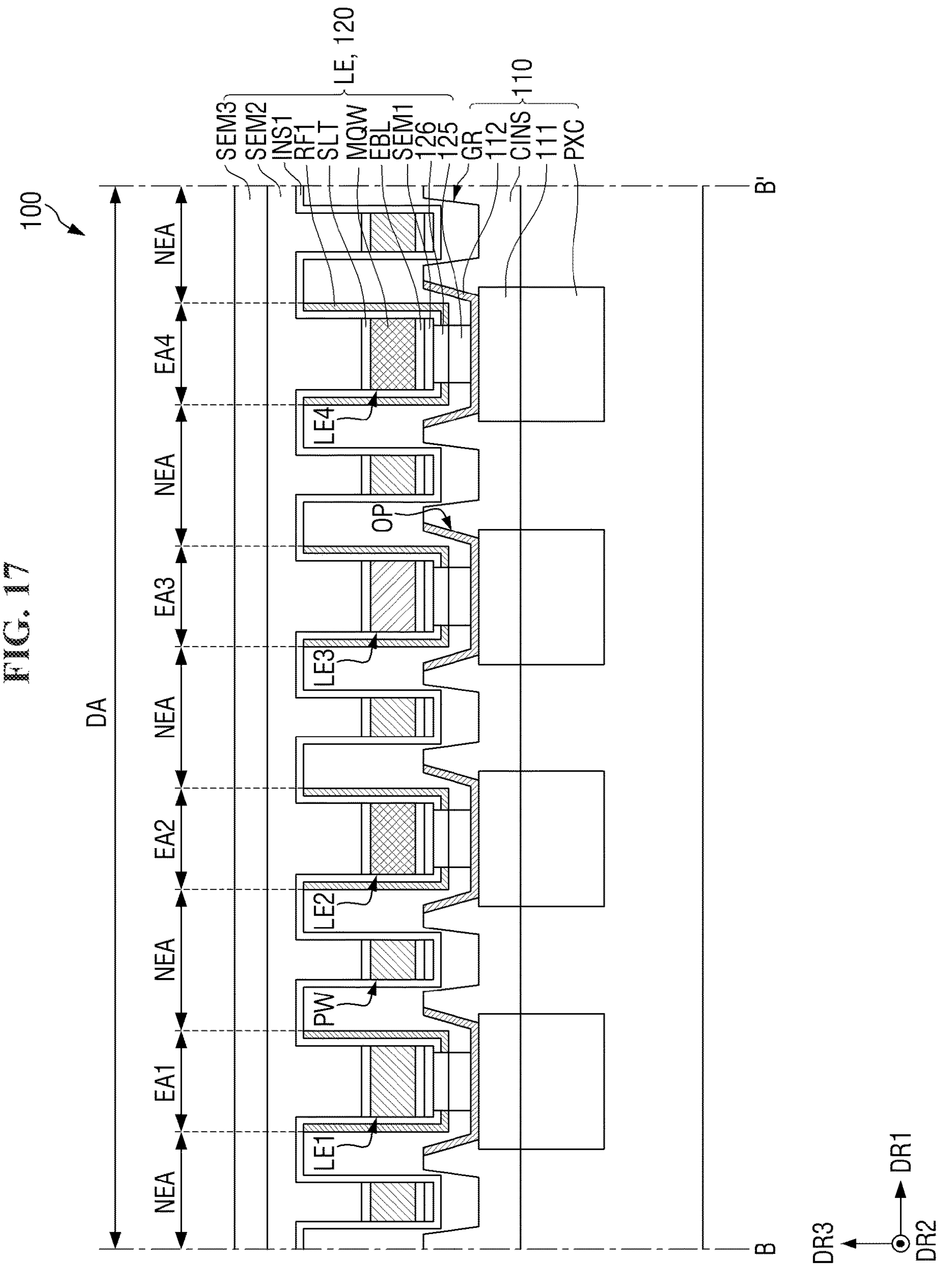
FIG. 17 is a cross-sectional view illustrating a display panel according to another embodiment of the present disclosure.

FIG. 16 is a cross-sectional view illustrating a display panel according to another embodiment of the present disclosure. FIG. 17 is a cross-sectional view illustrating a display panel according to another embodiment of the present disclosure.

Referring to FIGS. 16 and 17, the embodiments shown in FIGS. 16 and 17 are different from the embodiments shown in FIGS. 4 and 8 to 15 in that the light-emitting element layer 120 of the display panel 100 further includes a plurality of partition walls PW surrounding (e.g., extending around a periphery of) each light-emitting element LE. Hereinafter, the same configurations as those shown in FIGS. 4 and 8 to 15 will be described briefly or omitted, and differences from the embodiments shown in FIGS. 4 and 8 to 15 will be described in detail.

Referring to FIG. 16, the semiconductor circuit board 110 may include a plurality of grooves GR in a passivation layer CINS, and the light-emitting element layer 120 may include a plurality of partition walls PW disposed between the respective light-emitting elements LE1, LE2, LE3, and LE4 or between the respective light emission areas EA1, EA2, EA3, and EA4.

The plurality of partition walls PW may be disposed between the respective light-emitting elements LE1, LE2, LE3, and LE4 or between the respective light emission areas EA1, EA2, EA3, and EA4 and may be disposed to be spaced apart from the respective light-emitting elements LE1, LE2, LE3, and LE4. A plane arrangement of the plurality of partition walls PW may be the same as the shape of the plurality of grooves GR described above. For example, the plurality of partition walls PW may be disposed between the first light emission area EA1 and the second light emission area EA2, between the second light emission area EA2 and the third light emission area EA3, between the third light emission area EA1 and the fourth light emission area EA4, between the first light emission area EA1 and the second and fourth light emission areas EA2 and EA4, which are disposed near the first light emission area EA1, and between the third light emission area EA3 and the second and fourth light emission areas EA2 and EA4, which are disposed near the third light emission area EA3. The plurality of partition walls PW may be disposed to be offset from (e.g., so as not to overlap) the first light emission area EA1, the second light emission area EA2, the third light emission area EA3, and the fourth light emission area EA4. The plurality of partition walls PW may be disposed in (e.g., disposed to overlap) the non-light emission area NEA, that is, the other area except the first light emission area EA1, the second light emission area EA2, the third light emission area EA3, and the fourth light emission area EA4 in the display area DA.

The plurality of partition walls PW may be defined as portions protruded toward the plurality of grooves GR. The plurality of partition walls PW may include a first semiconductor layer SEM1, an electron blocking layer EBL, an active layer MQW, a superlattice layer SLT, a second semiconductor layer SEM2, and a third semiconductor layer SEM3, which are sequentially deposited in the third direction DR3. The second semiconductor layer SEM2 and the third semiconductor layer SEM3 may be common layers that are continuously disposed on the plurality of light-emitting elements LE1, LE2, LE3, and LE4 and on the partition walls PW. The plurality of partition walls PW may include a first insulating layer INS1 that covers the first semiconductor layer SEM1, the electron blocking layer EBL, the active layer MQW, the superlattice layer SLT, the second semiconductor layer SEM2, and the third semiconductor layer SEM3. The first insulating layer INS1 may be a lowest layer covering the first semiconductor layer SEM1 of the plurality of partition walls PW. The plurality of partition walls PW may have a width smaller than that of each of the light-emitting elements LE.

The plurality of partition walls PW may overlap the plurality of grooves GR disposed on the semiconductor circuit board 110. In an embodiment, the plurality of partition walls PW may correspond to the plurality of grooves GR in one-to-one correspondence. Also, the plurality of partition walls PW may be formed to have the same thickness but are not limited thereto and may have different thicknesses. The plurality of partition walls PW may also have the same width but are not limited thereto and may have different widths.

In an embodiment, the plurality of partitions PW may be in (or inserted into) the plurality of grooves GR, respectively. For example, a lower surface of the first insulating layer INS1 disposed at the lowest portion of the plurality of partition walls PW may be disposed below the uppermost surface of the plurality of grooves GR. For example, the plurality of partition walls PW and the plurality of grooves GR may be disposed in a shape in which the plurality of partition walls PW are respectively in the plurality of grooves GR. To this end, the width of each of the plurality of partition walls PW may be smaller than that of each of the plurality of grooves GR, and a length on a plane of each of the plurality of partition walls PW may be shorter than that of each of the plurality of grooves GR.

When the plurality of partition walls PW are respectively inserted into the plurality of grooves GR, a flow path of the metal material may be increased when the metal material overflows when the light-emitting elements LE are bonded to the semiconductor circuit board 110. Therefore, overflow of the metal material into adjacent light emission areas may be further prevented from occurring and a defect may be prevented from occurring.

As shown in FIG. 17, when two or more grooves GR are disposed between the respective light emission areas EA1, EA2, EA3, and EA4, two or more partition walls PW may also be disposed between the respective light emission areas EA1, EA2, EA3, and EA4. The respective partition walls PW may overlap the respective grooves GR in one-to-one correspondence and may be inserted into the respective grooves GR. The plane arrangement of the partition walls PW is substantially the same as that of the above-described grooves GR and is equally applicable to a plane arrangement of the grooves GR that will be described later.

FIGS. 18 to 21 are plan views illustrating modified examples of grooves in the area AA of FIG. 11.

Figure 18:
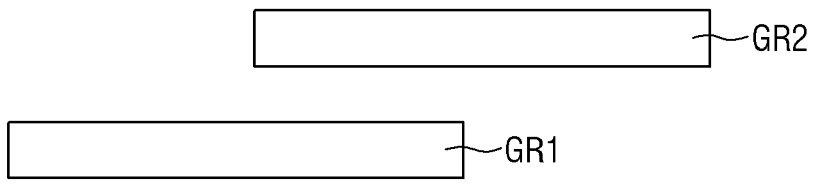
FIGS. 18 to 21 are plan views illustrating modified examples of grooves in the area AA of FIG. 11.

Referring to FIG. 18, the plurality of grooves GR may include a first groove GR1 and a second groove GR2. The first and second grooves GR1 and GR2 may have the same width and length. In this embodiment, at least a portion of the first groove GR1 and at least a portion of the second groove GR2 may overlap each other on a plane. "Overlap on the plane" indicates that the respective grooves GR1 and GR2 overlap each other in a vertical direction. When the above-mentioned metal material overflows, the metal material may partially be blocked by the first groove GR1 but may overflow to the second groove GR2 in an area where the first groove GR1 is not disposed. In this case, the second groove GR2 may again block the metal material.

Figure 19:
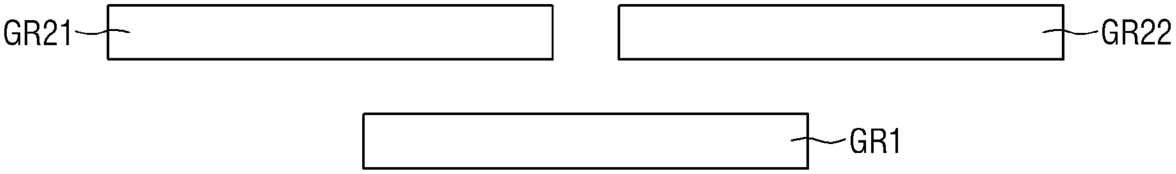

Referring to FIG. 19, the second groove GR2 may further include a plurality of grooves, and the plurality of grooves may include a (2-1)th groove GR21 and a (2-2)th groove GR22. The (2-1)th groove GR21 and the (2-2)th groove GR22 may be spaced apart from each other and may have the same length. A distance between the (2-1)th groove GR21 and the (2-2)th groove GR22 may overlap the first groove GR1 on the plane. Therefore, when the metal material overflows, the flow path of the metal material may be increased to prevent the metal material from overflowing into an adjacent light emission area.

Figure 20:
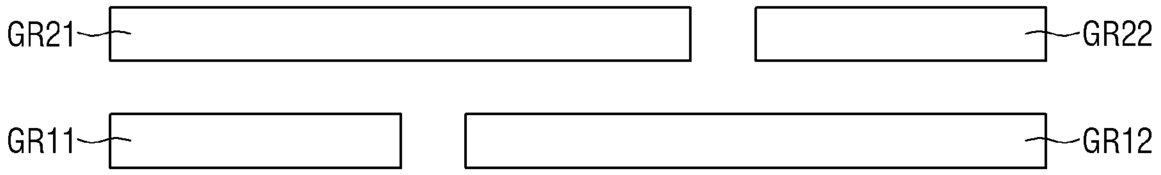

Referring to FIG. 20, different from the embodiment show in FIG. 19, the first groove GR1 may further include a plurality of grooves, and the plurality of grooves may include a (1-1)th groove GR11 and a (1-2)th groove GR12. The (1-1)th groove GR11 and the (1-2)th groove GR12 may be spaced apart from each other. A length of the (1-1)th groove GR11 may be shorter than that of the (1-2)th groove GR12, and a length of the (2-1)th groove GR21 may be shorter than that of the (2-2)th groove GR22. The (1-2)th groove GR12 may overlap a portion of the (2-1)th groove GR21 and a portion of the (2-2)th groove GR22 on the plane, and the (2-1)th groove GR21 may overlap a portion of the (1-1)th groove GR11 and a portion of the (1-2)th groove GR12 on the plane. Also, the (1-1)th groove GR11 may overlap the (2-1)th groove GR21 on the plane, and the (2-2)th groove GR22 may overlap the (1-2)th groove GR12 on the plane. A distance (or an area or space) between the (1-1)th groove GR11 and the (1-2)th groove GR12 may overlap the (2-1)th groove GR21 on the plane, and a distance (or an area or space) between the (2-1)th groove GR21 and the (2-2)th groove GR22 may overlap the (1-2)th groove GR12 on the plane.

Figure 21:
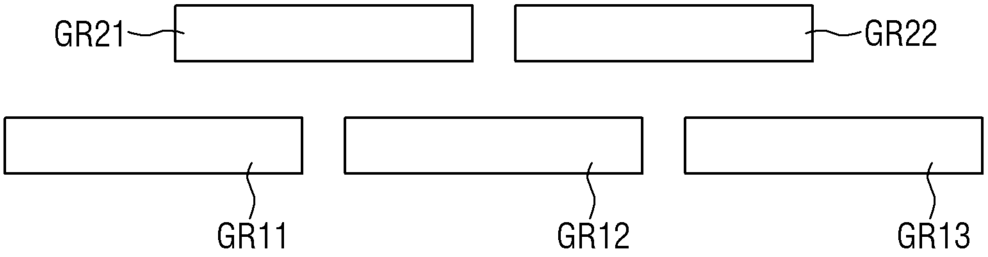

Referring to FIG. 21, the first groove GR1 may further include a (1-3)th groove GR13. The (1-1)th groove GR11, the (1-2)th groove GR12, and the (1-3)th groove GR13 may have the same length and may be spaced apart from one another. Each of the (1-1)th groove GR11 and the (1-2)th groove GR12 may overlap the (2-1)th groove GR21 on the plane, and each of the (1-2)th groove GR12 and the (1-3)th groove GR13 may overlap the (2-2)th groove GR22 on the plane. A distance (or an area or space) between the (1-1)th groove GR11 and the (1-2)th groove GR12 may overlap the (2-1)th groove GR21 on the plane, and a distance (or an area or space) between the (2-1)th groove GR21 and the (2-2)th groove GR22 may overlap the (1-2)th groove GR12 on the plane. Also, a distance (or an area or space) between the (1-2)th groove GR12 and the (1-3)th groove GR13 may overlap the (2-2)th groove GR22 on the plane.

FIGS. 22 to 29 are plan views illustrating shapes of grooves of a display panel according to other embodiments of the present disclosure.

Figure 22:
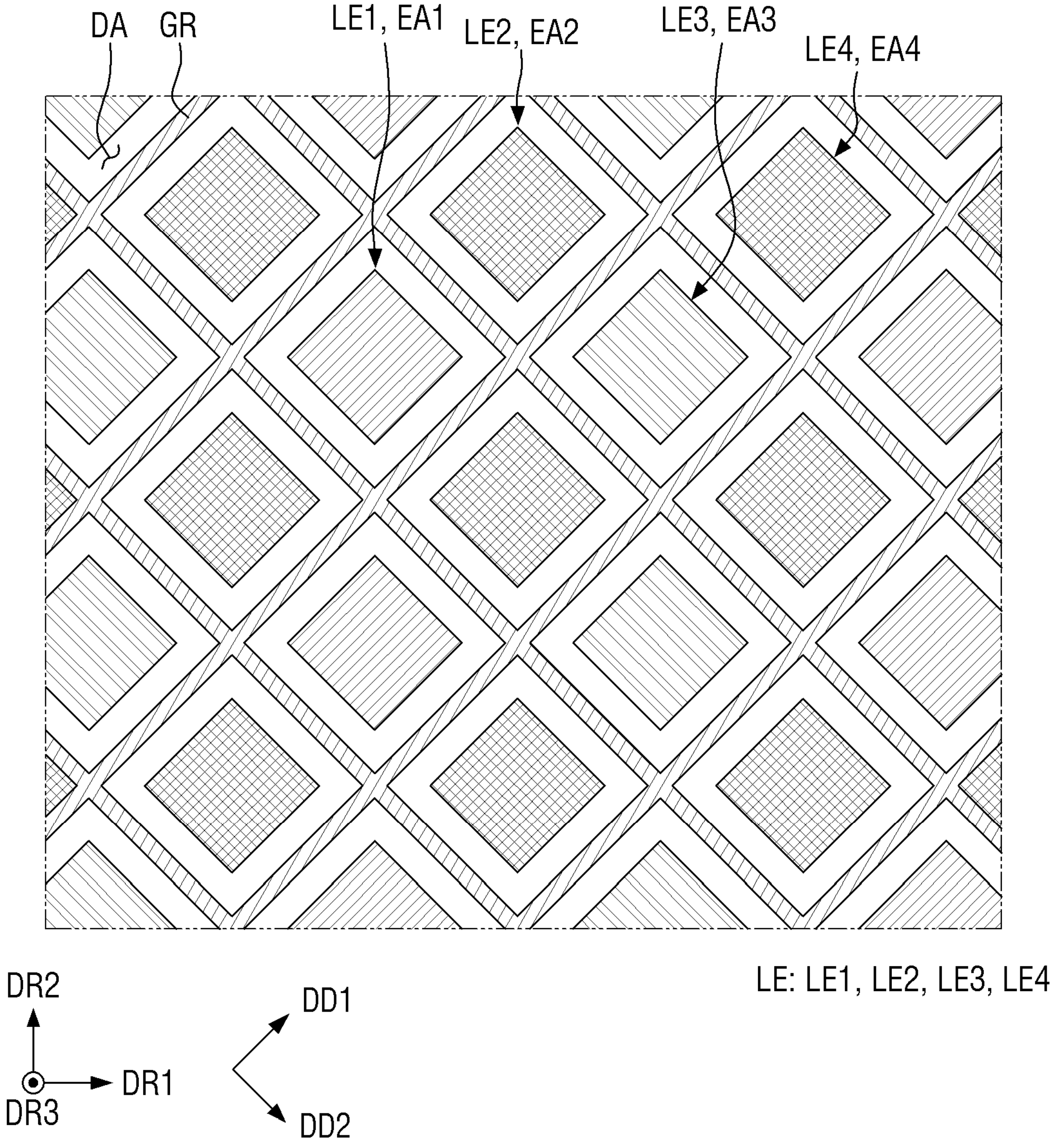
FIGS. 22 to 29 are plan views illustrating shapes of grooves in a display panel according to other embodiments of the present disclosure.
Figure 23:
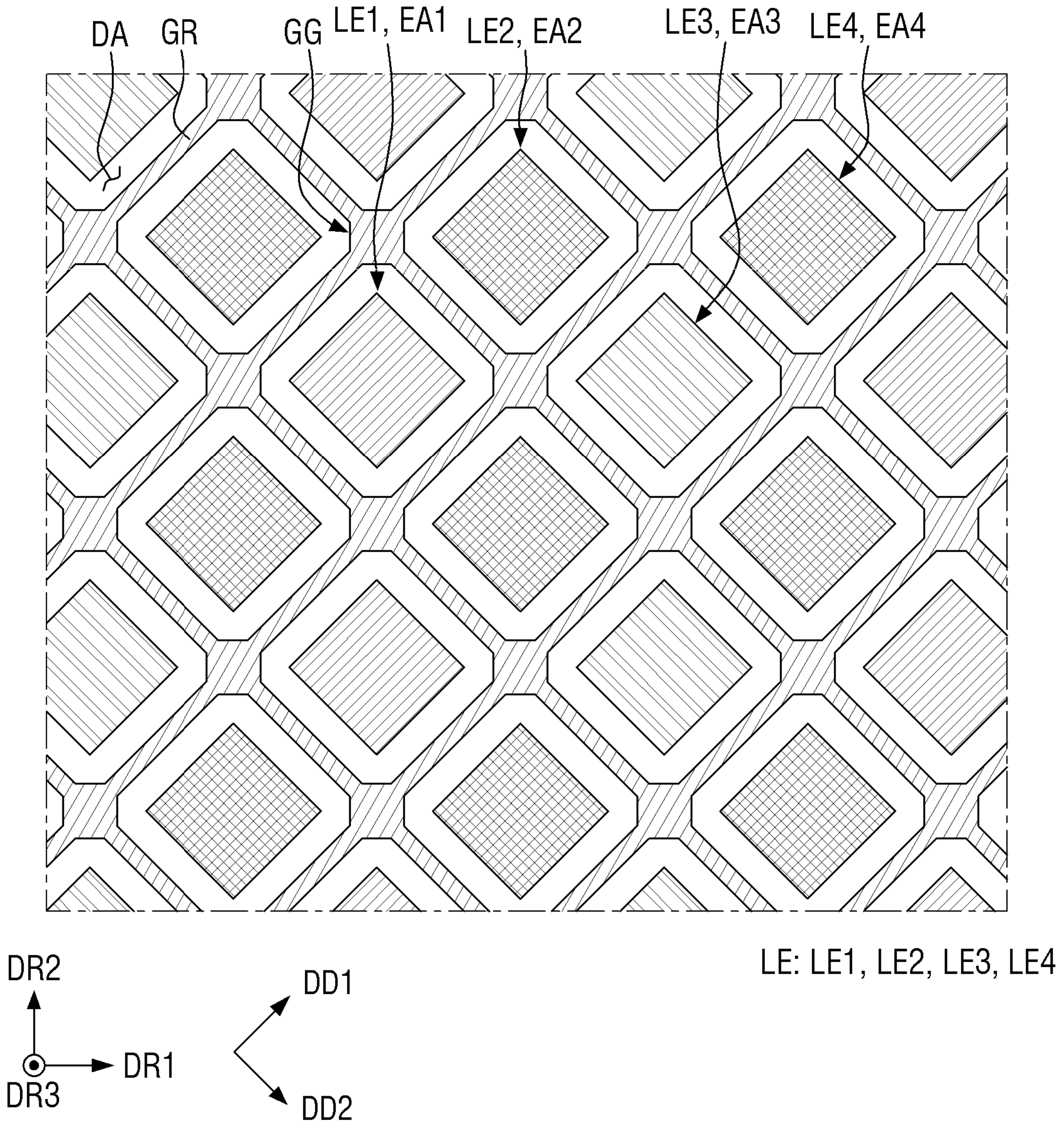

Referring to FIGS. 22 and 23, the groove GR may be formed in one body (e.g., may be integral with each other) to surround (e.g., to extend around a periphery of) each of the light emission areas EA1, EA2, EA3, and EA4. For example, the groove GR may be formed in a mesh shape. When the groove GR is one body, the groove GR is disposed in the entire area between the respective light emission areas EA1, EA2, EA3 and EA4, whereby the metal material may be further prevented from overflowing.

As shown in FIG. 23, in another embodiment, the groove GR may include an integrated unit GG disposed in an area adjacent to the vertex of each of the adjacent light emission areas EA1, EA2, EA3, and EA4. The integrated unit GG may be an area in which the grooves GR extended between the respective light emission areas EA1, EA2, EA3, and EA4 are integrated (e.g., connected with or communicate with each other). The integrated unit GG may be formed in a polygonal shape, but it is not limited thereto and may be formed in a circular shape.

Figure 24A:
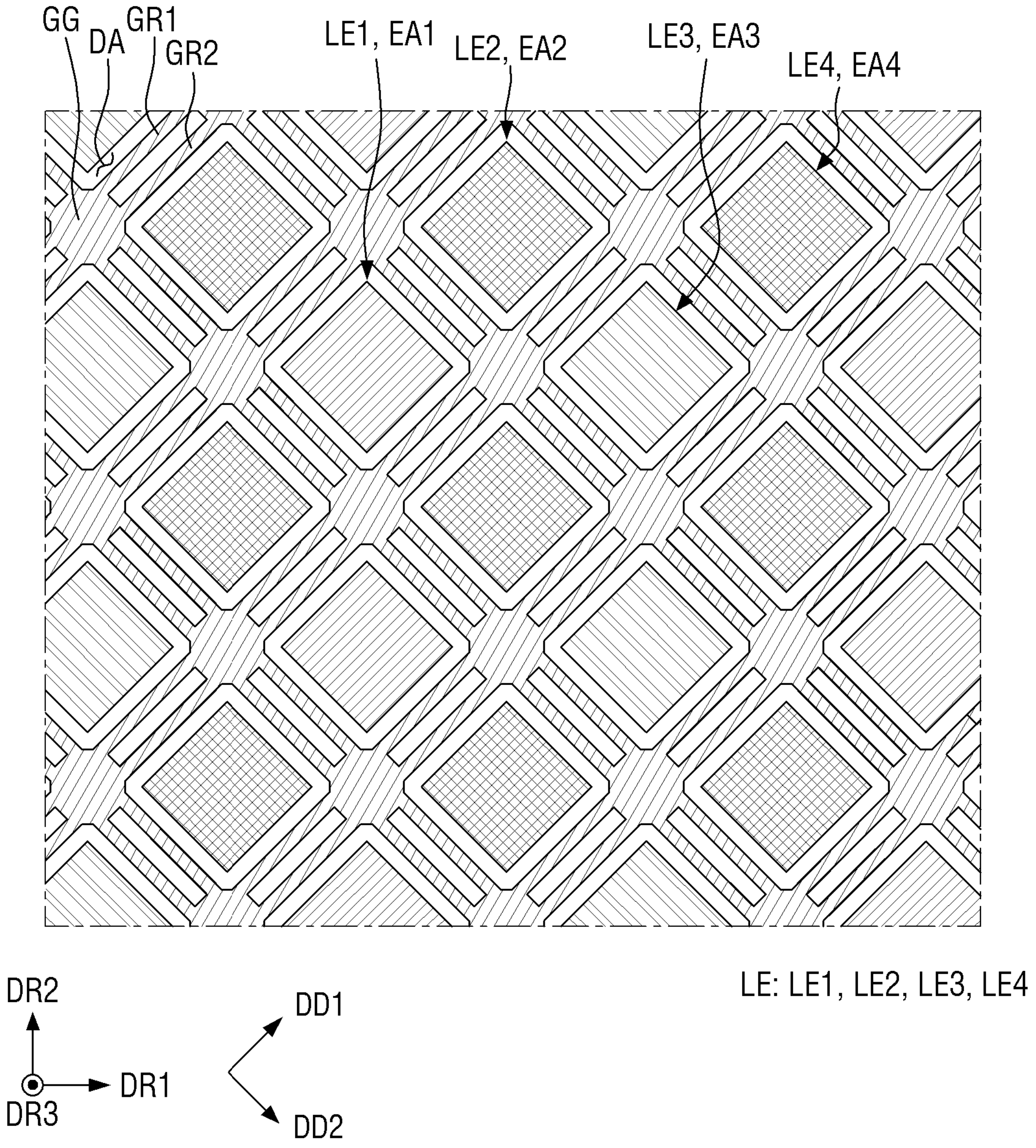

As shown in FIG. 24A, in another embodiment, the grooves GR shown in FIG. 11 may be integrated with the integrated unit GG. Although the number of grooves GR is two in the illustrated embodiment, the present disclosure is not limited thereto, and the number of grooves GR may be three or more.

Figure 24B:
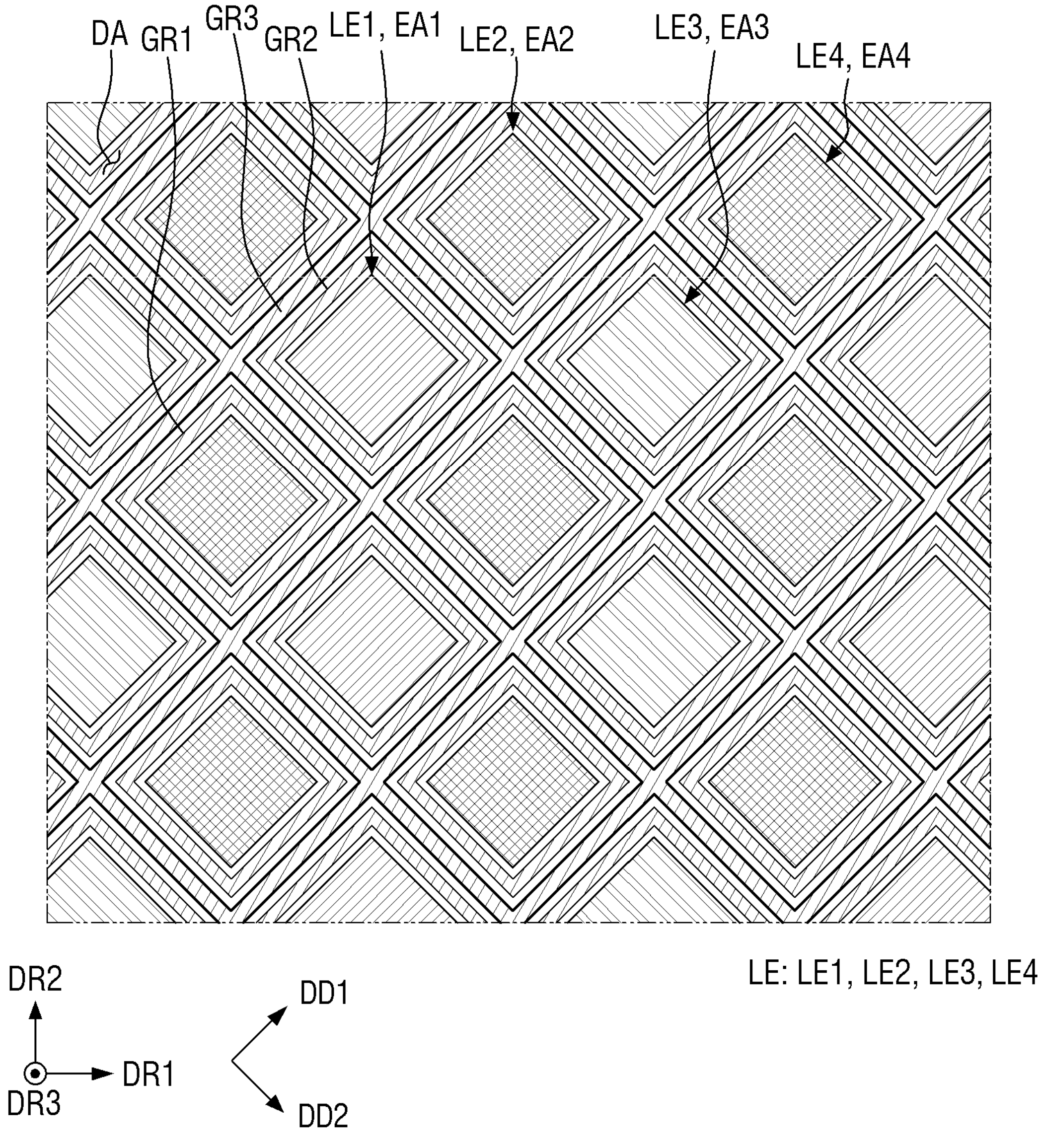

As shown in FIG. 24B, when the number of grooves GR is three or more, the first groove GR1 may be formed in a closed loop or ring shape surrounding one light-emitting element LE, and the second groove GR2 may be formed in a closed loop or ring shape surrounding another light-emitting element LE adjacent to the first groove GR1. The third groove GR3 may be disposed between the first groove GR1 and the second groove GR2 and may be disposed in a mesh shape between the respective light-emitting elements LE1, LE2, LE3, and LE4 or between the respective light emission areas EA1, EA2, EA3, and EA4. A cross-sectional shape across the first groove GR1, the second groove GR2, and the third groove GR3 may be the same as those show in FIGS. 15B and 15C described above. Thus, a depth and/or width relationship from among the grooves GR1, GR2, and GR3 may be applied as described in FIGS. 15B and 15C.

Figure 25:
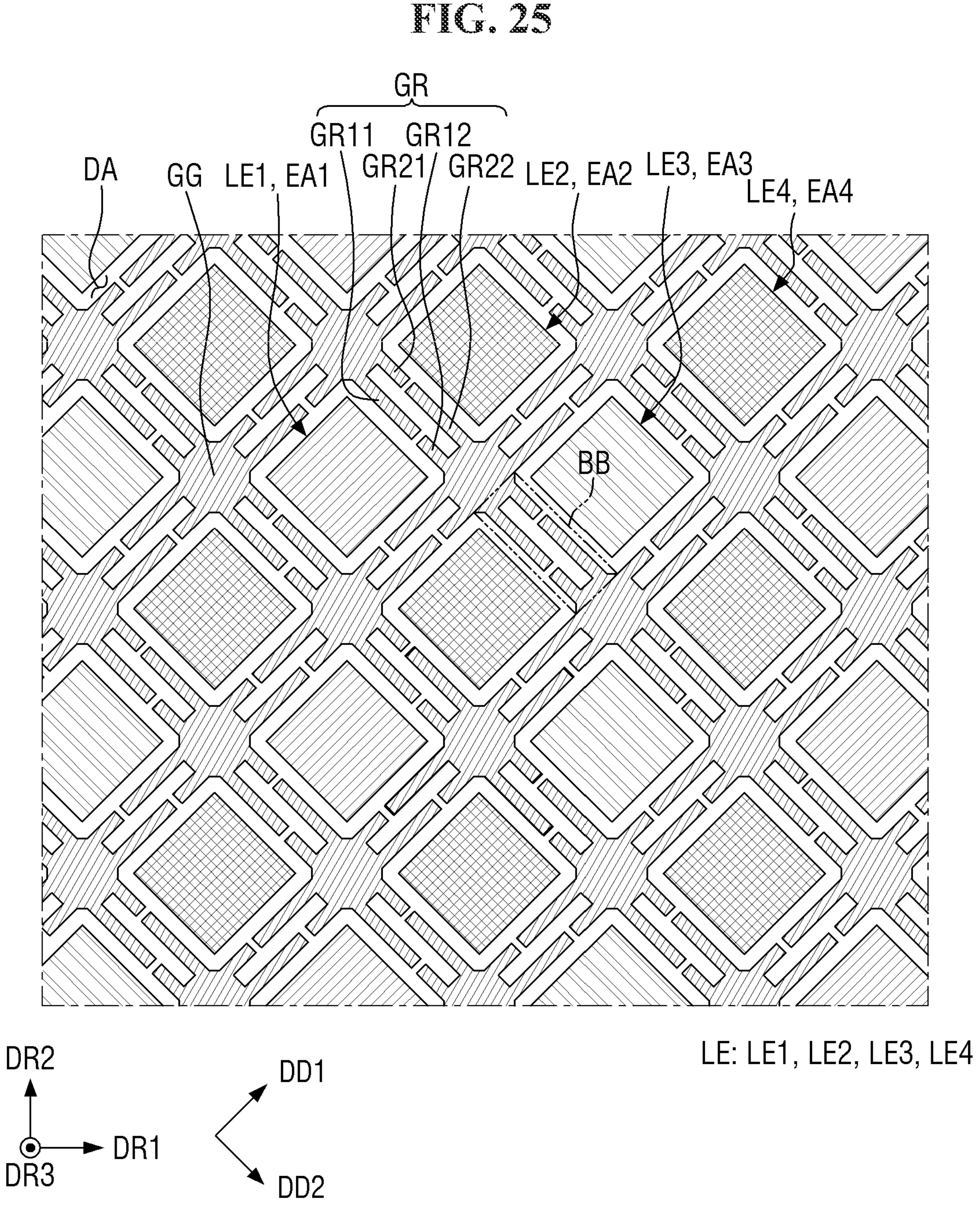

As shown in FIG. 25, in another embodiment, the grooves GR11, GR12, GR21, and GR22 shown in FIG. 20 may be integrated with the integrated unit GG.

Figure 26:
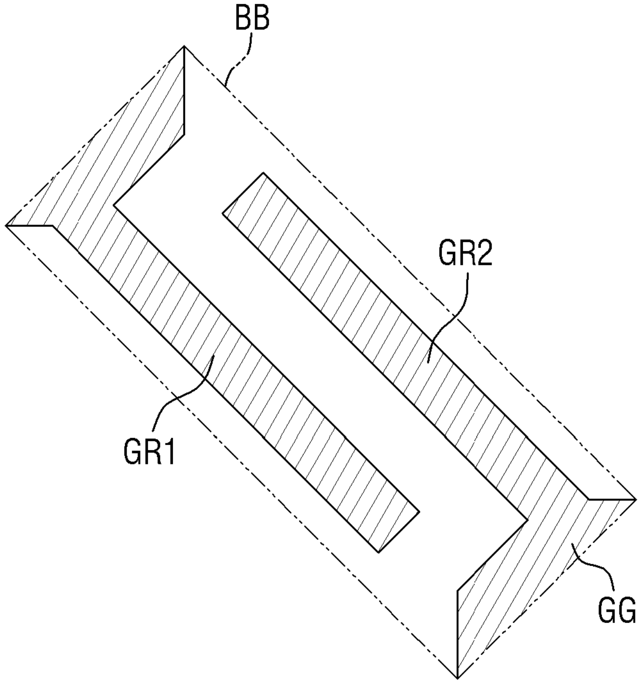

As shown in FIG. 26, in another embodiment, the plurality of grooves GR1 and GR2 shown in FIG. 18 may be integrated with the integrated unit GG.

Figure 27:
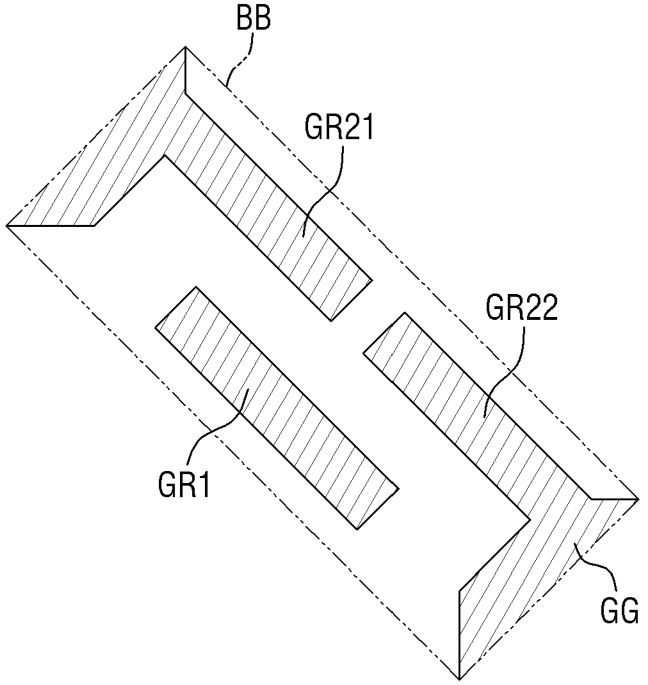

As shown in FIG. 27, in another embodiment, the plurality of grooves GR1, GR21, and GR22 shown in FIG. 19 may be integrated with the integrated unit GG.

Figure 28:
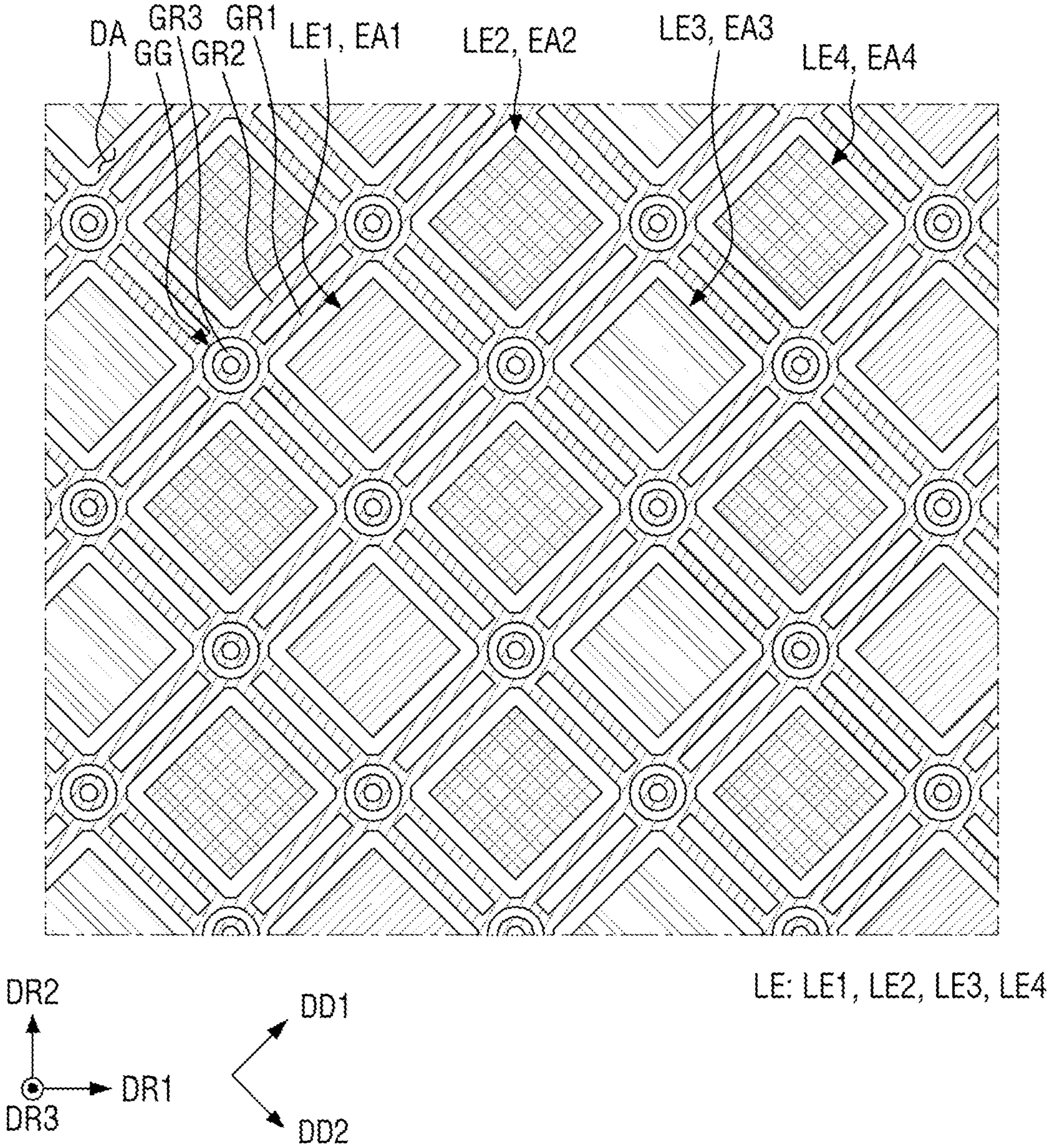

As shown in FIG. 28, in another embodiment, a third groove GR3 may be further disposed inside the integrated unit GG of the groove GR. The third groove GR3 may be disposed to be spaced apart from the first groove GR1 and the second groove GR2 of the integrated unit GG and may form an additional groove in the integrated unit GG to further prevent the metal material from overflowing from the integrated unit GG.

Figure 29:
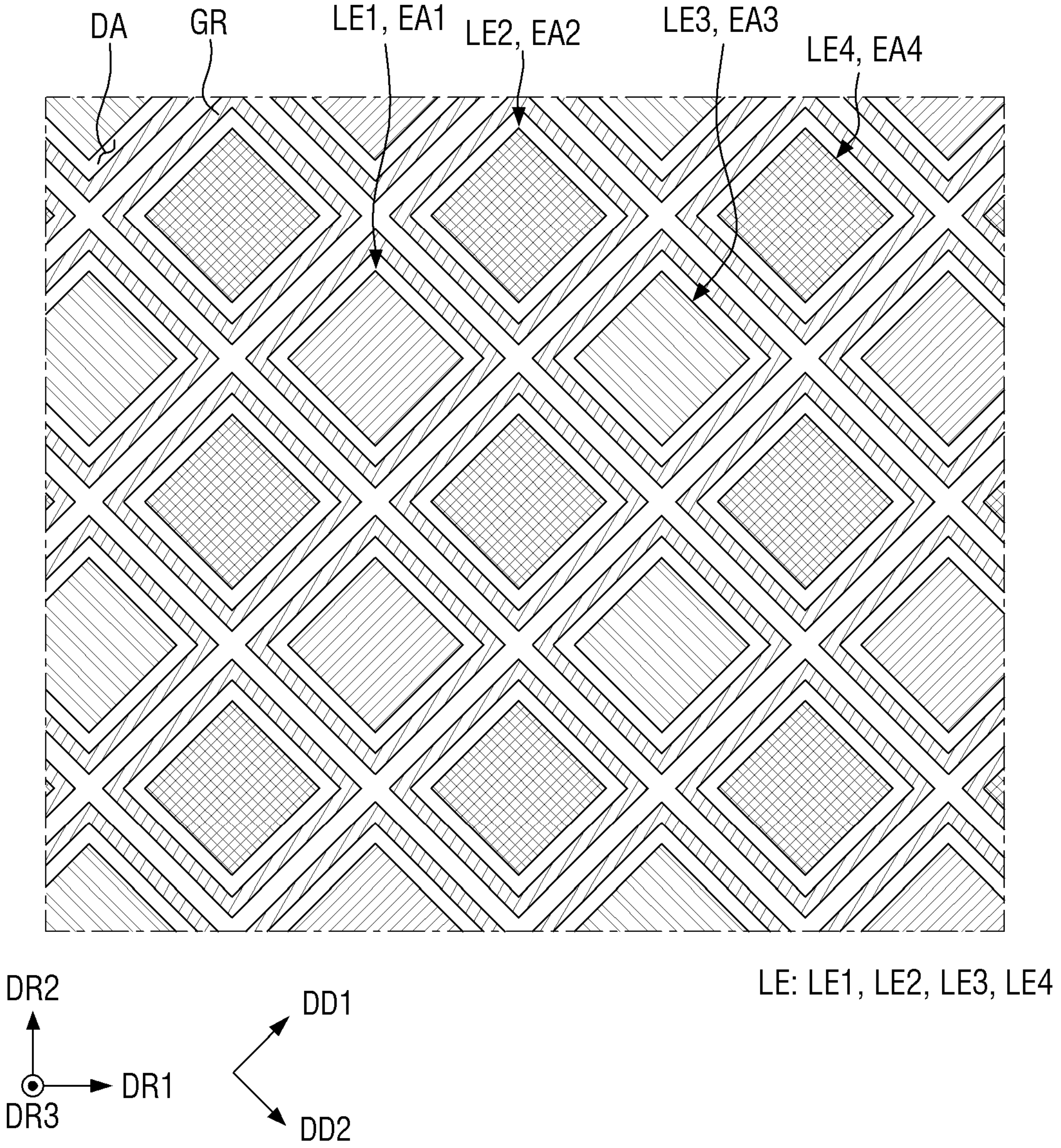

As shown in FIG. 29, in another embodiment, the groove GR may include a plurality of grooves GR, and each groove GR may surround each of the light emission areas EA1, EA2, EA3, and EA4. Each groove GR may be formed in a closed loop shape to further prevent metal from overflowing from each of the light emission areas EA1, EA2, EA3, and EA4.

The plane shape of the groove GR according to the various embodiments described above may be formed by combination of shapes of the respective drawings in addition to the shape(s) shown in the drawings or may be omitted. In addition, a shape corresponding to various shapes of the above-described groove GR may be applied to the plane shape of the partition wall PW.

As described above, in the display panel 100 according to one embodiment of the present disclosure, the plurality of grooves GR may be disposed between the respective light emission areas EA1, EA2, EA3, and EA4, whereby the metal material may be prevented from overflowing to the light-emitting elements LE adjacent thereto when the connection electrode 125 of the light-emitting element LE and the contact electrode 112 of the semiconductor circuit board 110 are bonded to each other. Therefore, a defect caused by short of adjacent light-emitting elements LE may be avoided.

Also, in the display panel 100 according to one embodiment of the present disclosure, the plurality of partition walls PW inserted into the plurality of grooves GR may be disposed between the respective light emission areas EA1, EA2, EA3, and EA4, whereby the metal material may be further prevented from overflowing to the light-emitting elements LE adjacent thereto.

In addition, the display panel 100 according to an embodiment of the present disclosure may include grooves GR and partition walls PW having various shapes, which are disposed between the respective light emission areas EA1, EA2, EA3, and EA4, thereby further preventing the metal material from overflowing to the light-emitting elements LE adjacent thereto.

Hereinafter, a manufacturing process of the display device 10 according to one embodiment will be described with reference to other drawings.

Figure 30:
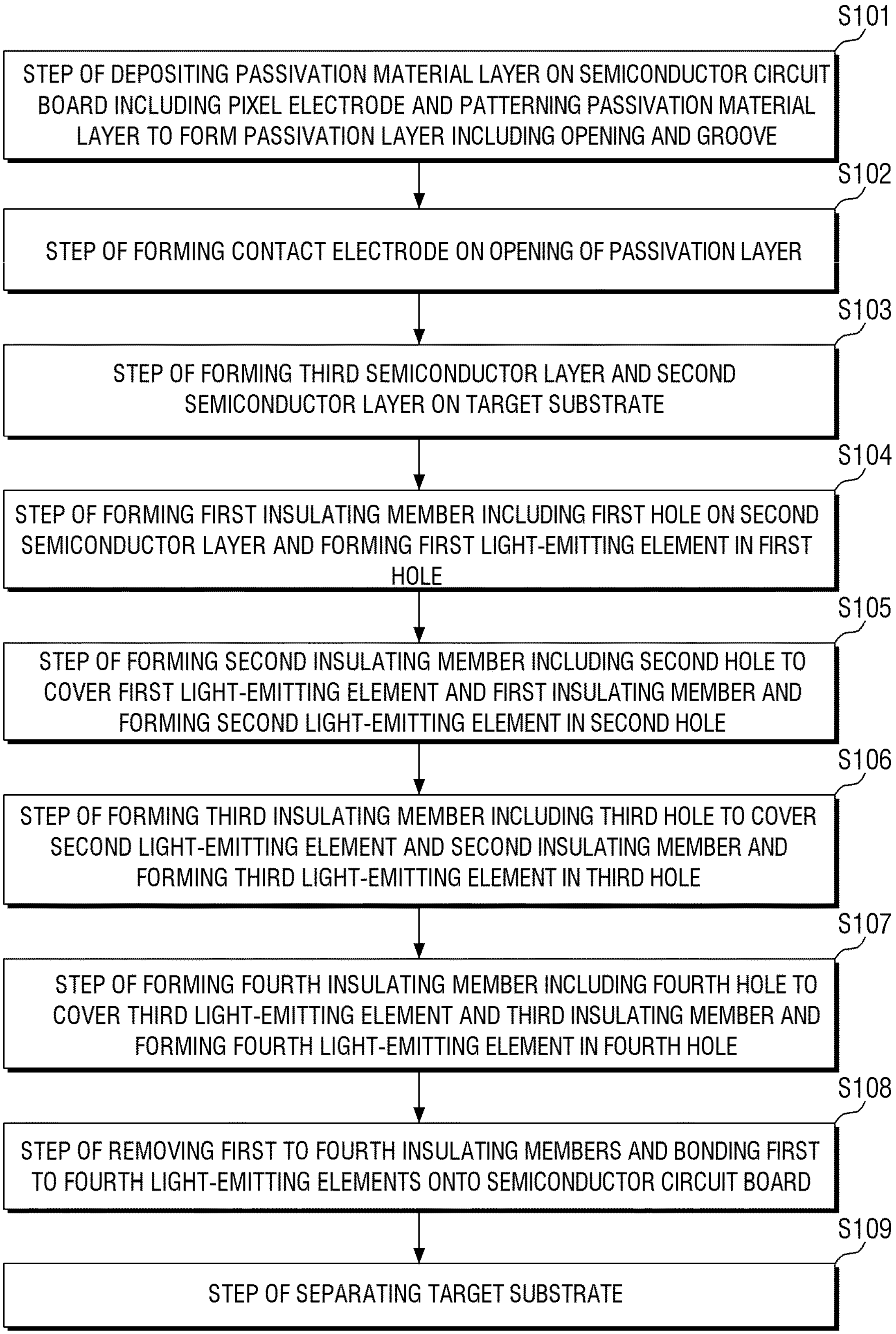
FIG. 30 is a flow chart describing a method for manufacturing a display panel according to one embodiment of the present disclosure.

FIG. 30 is a flow chart describing a method for manufacturing a display panel according to one embodiment of the present disclosure. FIGS. 31 to 49 are cross-sectional views illustrating some steps of a method for manufacturing a display panel according to one embodiment of the present disclosure.

In FIGS. 31 to 49, a structure based on the order of forming the respective layers of the display panel 100 of the display device 10 is shown as a cross-section. In FIGS. 41 to 49, the manufacturing process of the light-emitting element layer 120 and the wavelength conversion member 130 is primarily shown, which may correspond to the cross-sectional view of FIG. 8. Hereinafter, a method for manufacturing the display panel shown in FIGS. 31 to 49 will be described in conjunction with FIG. 30.

Figure 31:
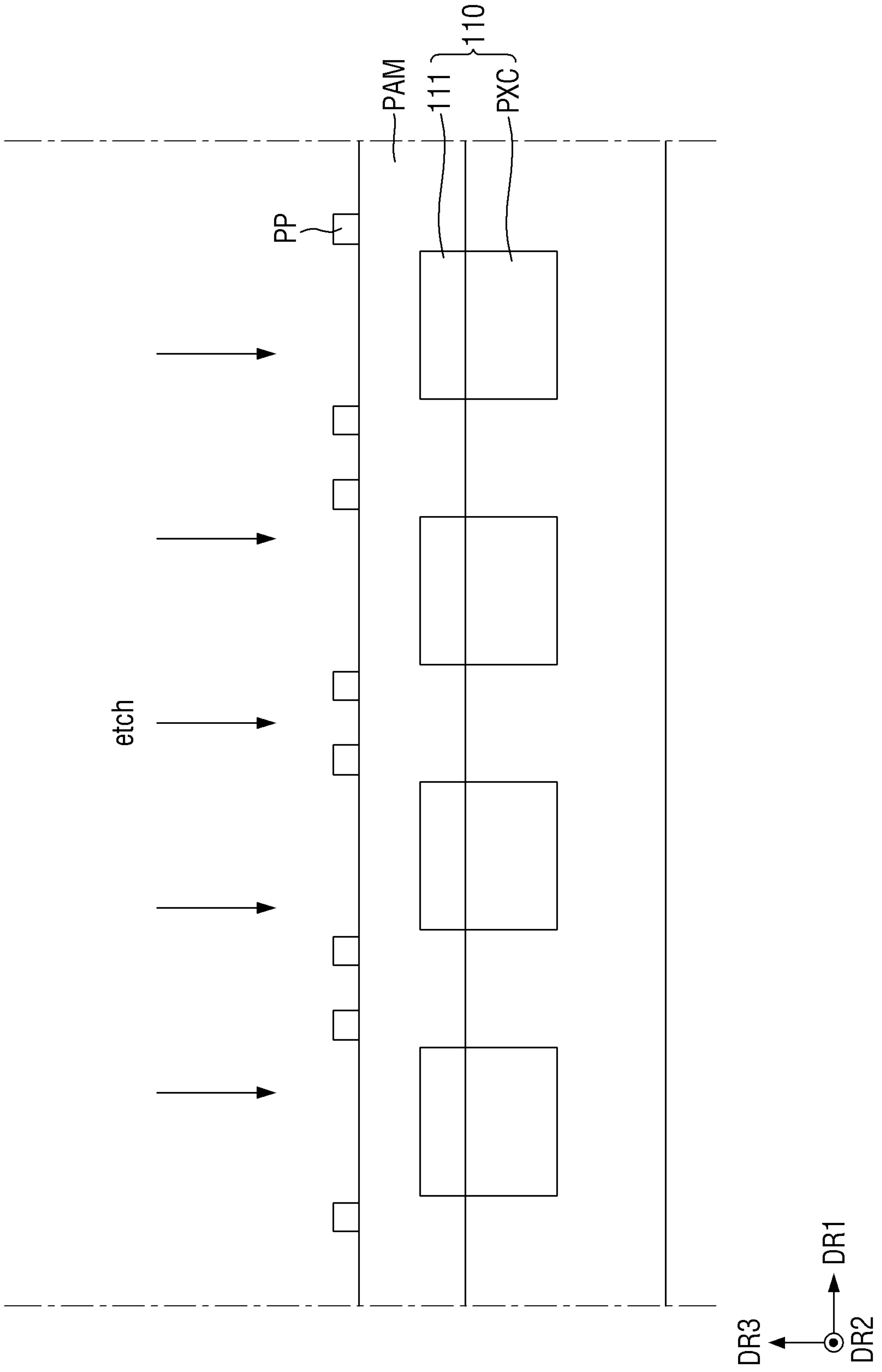
FIGS. 31 to 49 are cross-sectional views illustrating some steps of a method for manufacturing a display panel according to one embodiment of the present disclosure.

Referring to FIGS. 30 and 31, a passivation material layer PAM is deposited on a semiconductor circuit board 110 including a pixel electrode 111 and is patterned to form an opening OP and grooves GR (S101 of FIG. 30).

The pixel electrode 111 is formed on the semiconductor circuit board 110 in which a plurality of pixel circuits PXC are formed. The pixel electrode 111 may be formed in such a manner that a pixel electrode material layer is deposited on the semiconductor circuit board 110 and then patterned by a photolithography method.

Subsequently, the passivation material layer PAM is deposited on the semiconductor circuit board 110 including the pixel electrode 111, and a photoresist pattern PP is formed on the passivation material layer PAM. The photoresist pattern PP is formed to be offset from (e.g., to non-overlap) an area where the opening OP and the groove GR will be formed. Then, the passivation material layer PAM is etched using the photoresist pattern PP as a mask.

Figure 32:
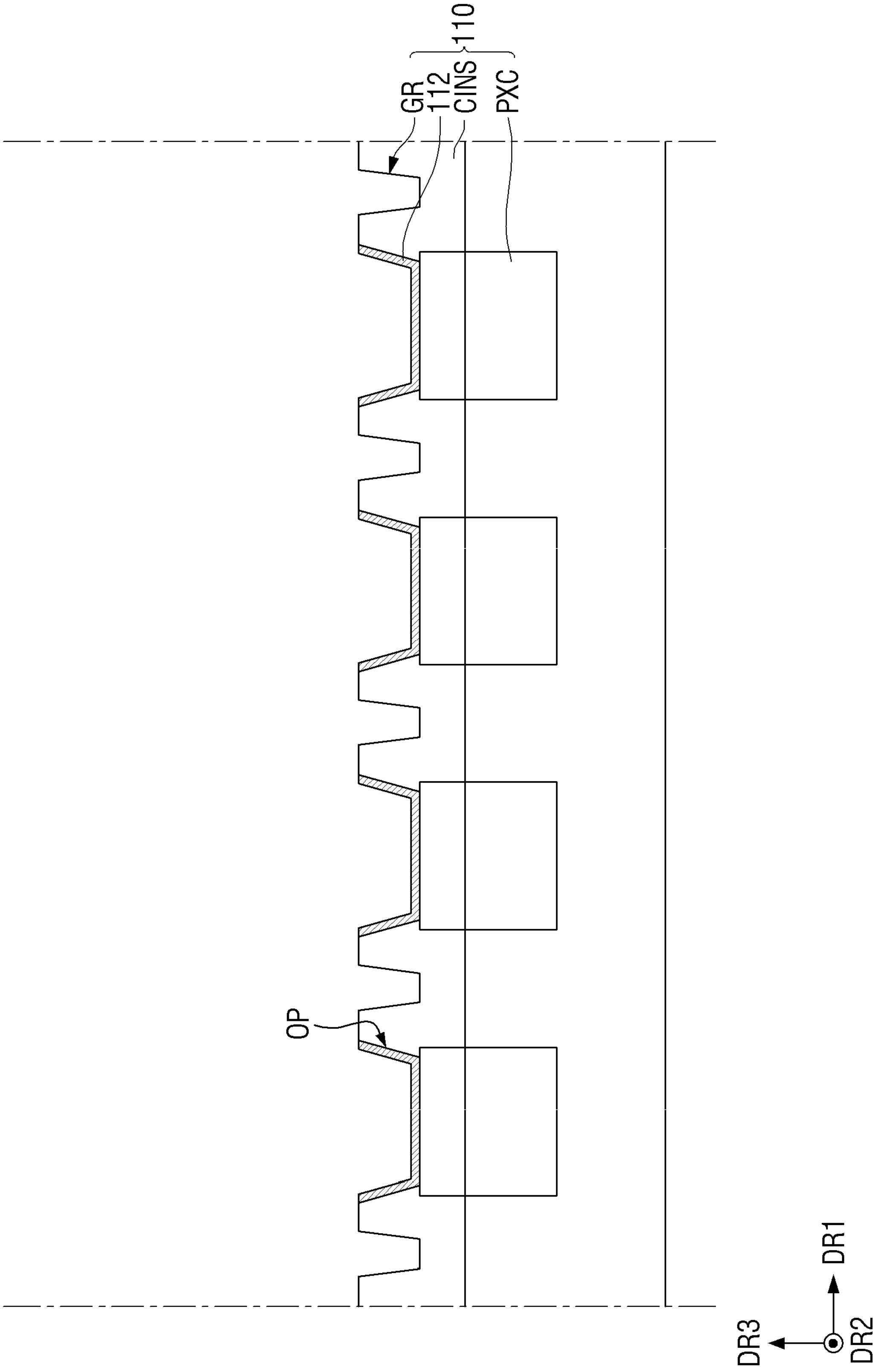

Referring to FIG. 32, the passivation material layer PAM other than the photoresist pattern PP is etched to form an opening OP that overlaps the pixel electrode 111 and a groove GR that is offset from (e.g., that does not overlap) the pixel electrode 111. As a result, a passivation layer CINS, which includes an opening OP and a groove GR, is formed.

Next, a contact electrode 112 is formed on the opening OP in the passivation layer CINS (S102 of FIG. 30).

The contact electrode 112 may be formed in such a manner that a contact electrode material layer is deposited on the semiconductor circuit board 110 and then patterned by the photolithography method. The contact electrode 112 may contact the pixel electrode 111 through the opening OP.

Subsequently, a third semiconductor layer SEM3 and a second semiconductor layer SEM2 are formed on a target substrate TSUB (S103 of FIG. 30).

First, a target substrate TSUB is prepared. The target substrate TSUB may be a sapphire substrate ($Al_2O_3$), but it is not limited thereto. An embodiment in which the target substrate TSUB is a sapphire substrate will be described by way of example.

The third semiconductor layer SEM3 and the second semiconductor layer SEM2 are formed on the target substrate TSUB. The third semiconductor layer SEM3 and the second semiconductor layer SEM2, which are grown by an epitaxial method, may be formed by growing a seed crystal. In such an embodiment, the third semiconductor layer SEM3 and the second semiconductor layer SEM2 may be formed by an electron beam deposition method, a physical vapor deposition (PVD) method, a chemical vapor deposition (CVD) method, a plasma laser deposition (PLD) method, a dual-type thermal evaporation method, sputtering, a metal organic chemical vapor deposition (MOCVD) method, etc. In one embodiment, the third semiconductor layer SEM3 and the second semiconductor layer SEM2 may be formed by the MOCVD method, but they are not limited thereto.

There is no limitation in a precursor material for forming the third semiconductor layer SEM3 and the second semiconductor layer SEM2 within the range that may typically be selected to form a target material. For example, the precursor material may be a metal precursor that includes an alkyl group, such as a methyl group or an ethyl group. For example, the precursor material may be a compound, such as trimethyl gallium ($Ga(CH_3)_3$), trimethyl aluminum ($Al(CH_3)_3$), and triethyl phosphate ($(C_2H_5)_3PO_4$), but it is not limited thereto.

The third semiconductor layer SEM3 is formed on the target substrate TSUB. The third semiconductor layer SEM3 is deposited as a single layer, but it is not limited thereto. The third semiconductor layer SEM3 may be deposited as a plurality of layers. The third semiconductor layer SEM3 may be disposed to reduce a lattice constant difference between the second semiconductor layer SEM2 and the target substrate TSUB. For example, the third semiconductor layer SEM3 may include an undoped semiconductor and may be a material that is not doped with an n-type or p-type dopant. In an embodiment, the third semiconductor layer SEM3 may be at least one of un-doped InAIGaN, GaN, AIGaN, InGaN, AlN or InN, but it is not limited thereto.

The second semiconductor layer SEM2 is formed on the third semiconductor layer SEM3 by the above-described method.

Subsequently, a first insulating member IP1 having a plurality of first holes (e.g., first openings) HO1 is formed on the second semiconductor layer SEM2, and a first light-emitting element LE1 is formed in the first hole HO1 (S104 of FIG. 30).

Figure 33:
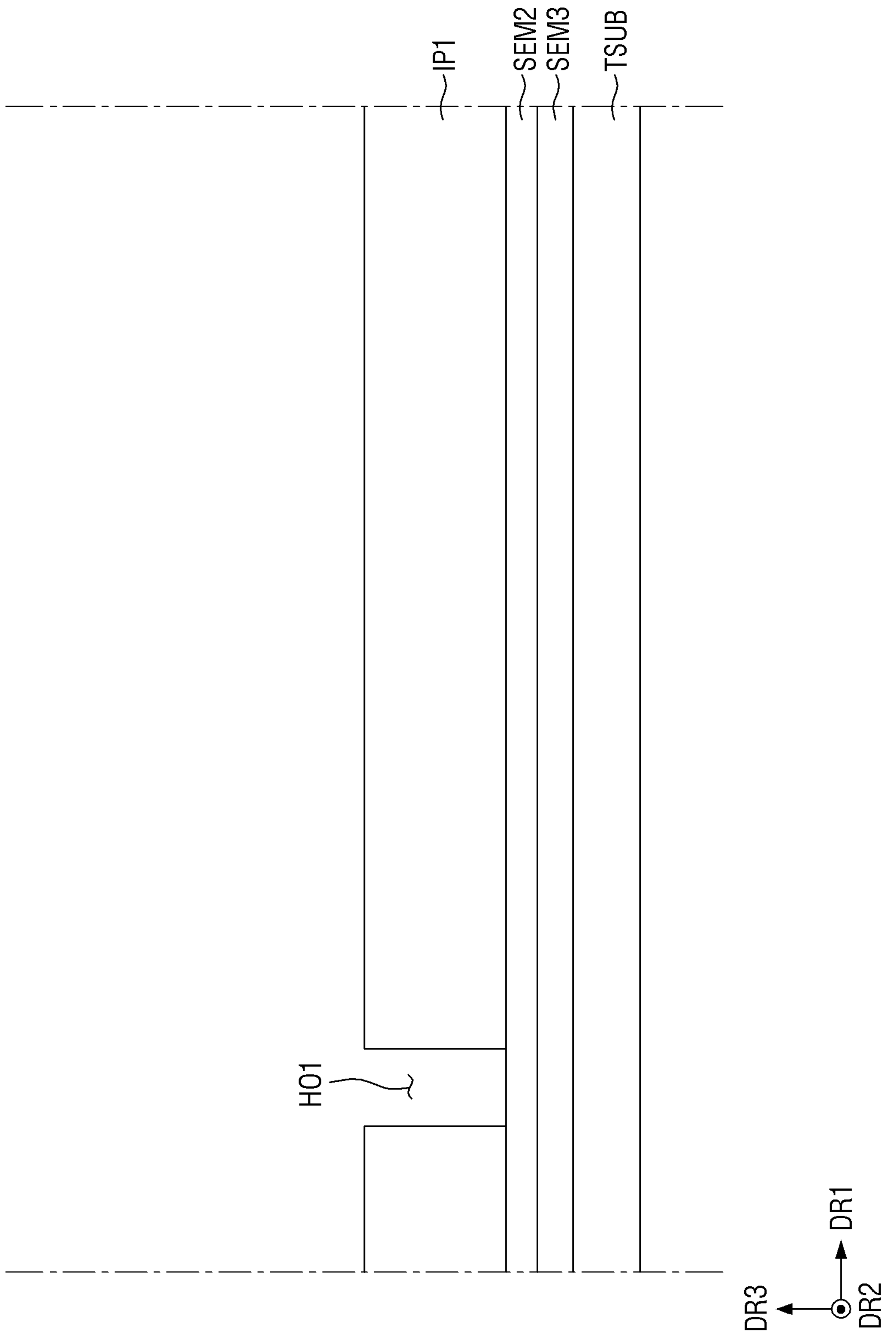

Referring to FIG. 33, an insulating material layer is formed on the second semiconductor layer SEM2 and then patterned by a photolithography method to form the first insulating member IP1 having the plurality of first holes HO1. The insulating material layer may be made of an inorganic insulating material, such as silicon oxide, silicon nitride, and silicon oxynitride.

Figure 34:
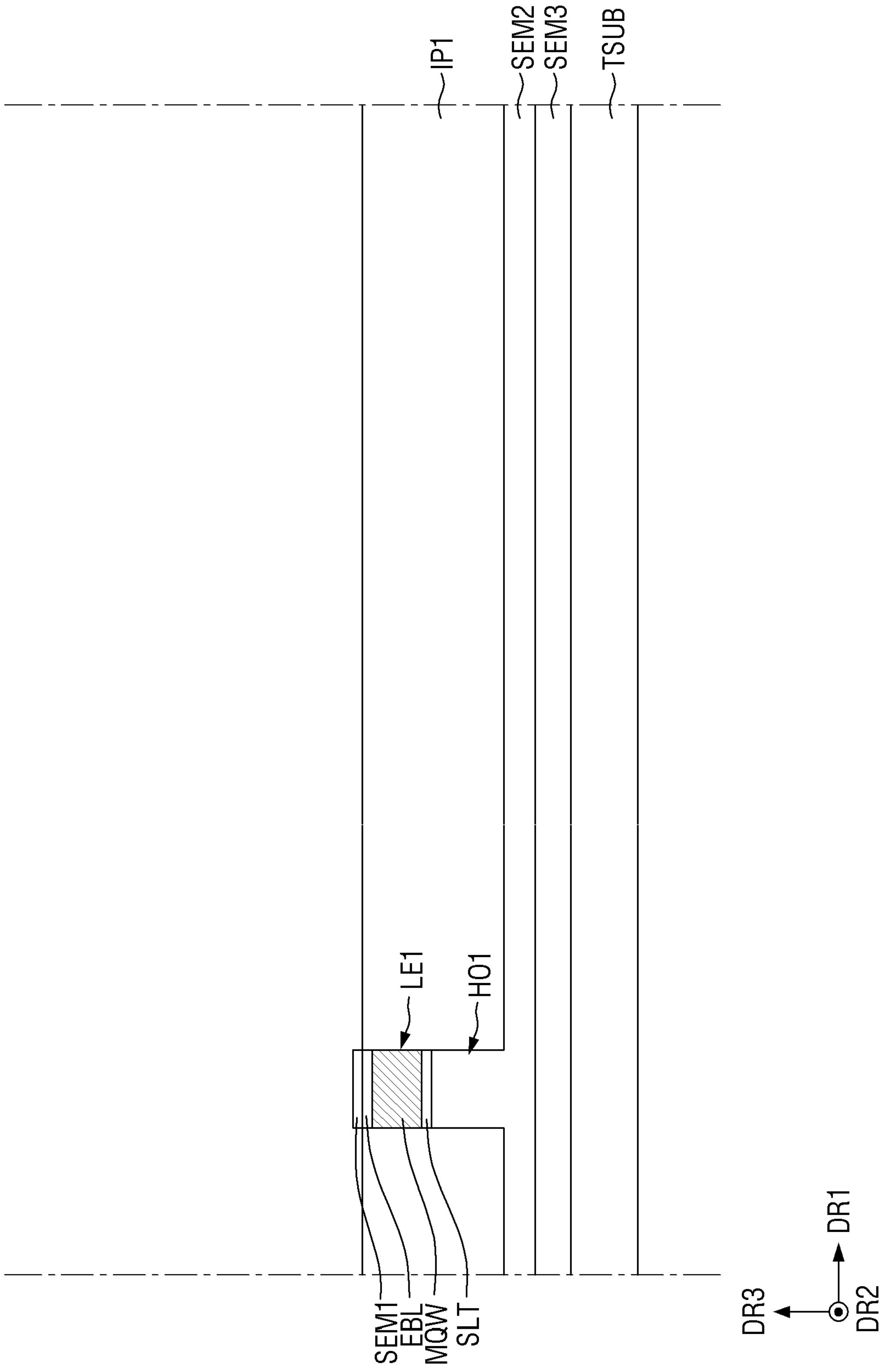

Then, referring to FIG. 34, the second semiconductor layer SEM2, an active layer MQW, and the first semiconductor layer SEM1 are formed in the plurality of first holes HO1 to form the first light-emitting element LE1.

The second semiconductor layer SEM2 is then formed on the target substrate TSUB by the above-described epitaxial method. The second semiconductor layer SEM2 acts as a seed on the second semiconductor layer SEM2 exposed by the first hole HO1, whereby the second semiconductor layer SEM2 is further grown in the plurality of first holes HO1.

Subsequently, a superlattice layer SLT, the active layer MQW, an electron blocking layer EBL, and a first semiconductor layer SEM1 are sequentially formed on the second semiconductor layer SEM2 by using the above-described epitaxial method. In one embodiment, the first semiconductor layer SEM1 may be formed to protrude above an upper surface of the first insulating member IP1, but the present disclosure not limited thereto.

As a result, the first light-emitting element LE1 may be formed in the plurality of first holes HO1. The first light-emitting element LE1 may emit first light of a blue color.

Next, a second insulating member IP2 having a second hole (e.g., a second opening) HO2 is formed to cover the first light-emitting element LE1 and the first insulating member IP1, and a second light-emitting element LE2 is formed in the second hole HO2 (S105 of FIG. 30).

Figure 35:
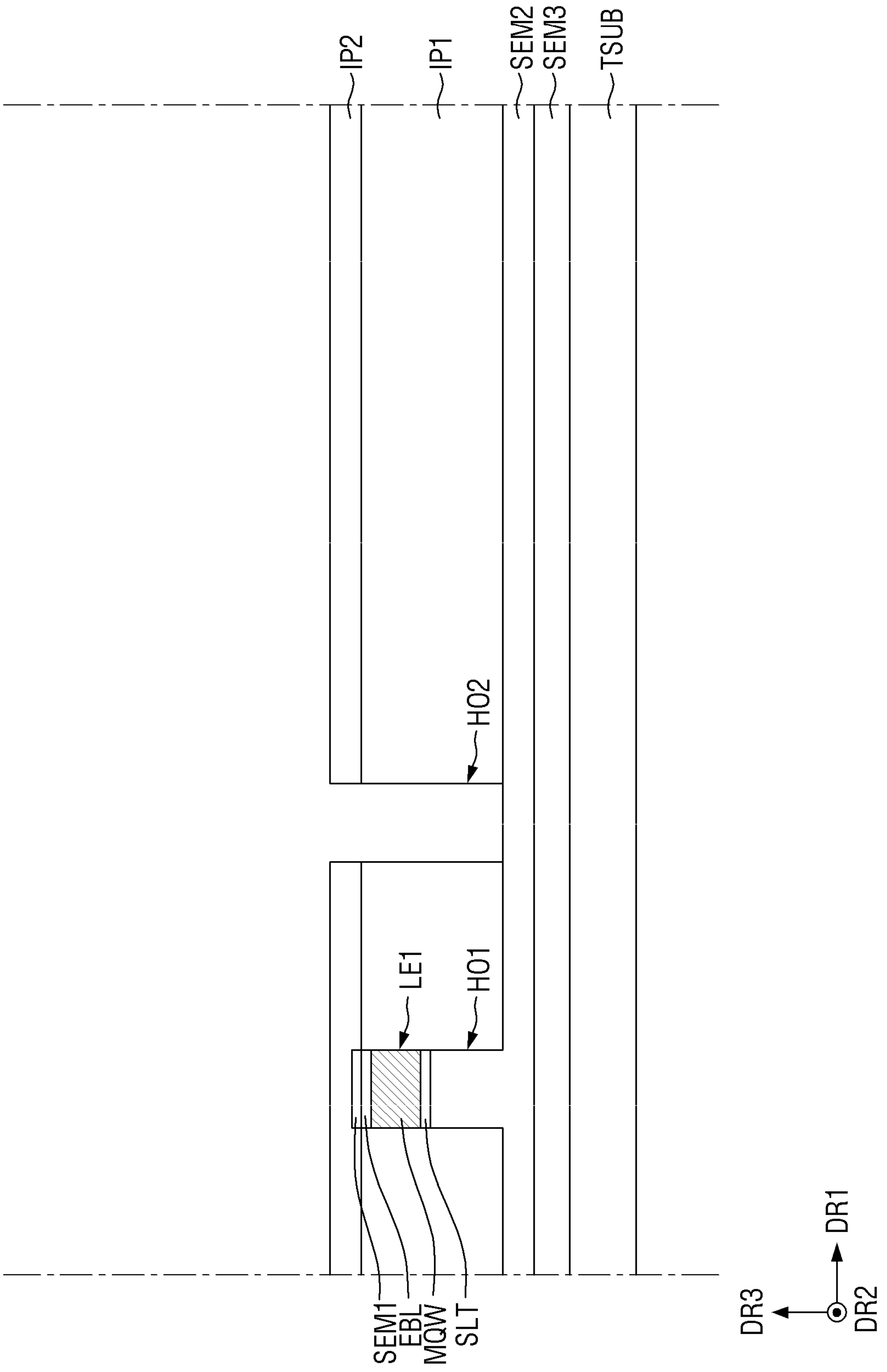

Referring to FIG. 35, an insulating material layer is deposited on the target substrate TSUB, on which the first insulating member IP1 and the first light-emitting element LE1 are formed, to form the second insulating member IP2. The second insulating member IP2 is patterned by a photolithography method to form the second hole HO2. The second insulating member IP2 may be formed of the same material as that of the first insulating member IP1. The second hole HO2 may be formed to be spaced apart from the first hole HO1.

Figure 36:
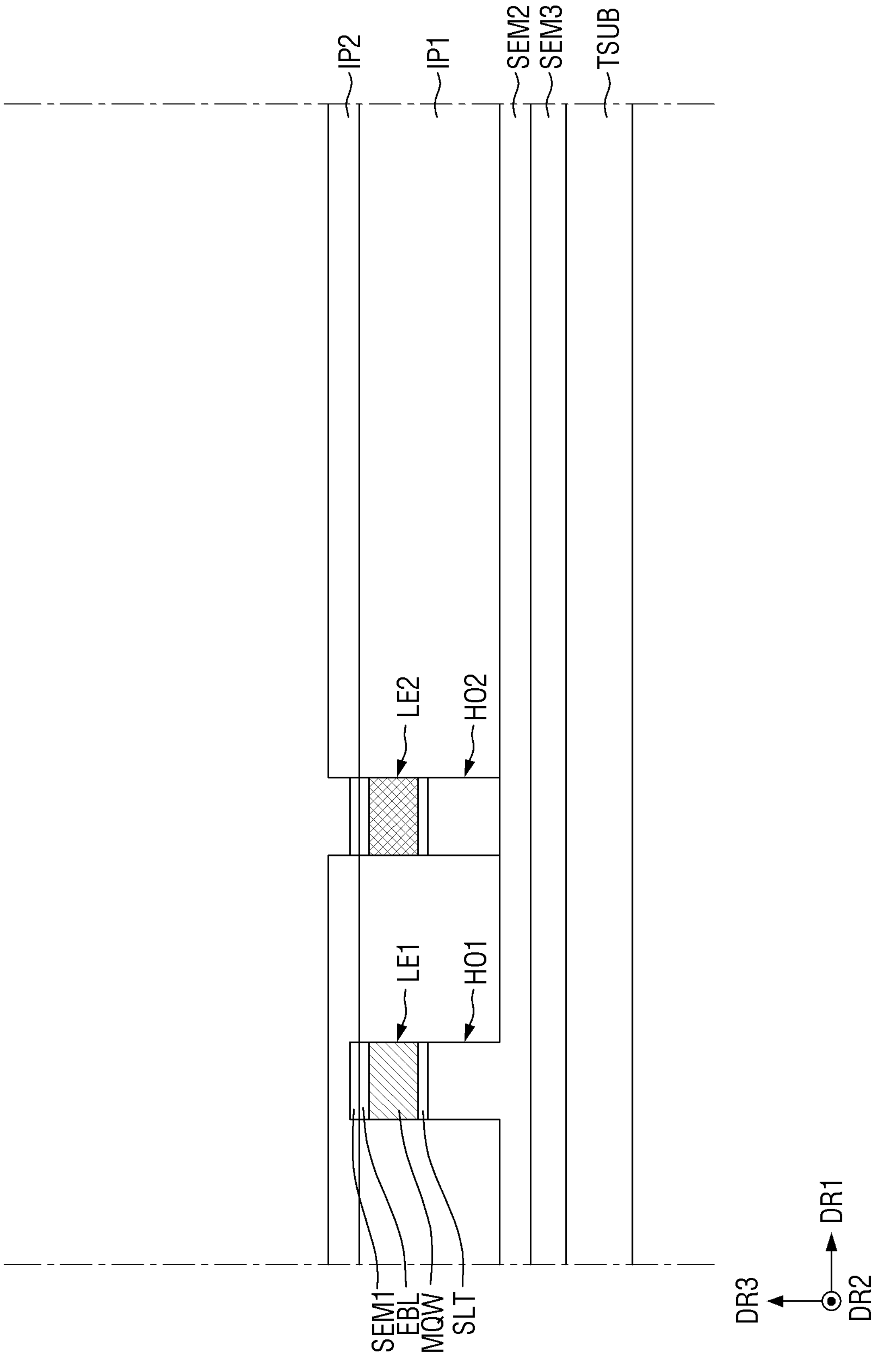

Subsequently, referring to FIG. 36, the second semiconductor layer SEM2, the active layer MQW and the first semiconductor layer SEM1 are formed in the second hole HO2 to form the second light-emitting element LE2.

The second semiconductor layer SEM2 is further formed on the target substrate TSUB by the above-described epitaxial method. The second semiconductor layer SEM2 acts as a seed on the second semiconductor layer SEM2 exposed by the second hole HO2, whereby the second semiconductor layer SEM2 is further grown in the second hole HO2. The second insulating member IP2 is masked on the first light-emitting element LE1 so that additional semiconductor layers are not formed.

Subsequently, the superlattice layer SLT, the active layer MQW, the electron blocking layer EB,L and the first semiconductor layer SEM1 are sequentially formed on the second semiconductor layer SEM2 by using the above-described epitaxial method. As a result, the second light-emitting element LE2 may be formed in the second hole HO2. The second semiconductor layer SEM2 and the third semiconductor layer SEM3 are formed as common layers in the first light-emitting element LE1 and the second light-emitting element LE2. The active layer MQW of the second light-emitting element LE2 may be formed of a material different from that of the first light-emitting element LE1 to emit light of a color different from that of the first light-emitting element LE1. For example, the second light-emitting element LE2 may emit second light of a green color.

Next, a third insulating member IP3 having a third hole (e.g., a third opening) HO3 is formed to cover the first light-emitting element LE1, the second light-emitting element LE2, and the second insulating member IP2, and a third light-emitting element LE3 is formed in the third hole HO3 (S106 of FIG. 30).

Figure 37:
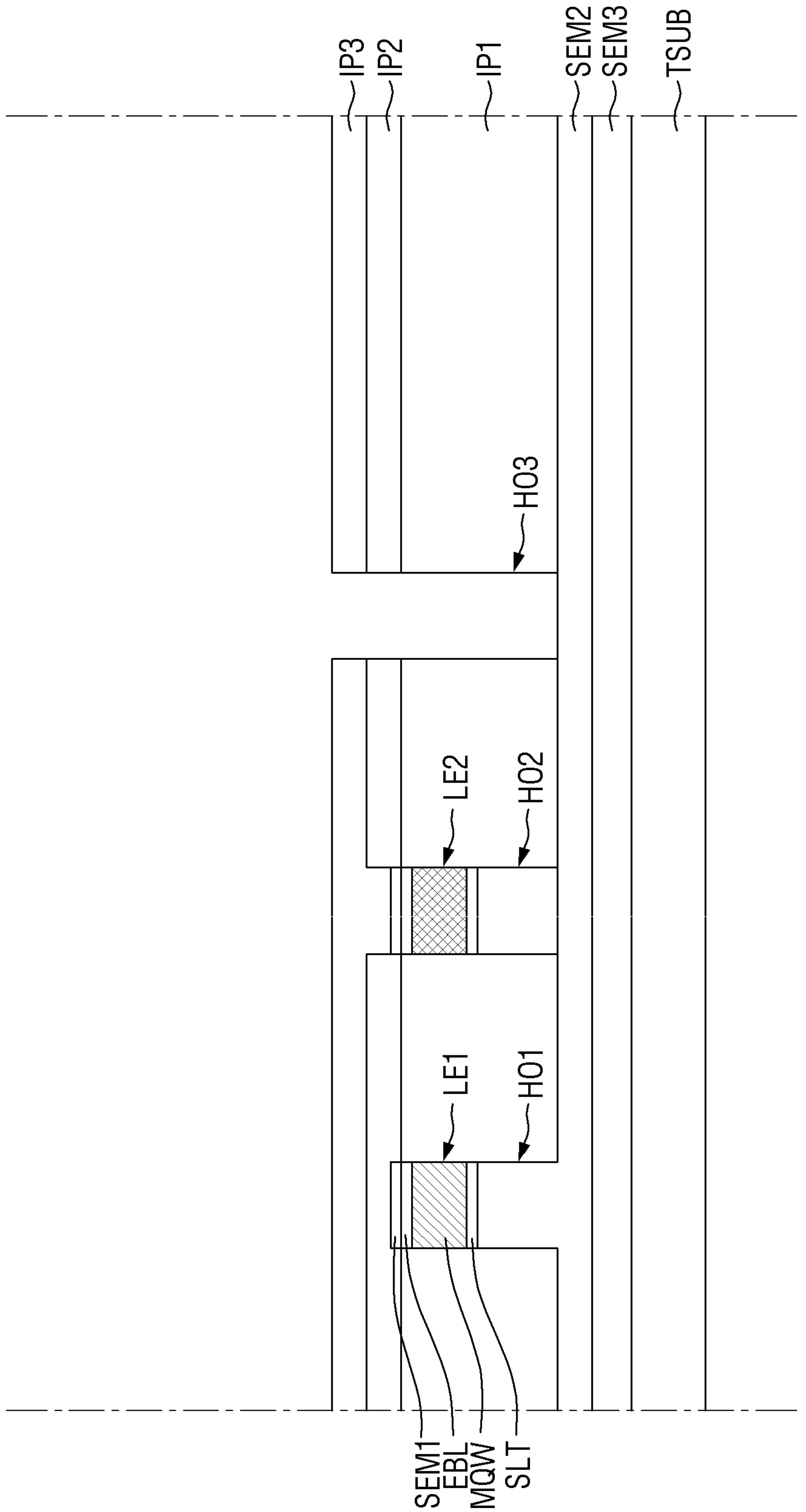

Referring to FIG. 37, an insulating material layer is deposited on the target substrate TSUB, on which the second light-emitting element LE2 and the second insulating member IP2 are formed, to form a third insulating member IP3. The third insulating member IP3 is patterned by a photolithography method to form the third hole HO3. The third insulating member IP3 may be formed of the same material as that of the first insulating member IP1. The third hole HO3 may be formed to be spaced apart from the first hole HO1 and the second hole HO2.

Figure 38:
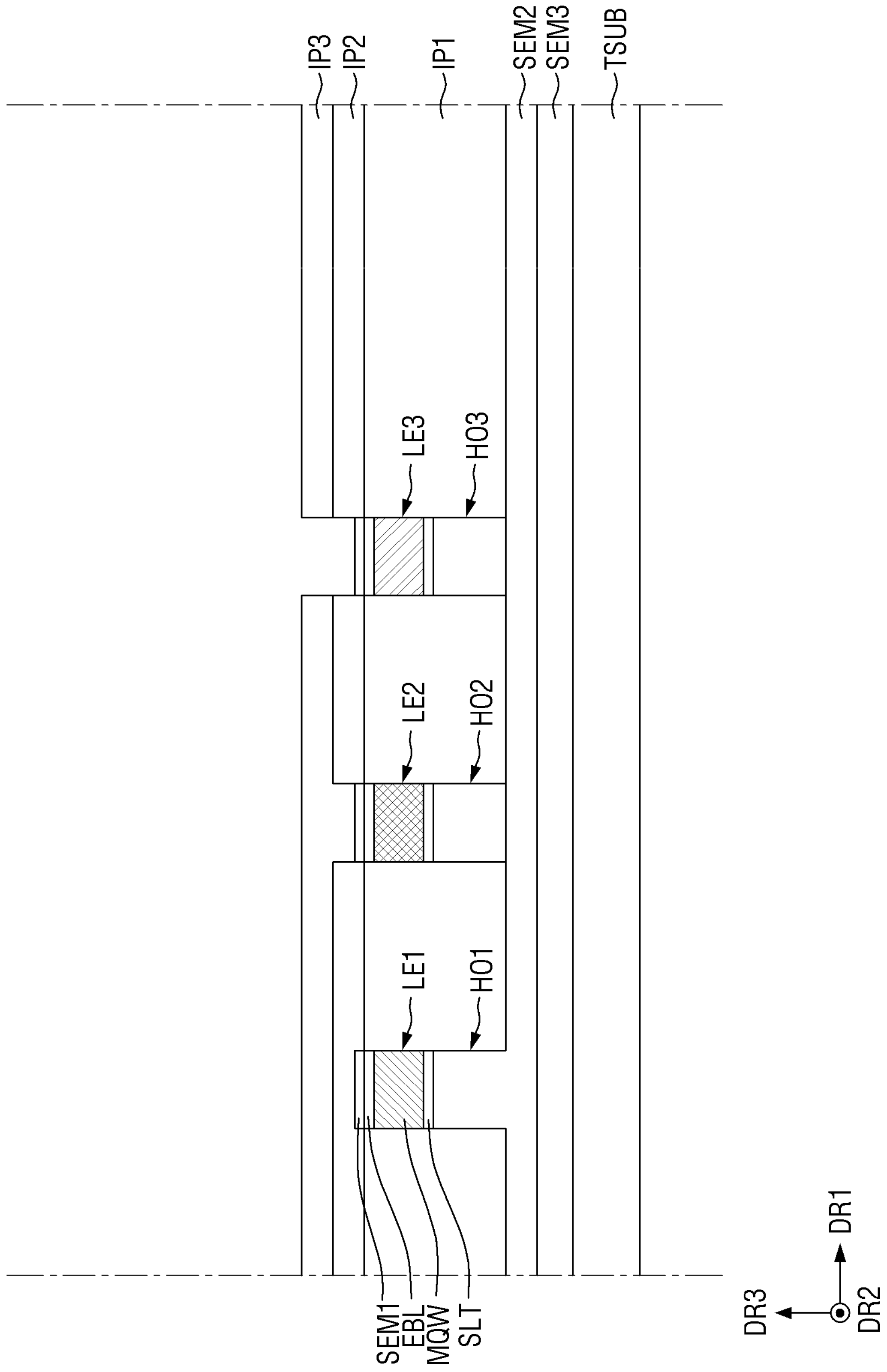

Subsequently, referring to FIG. 38, the second semiconductor layer SEM2, the active layer MQW, and the first semiconductor layer SEM1 are formed in the third hole HO3 to form the third light-emitting element LE3.

The second semiconductor layer SEM2 is further formed on the target substrate TSUB by the above-described epitaxial method. The second semiconductor layer SEM2 acts as a seed on the second semiconductor layer SEM2 exposed by the third hole HO3, whereby the second semiconductor layer SEM2 is further grown in the third hole HO3. The third insulating member IP3 is masked on the second light-emitting element LE2 so that additional semiconductor layers are not formed.

Subsequently, the superlattice layer SLT, the active layer MQW, the electron blocking layer EBL, and the first semiconductor layer SEM1 are sequentially formed on the second semiconductor layer SEM2 by using the above-described epitaxial method. As a result, the third light-emitting element LE3 may be formed in the third hole HO3. The second semiconductor layer SEM2 and the third semiconductor layer SEM3 are formed as common layers in the first light-emitting element LE1, the second light-emitting element LE2 and the third light-emitting element LE3. The active layer MQW of the third light-emitting element LE3 may be formed of a material different from that of each of the first light-emitting element LE1 and the second light-emitting element LE2 to emit light of a color different from those of the first light-emitting element LE1 and the second light-emitting element LE2. For example, the third light-emitting element LE3 may emit third light of a red color.

Next, a fourth insulating member IP4 having a fourth hole (e.g., a fourth opening) HO4 is formed to cover the third light-emitting element LE3 and the third insulating member IP3, and a fourth light-emitting element LE4 is formed in the fourth hole HO4. (S107 of FIG. 30)

Figure 39:
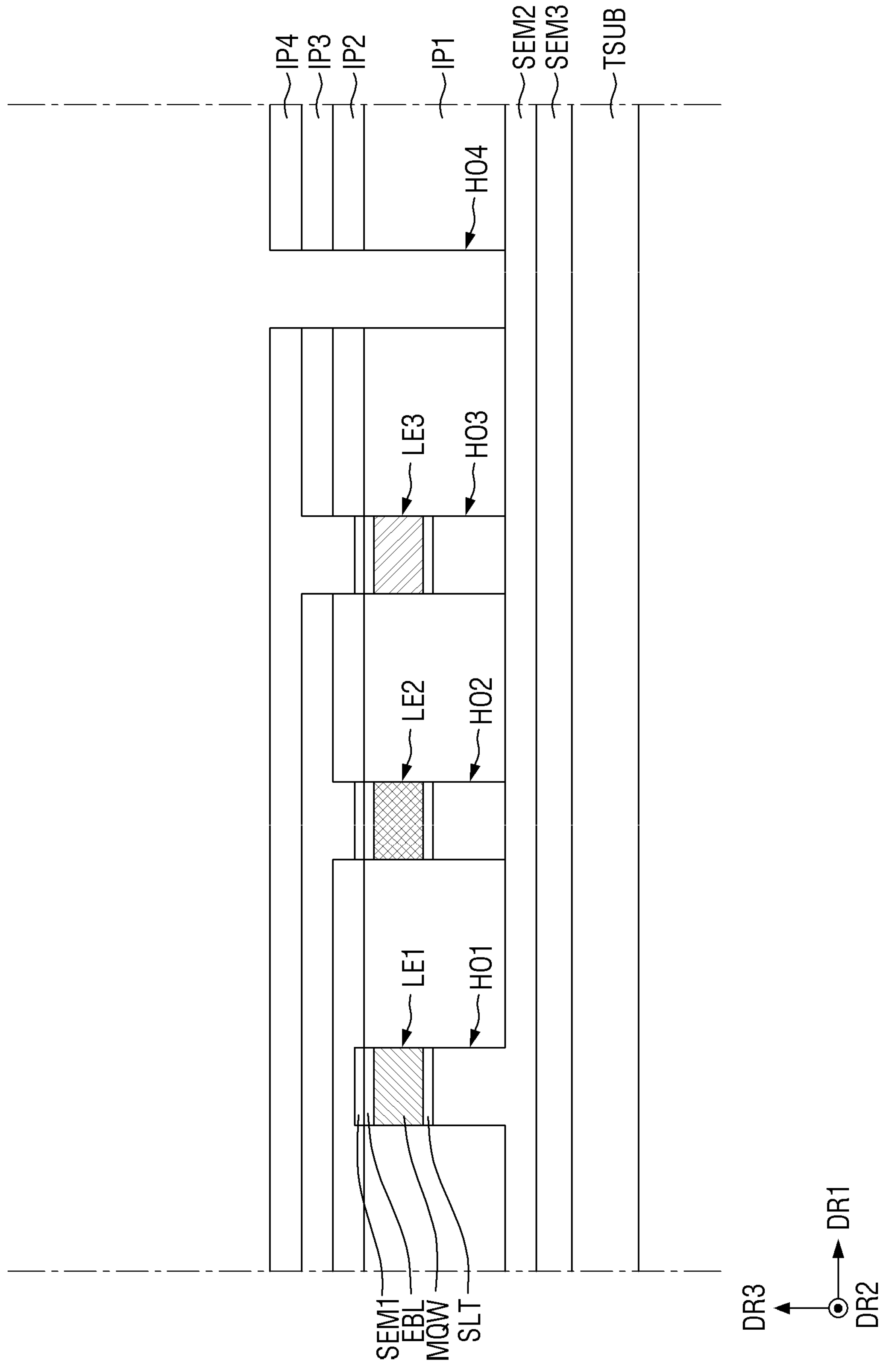

Referring to FIG. 39, an insulating material layer is deposited on the target substrate TSUB, on which the third light-emitting element LE3 and the third insulating member IP3 are formed, to form the fourth insulating member IP4. The fourth insulating member IP4 is patterned by a photolithography method to form the fourth hole HO4. The fourth insulating member IP4 may be formed of the same material as that of the first insulating member IP1. The fourth hole HO4 may be formed to be spaced apart from the first hole HO1, the second hole HO2, and the third hole HO3.

Figure 40:
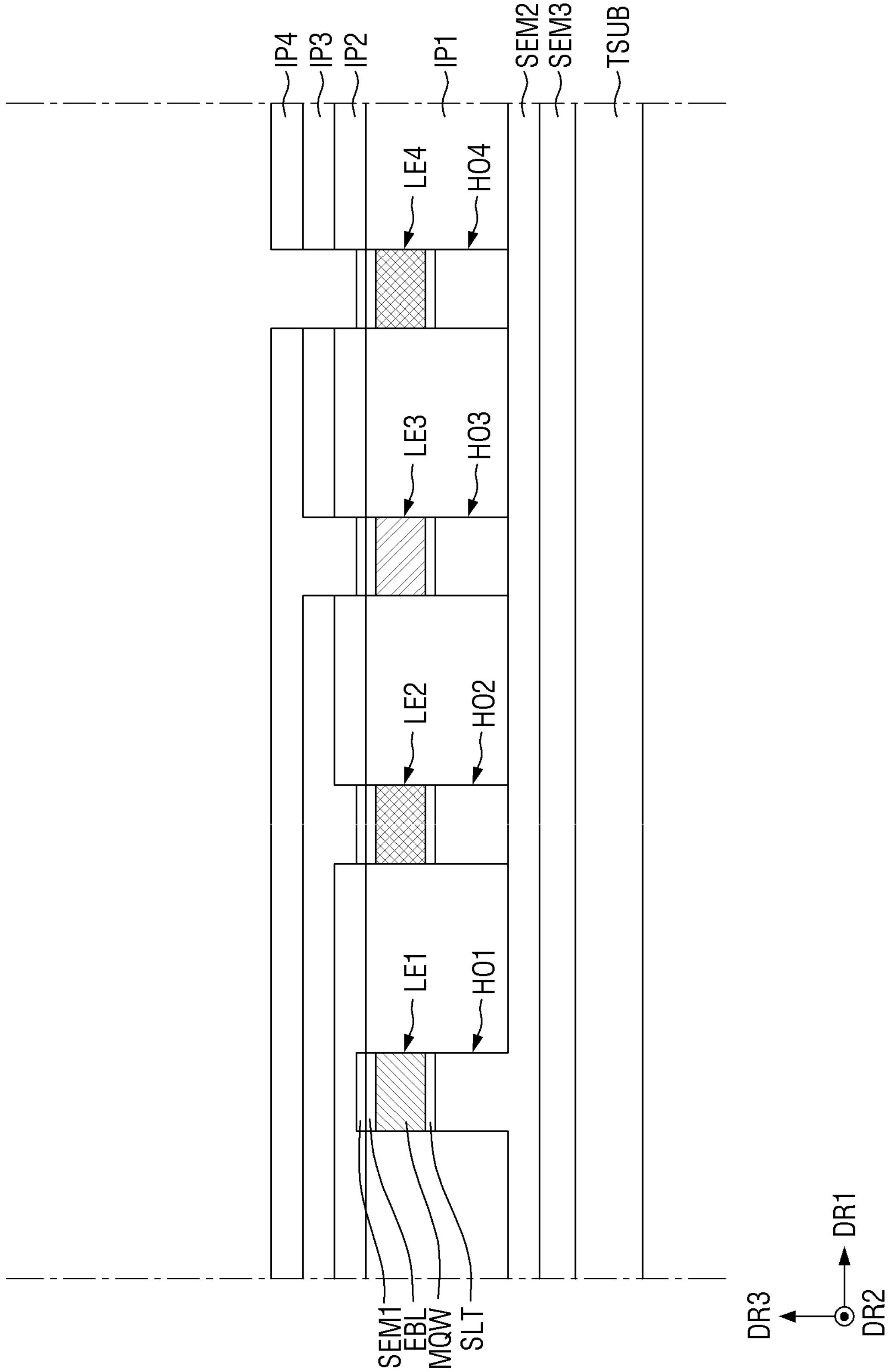

Subsequently, referring to FIG. 40, the second semiconductor layer SEM2, the active layer MQW, and the first semiconductor layer SEM1 are formed in the fourth hole HO4 to form the fourth light-emitting element LE4.

The second semiconductor layer SEM2 is further formed on the target substrate TSUB by the above-described epitaxial method. The second semiconductor layer SEM2 acts as a seed on the second semiconductor layer SEM2 exposed by the fourth hole HO4, whereby the second semiconductor layer SEM2 is further grown in the fourth hole HO4. The fourth insulating member IP4 is masked on the third light-emitting element LE3 so that additional semiconductor layers are not formed.

Subsequently, the superlattice layer SLT, the active layer MQW, the electron blocking layer EBL, and the first semiconductor layer SEM1 are sequentially formed on the second semiconductor layer SEM2 by using the above-described epitaxial method. As a result, the fourth light-emitting element LE4 may be formed in the fourth hole HO4. The second semiconductor layer SEM2 and the third semiconductor layer SEM3 are formed as common layers in the first light-emitting element LE1, the second light-emitting element LE2, the third light-emitting element LE3, and the fourth light-emitting element LE4. The active layer MQW of the fourth light-emitting element LE4 may be formed of the same material as that of the second light-emitting element LE2 to emit light of the same color as that of the second light-emitting element LE2. For example, the fourth light-emitting element LE4 may emit second light of a green color.

Next, the first insulating member IP1, the second insulating member IP2, the third insulating member IP3, and the fourth insulating member IP4 are removed, and the first to fourth light-emitting elements LE1, LE2, LE3 and LE4 are bonded onto the semiconductor circuit board 110 (S108 of FIG. 30).

Figure 41:
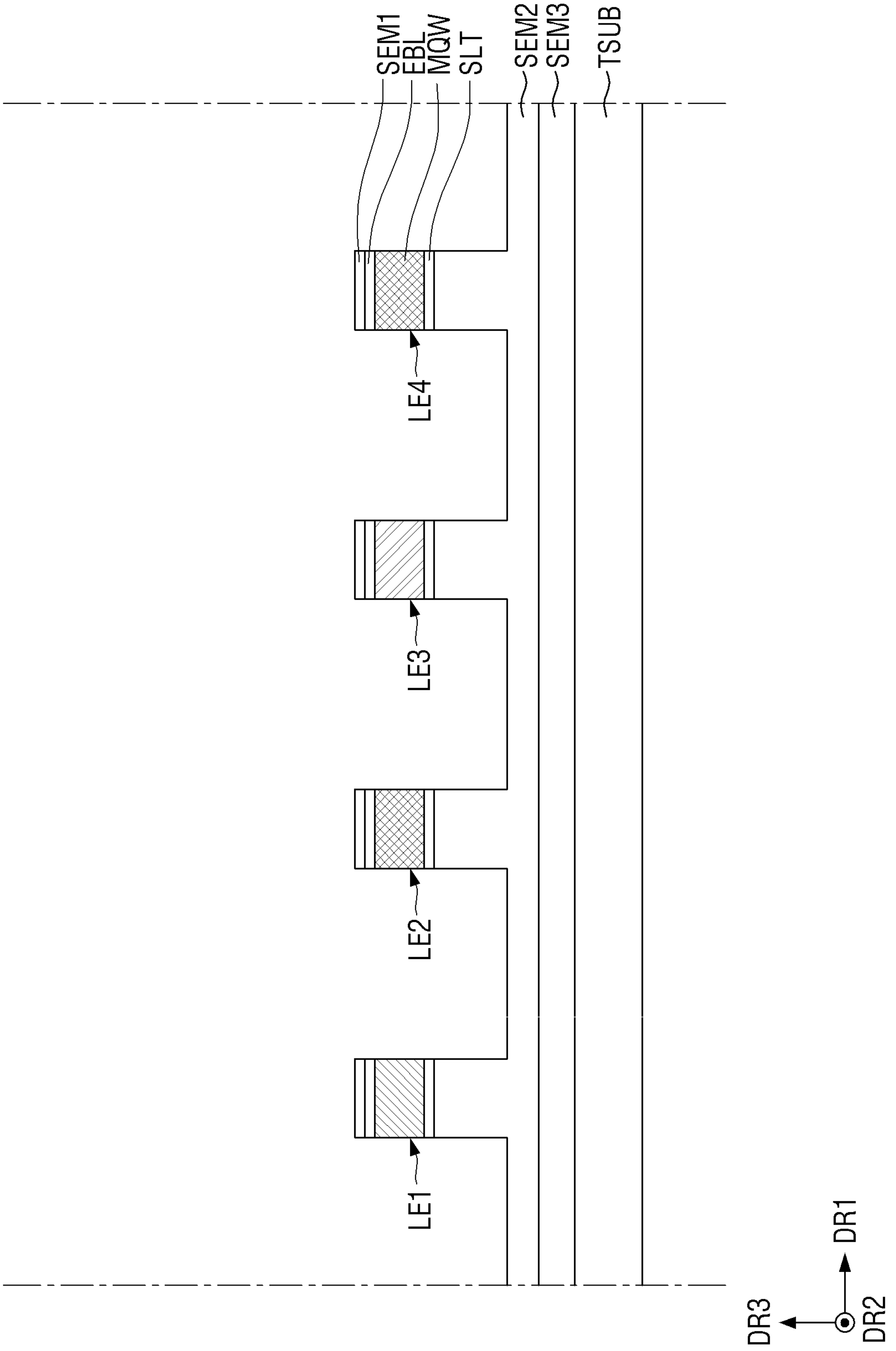

Referring to FIG. 41, the first insulating member IP1, the second insulating member IP2, the third insulating member IP3, and the fourth insulating member IP4 are etched and then all removed to form the first light-emitting element LE1, the second light-emitting element LE2, the third light-emitting element LE3, and the fourth light-emitting element LE4 on the target substrate TSUB.

Figure 42:
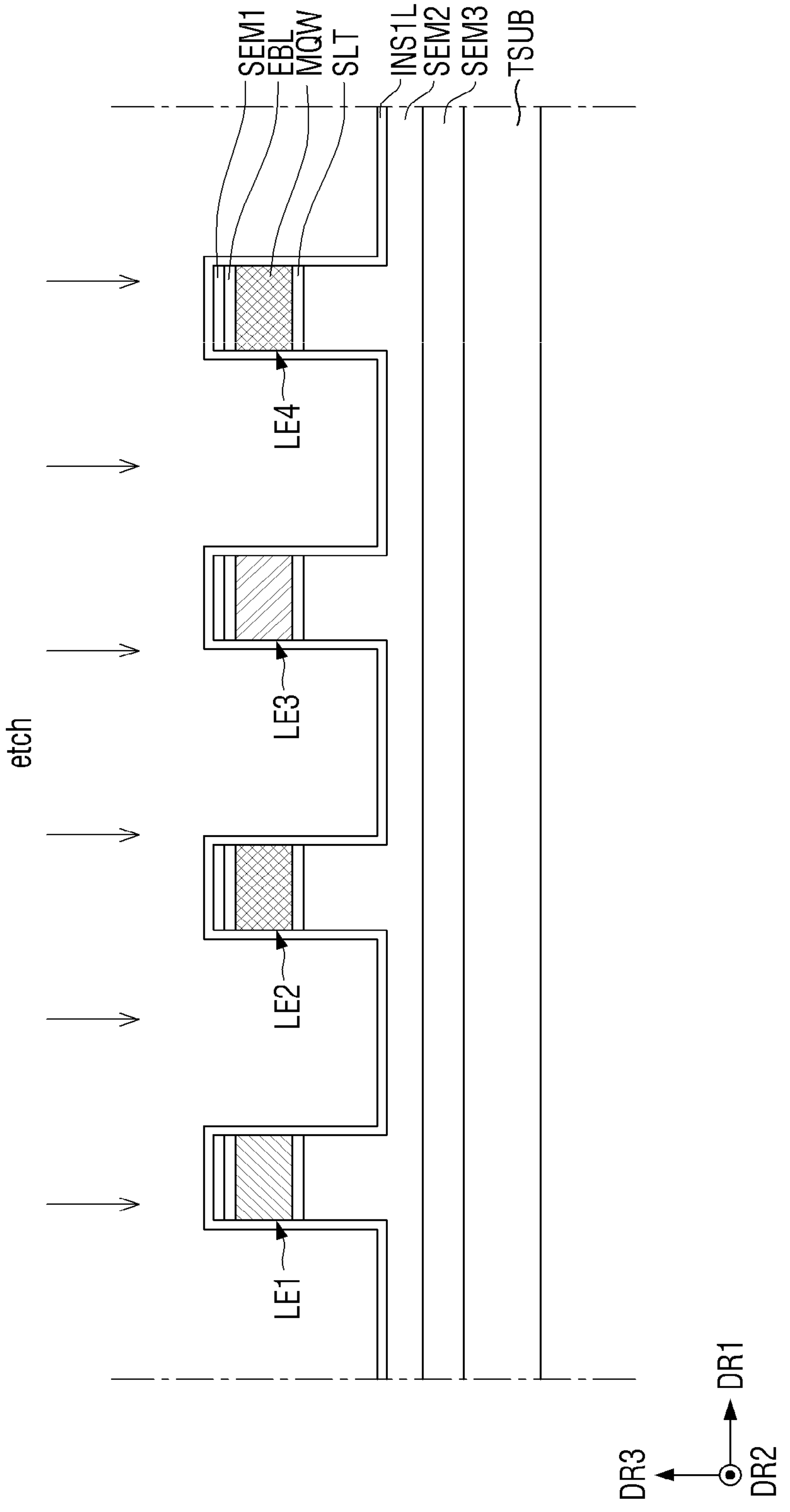
Figure 43:
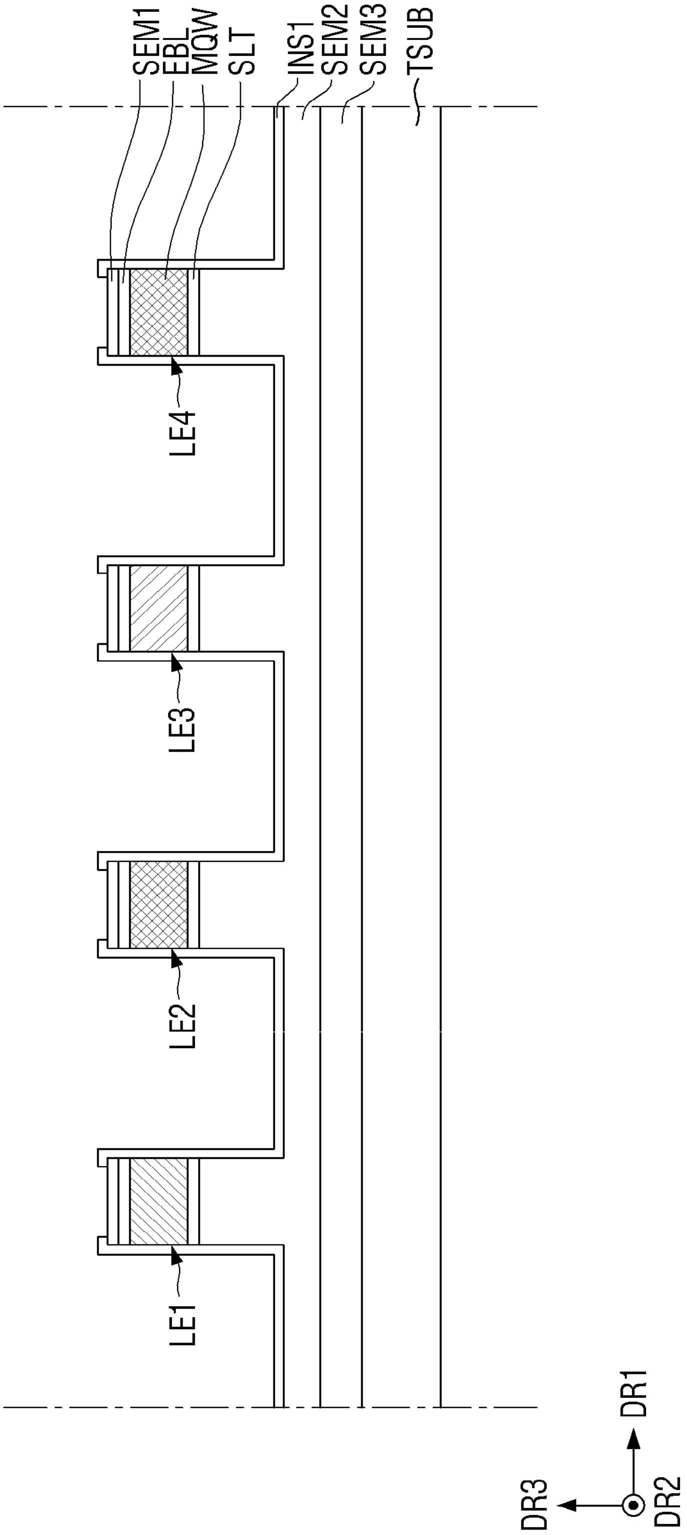

Subsequently, referring to FIGS. 42 and 43, a first insulating layer INS1 is formed on the target substrate TSUB including on the plurality of light-emitting elements LE1, LE2, LE3, and LE4.

For example, a first insulating material layer INS1L is formed on the target substrate TSUB. The first insulating material layer INS1L may completely cover the plurality of light-emitting elements LE1, LE2, LE3, and LE4. The first insulating material layer INS1L may be formed in such a manner that an insulating material is coated on or dipped in the target substrate TSUB. For example, the first insulating material layer INS1L may be formed by an atomic layer deposition (ALD) method.

Subsequently, the first insulating material layer INS1L is partially etched and removed to expose the upper surface of the first semiconductor layer SEM1 disposed on the upper surfaces of the plurality of light-emitting elements LE1, LE2, LE3, and LE4, whereby the first insulating layer INS1 is formed. The first insulating material layer INS1L may be removed by the above-described etching method.

Figure 44:
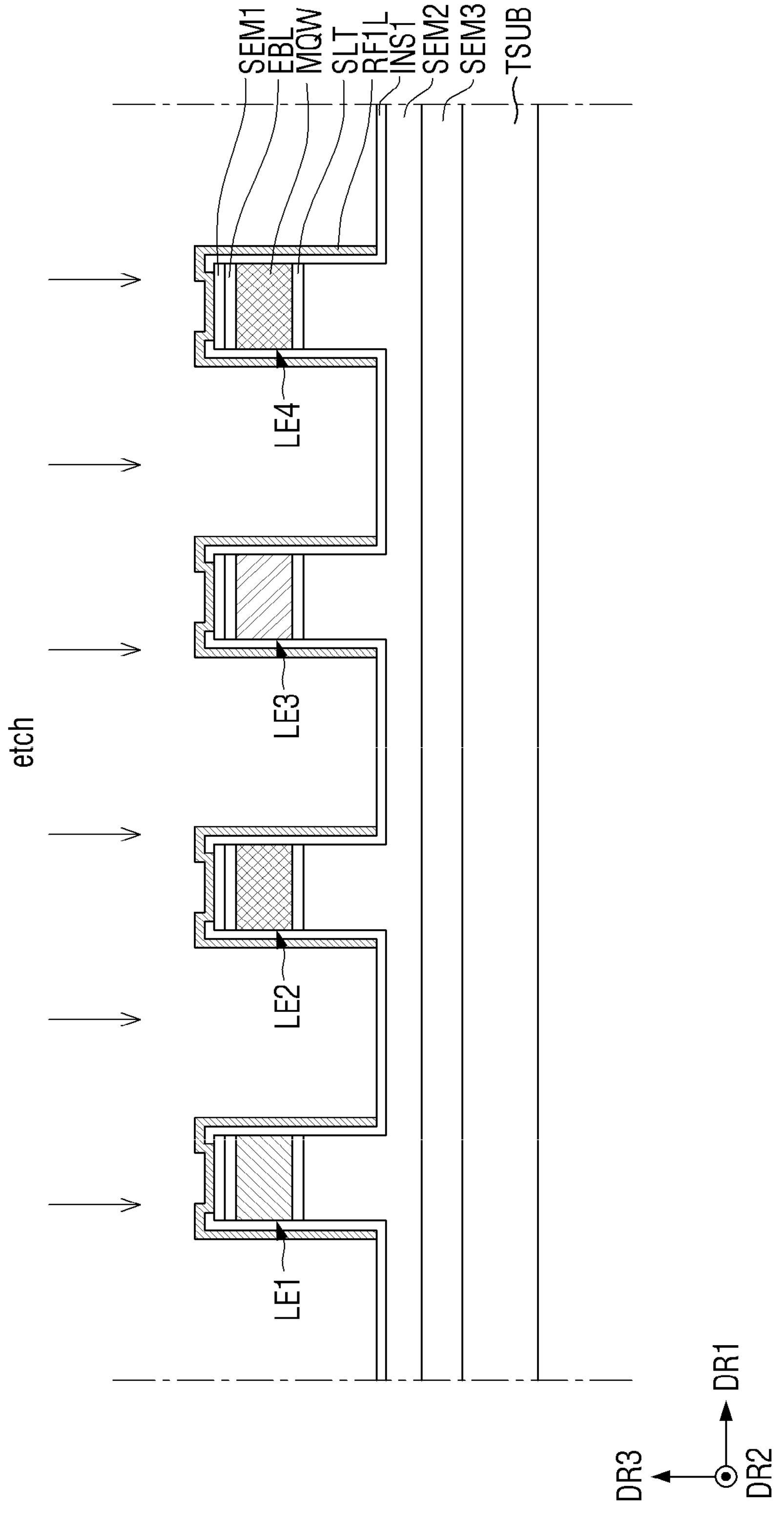
Figure 45:
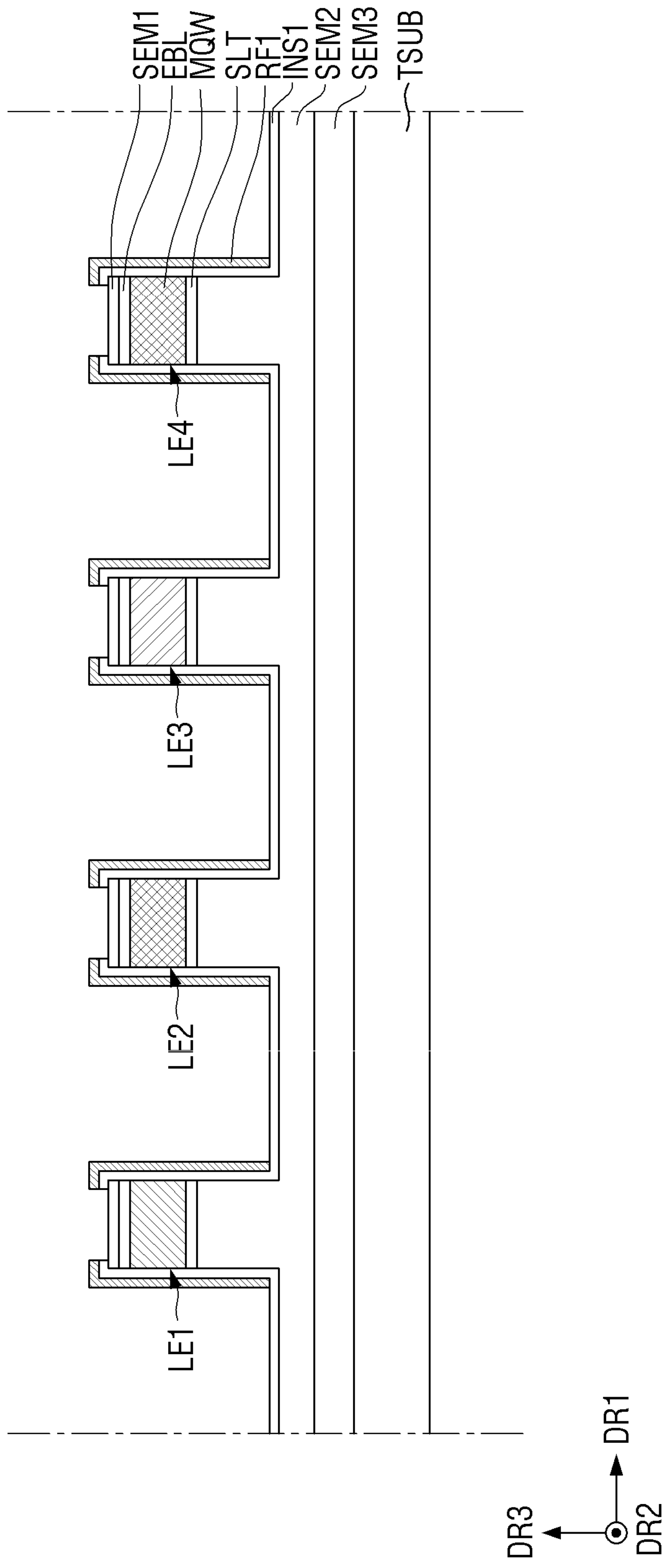

Then, referring to FIGS. 44 and 45, a first reflective layer RF1 is formed on the first insulating layer INS1.

For example, a first reflective material layer RF1L is formed on the target substrate TSUB on which the first insulating layer INS1 is formed. The first reflective material layer RF1L may include a metal having high reflectance, such as aluminum (Al). The first reflective material layer RF1L may be formed by the metal deposition method, such as sputtering. The first reflective material layer RF1L may be deposited entirely on the first insulating layer INS1 and the plurality of light-emitting elements LE1, LE2, LE3, and LE4.

Next, the first reflective material layer RF1L is etched to form the first reflective layer RF1. The first reflective layer RF1 may be disposed on a side and an upper surface of the first insulating layer INS1 disposed on sides and upper surfaces of the plurality of light-emitting elements LE. Also, the first reflective layer RF1 may be spaced apart from another first reflective layer between the light-emitting elements LE1, LE2, LE3, and LE4 adjacent to one another.

Figure 46:
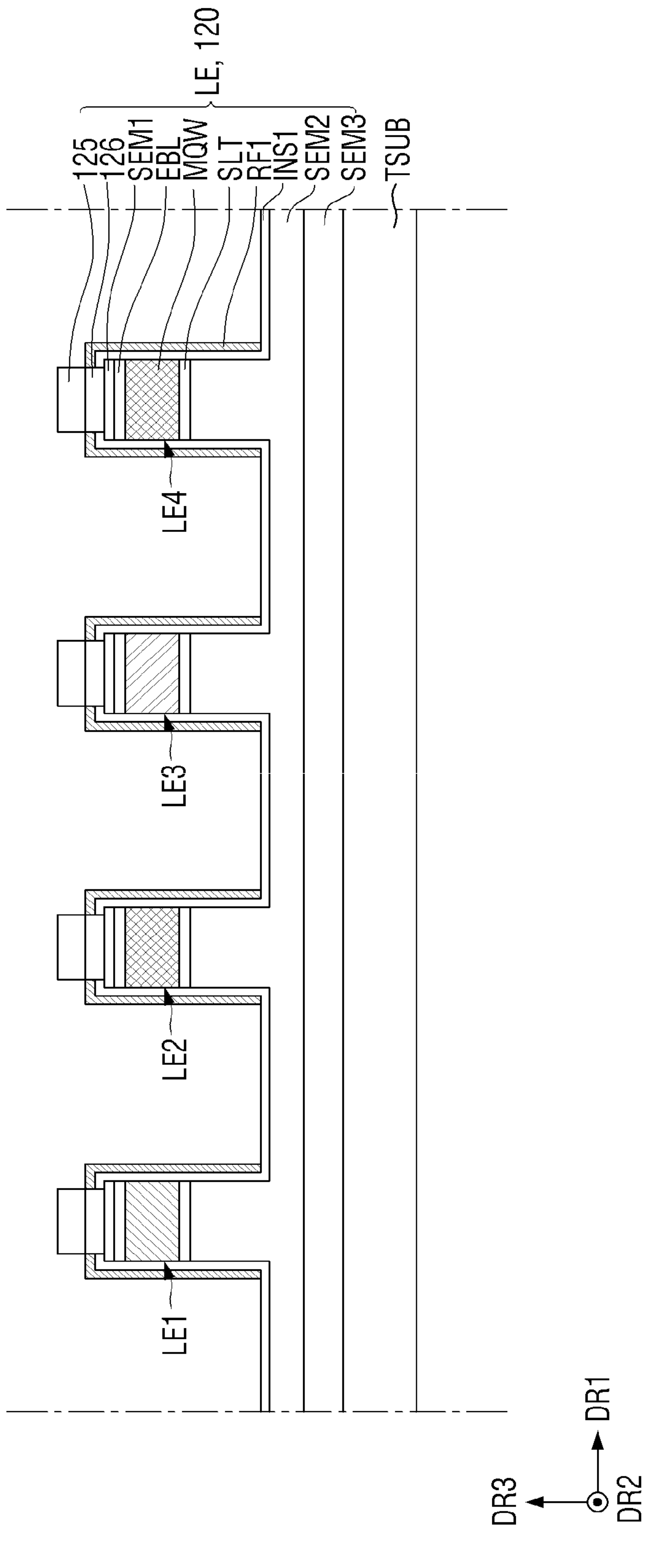

Referring to FIG. 46, ohmic contact layers 126 and connection electrodes 125 are formed on the plurality of light-emitting elements LE.

For example, electrode material layers are sequentially deposited on the target substrate TSUB and then etched to form the ohmic contact layers 126 and the connection electrodes 125 on the plurality of light-emitting elements LE1, LE2, LE3, and LE4 exposed by the first insulating layer INS1. The ohmic contact layers 126 may be formed directly on the upper surface of the first semiconductor layer SEM1 of each of the light-emitting elements LE1, LE2, LE3, and LE4. The connection electrodes 125 may be formed on the uppermost portion of each of the light-emitting elements LE1, LE2, LE3, and LE4.

Figure 47:
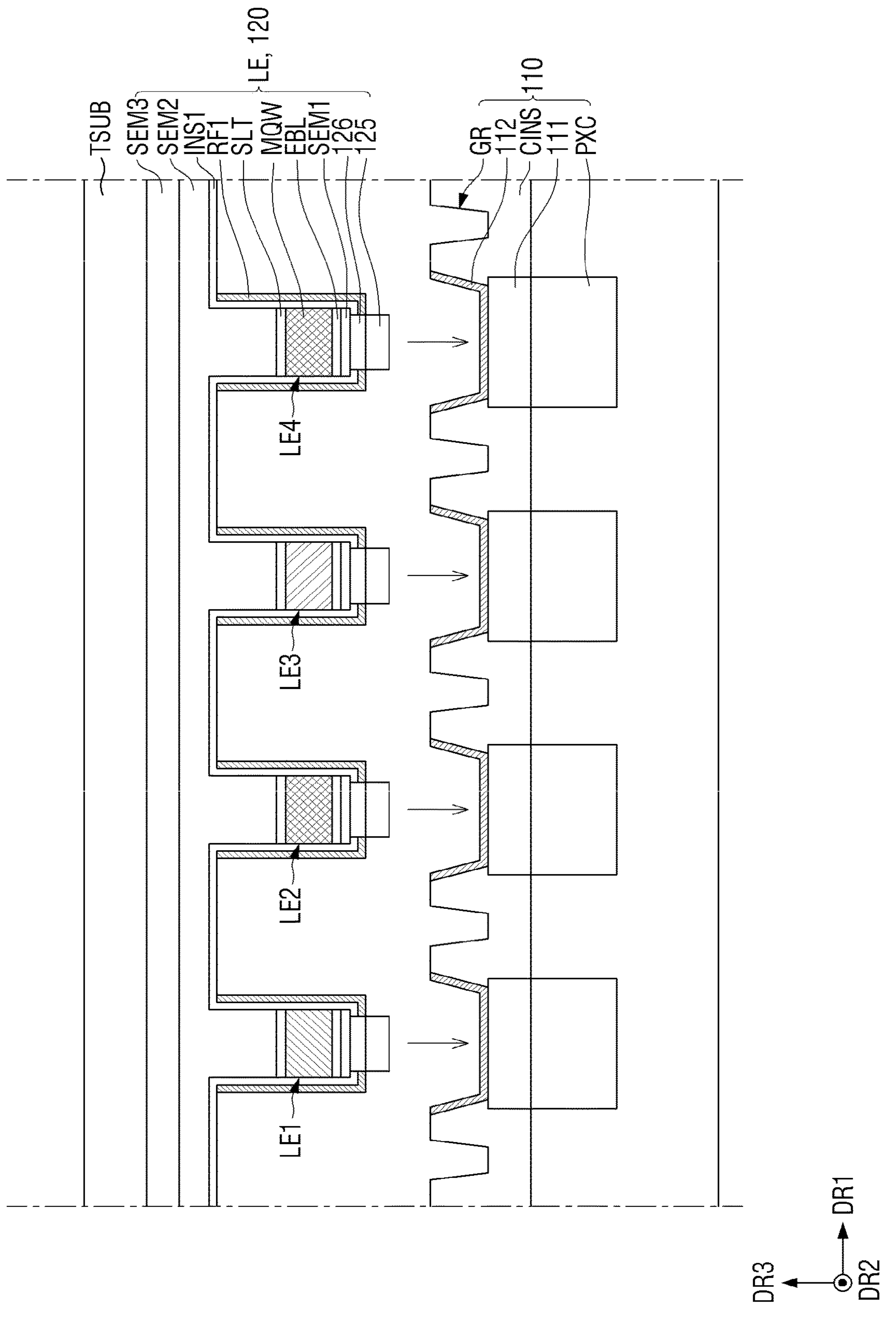
Figure 48:
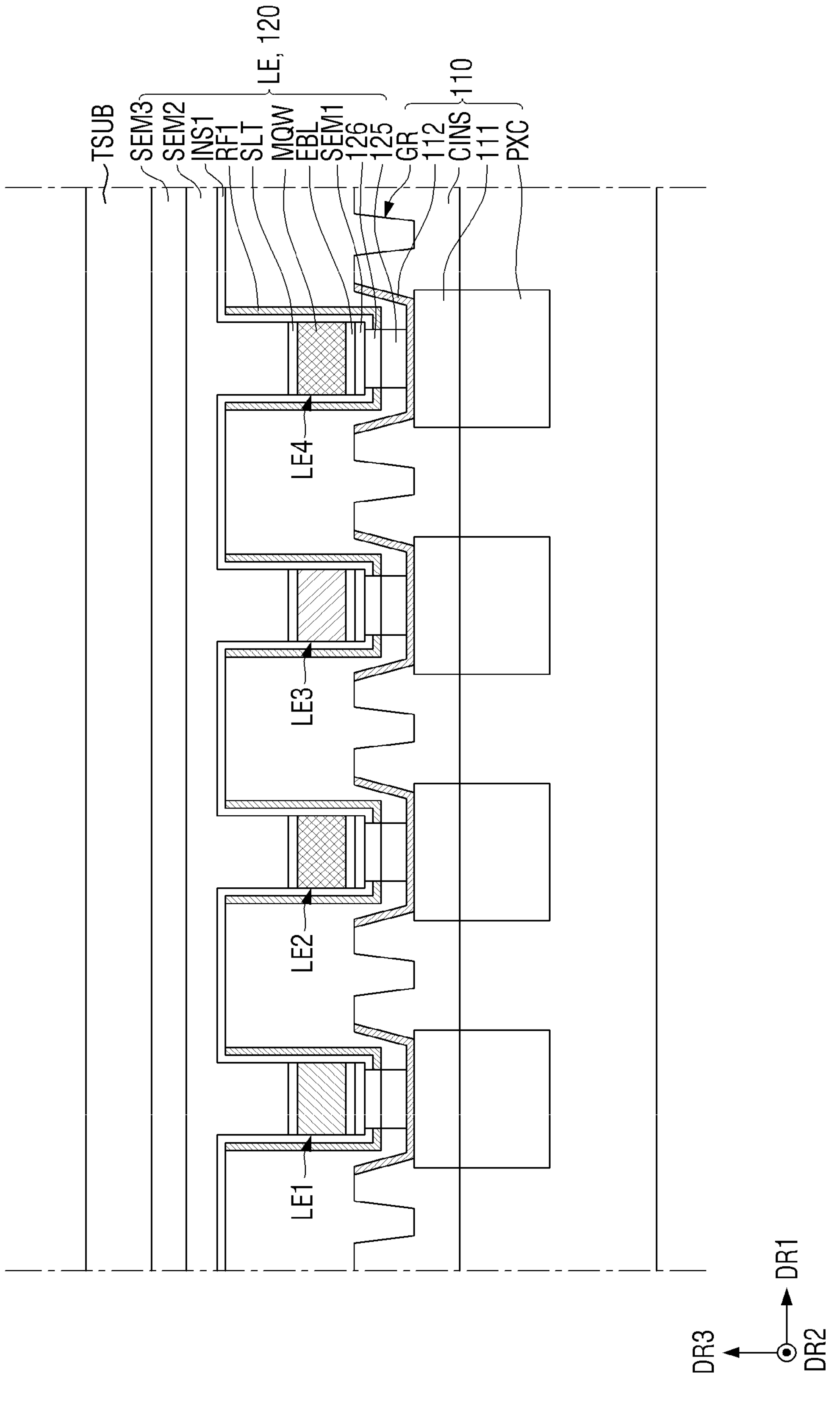

Next, referring to FIGS. 47 and 48, the first to fourth light-emitting elements LE1, LE2, LE3, and LE4 are bonded onto the semiconductor circuit board 110.

The target substrate TSUB is aligned on the semiconductor circuit board 110. Alignment keys may be disposed on the semiconductor circuit board 110 and the target substrate TSUB to align them. Subsequently, the semiconductor circuit board 110 and the target substrate TSUB are bonded to each other.

For example, the contact electrode 112 of the semiconductor circuit board 110 and the connection electrode 125 of each of the light-emitting elements LE1, LE2, LE3, and LE4 are brought into contact with each other. Then, the contact electrodes 112 and the connection electrodes 125 are melt bonded at a reference temperature (e.g., a predetermined temperature), whereby the respective light-emitting elements LE1, LE2, LE3, and LE4 are bonded to the semiconductor circuit board 110. At this time, a filler for eutectic bonding may be coated between the semiconductor circuit board 110 and the target substrate TSUB. The filler may be filled between the semiconductor circuit board 110 and the light-emitting elements LE1, LE2, LE3, and LE4 or between the semiconductor circuit board 110 and the target substrate TSUB.

Figure 49:
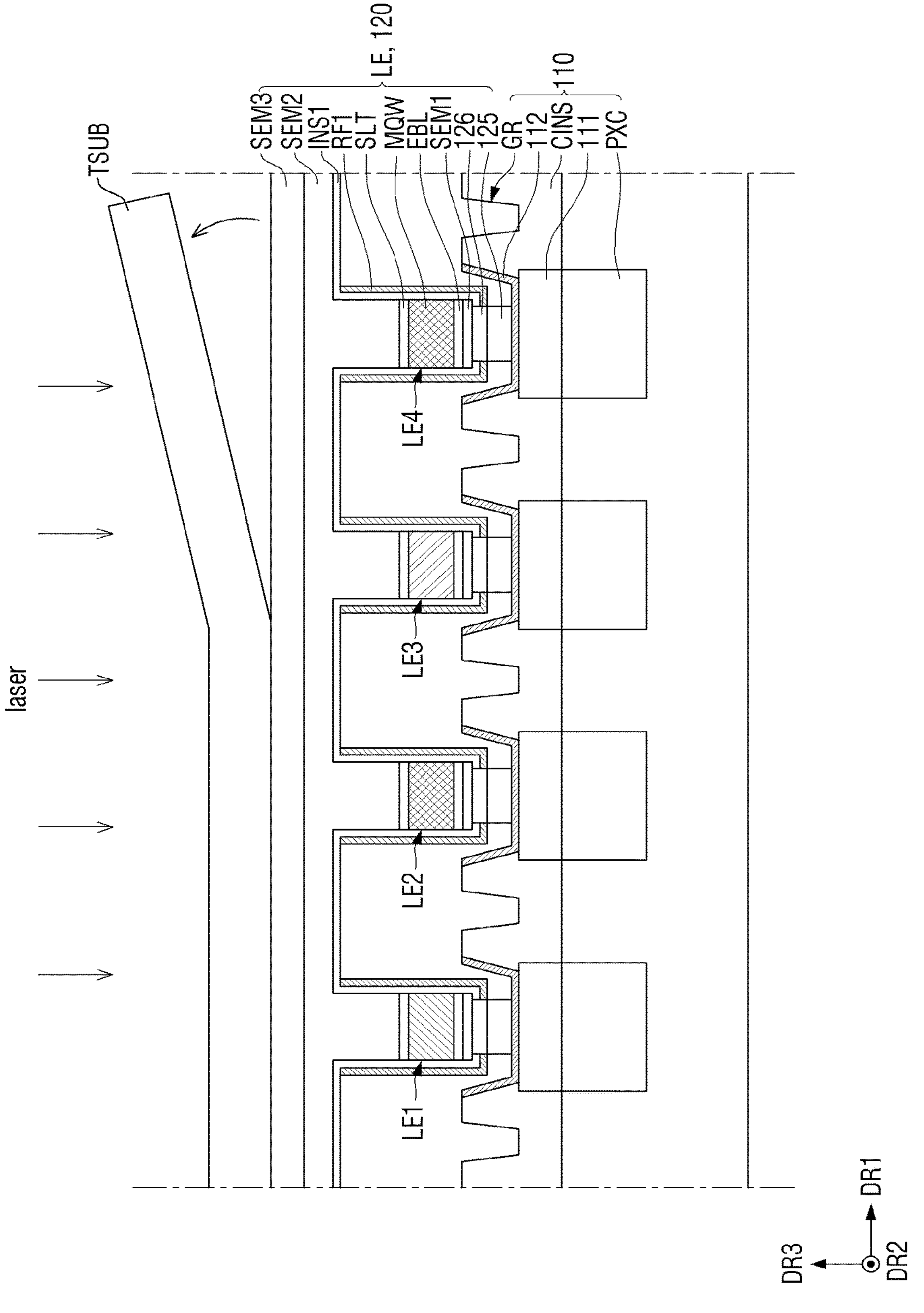

Next, referring to FIG. 49, the target substrate TSUB is separated (S109 of FIG. 30).

For example, the target substrate TSUB is separated from the third semiconductor layer SEM3. A process of separating the target substrate TSUB may be a laser lift-off (LLO) process. The laser lift-off process uses a laser, and a KrF excimer laser having wavelength of 248 nm may be used as a source. The excimer laser may be irradiated at an energy density ranging from about 550 $mJ/cm^2$ to about 950 $mJ/cm^2$, and an incident area may range from about 50×50 $\mu m^2$ to about 1×1 $cm^2$ but is not limited thereto. As a result, the display panel according to one embodiment of the present disclosure may be manufactured.

Figure 50:
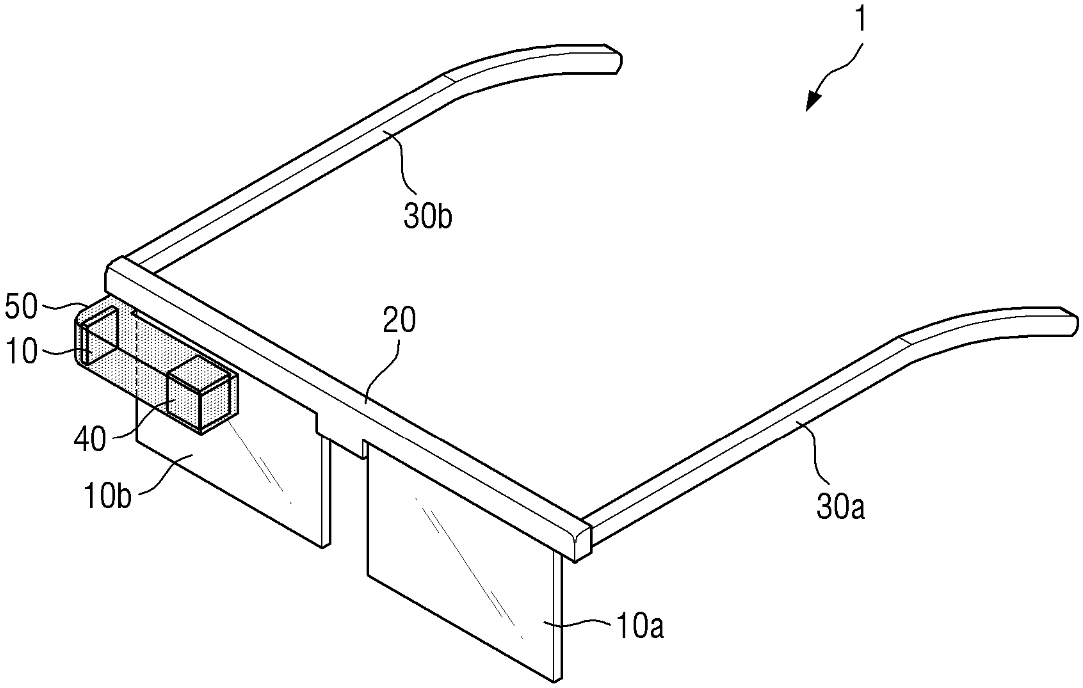
FIG. 50 is a view illustrating a virtual reality device including a display device according to one embodiment.

FIG. 50 is a view illustrating a virtual reality device including a display device according to one embodiment. In FIG. 50, a virtual reality device 1 to which a display device 10 according to one embodiment is applied is shown.

Referring to FIG. 50, the virtual reality device 1 according to one embodiment may be a glasses-type device. The virtual reality device 1 according to one embodiment may include a display device 10, a left-eye lens 10*a*, a right-eye lens 10*b*, a support frame 20, glasses frame legs 30*a* and 30*b*, a reflection member 40, and a display device accommodating portion 50.

Although FIG. 50 illustrates an embodiment of the virtual reality device 1 including glasses frame legs 30*a* and 30*b*, the virtual reality device 1 according to one embodiment may be applied to a head mounted display including a head mounting band, which may be mounted on a head, instead of the glasses frame legs 30*a* and 30*b*. For example, the virtual reality device 1 according to one embodiment is not limited to that shown in FIG. 50, and is applicable to various electronic devices in various forms.

The display device accommodating portion 50 may include a display device 10 and a reflection member 40. An image displayed on the display device 10 may be reflected by the reflection member 40 and provided to a user's right eye through the right-eye lens 10*b*. For this reason, the user may view a virtual reality image displayed on the display device 10 through the right eye.

Although FIG. 50 illustrates an embodiment in which the display device accommodating portion 50 is disposed at a right end of the support frame 20, embodiments of the present disclosure are not limited thereto. For example, the display device accommodating portion 50 may be disposed at a left end of the support frame 20, and in such an embodiment, the image displayed on the display device 10 may be reflected by the reflection member 40 and provided to the user's left eye through the left-eye lens 10*a*. For this reason, the user may view the virtual reality image displayed on the display device 10 through the left eye. In some embodiments, the display device accommodating portion 50 may be disposed at both the left end and the right end of the support frame 20, and in such an embodiment, the user may view the virtual reality image displayed on the display device 10 through both the left eye and the right eye.

Figure 51:
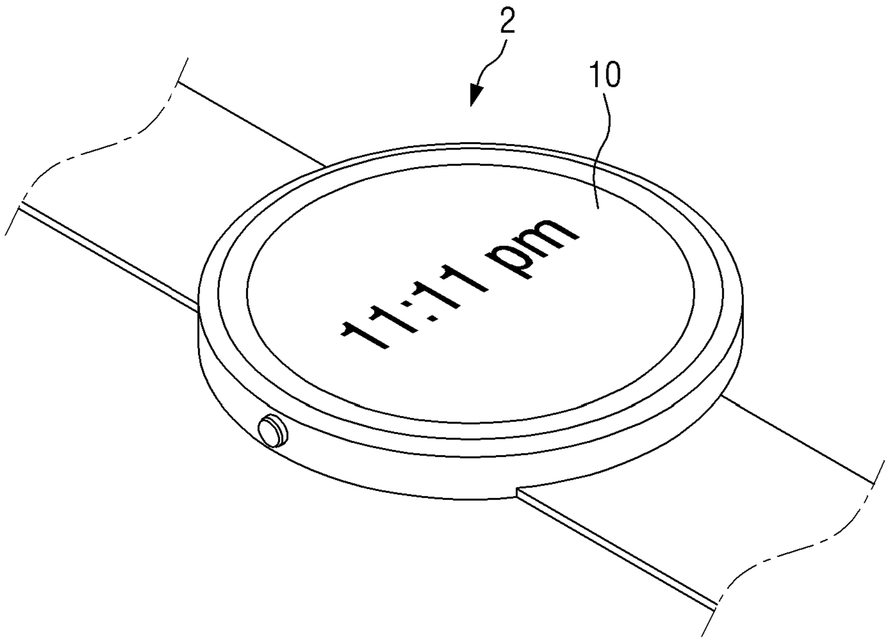
FIG. 51 is a view illustrating a smart device including a display device according to one embodiment.

FIG. 51 is a view illustrating a smart device including a display device according to one embodiment.

Referring to FIG. 51, a display device 10 according to one embodiment may be applied to a smart watch 2 that is one of the smart device.

Figure 52:
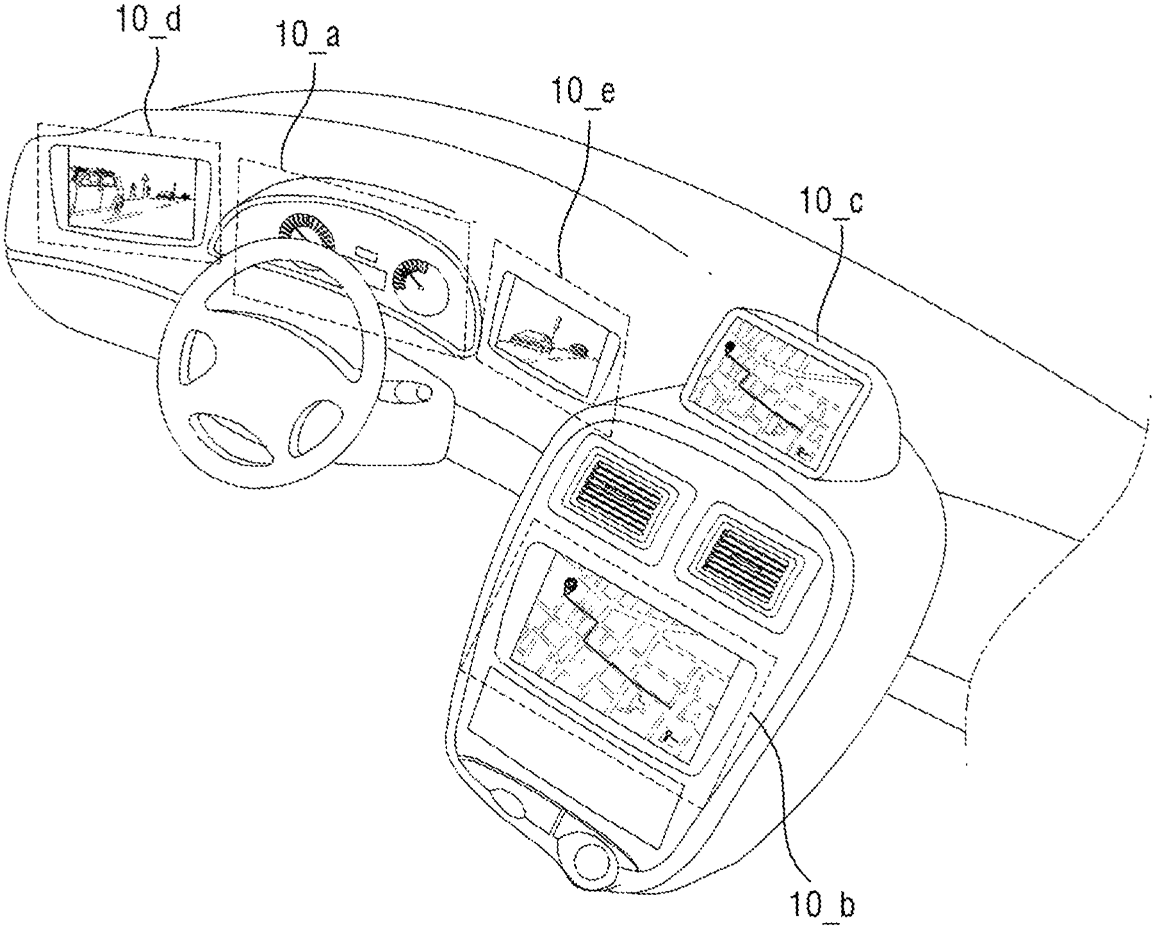
FIG. 52 is a view illustrating a vehicle including a display device according to one embodiment.

FIG. 52 is a view illustrating a vehicle including a display device according to one embodiment. A vehicle to which the display device 10 according to one embodiment is applied is shown in FIG. 52.

Referring to FIG. 52, display devices 10_*a*, 10_*b*, and 10_*c* according to one embodiment may be applied to a dashboard of the vehicle, applied to a center fascia of the vehicle, or applied to a center information display (CID) disposed on the dashboard of the vehicle. In addition, display devices 10_*d* and 10_*e* according to one embodiment may be applied to a room mirror display that replaces a side mirror of the vehicle.

Figure 53:
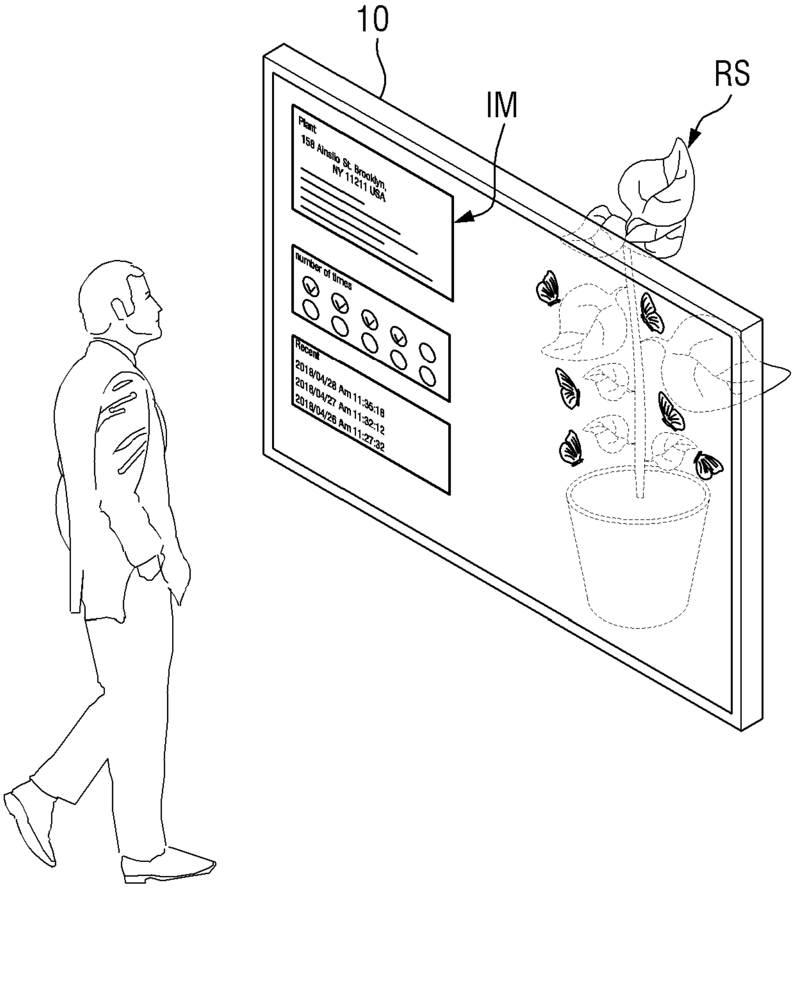
FIG. 53 is a view illustrating a transparent display device including a display device according to one embodiment.

FIG. 53 is a view illustrating a transparent display device including a display device according to one embodiment.

Referring to FIG. 53, a display device 10 according to one embodiment may be applied to the transparent display device. The transparent display device may display an image IM and, at the same time, transmit light. Therefore, a user located on a front surface of the transparent display device may not only view the image IM displayed on the display device 10 but also view an object RS or background located on a rear surface of the transparent display device. When the display device 10 is applied to the transparent display device, the semiconductor circuit board 110 of the display device 10 shown in, for example, FIG. 4 may include a light transmitting portion capable of transmitting light or may be formed of a material capable of transmitting light.

In concluding the detailed description, those skilled in the art will appreciate that many variations and modifications can be made to the embodiments described herein without departing from the principles of the present disclosure. Therefore, the disclosed embodiments of the present disclosure are to be understood and used in a generic and descriptive sense and not for purposes of limitation.

What is claimed is:

1. A display device comprising:

a substrate comprising pixel electrodes;

a passivation layer on the substrate, a plurality of openings in the passivation layer respectively overlapping the pixel electrodes and a groove in the passivation layer between the openings and the pixel electrodes;

contact electrodes respectively on the pixel electrodes and extending upwardly onto and along a side surface of the passivation layer defining the opening in the passivation layer; and a light-emitting element layer comprising a plurality of light-emitting elements respectively bonded onto the contact electrodes and having a plurality of semiconductor layers thereon, wherein the groove does not overlap the plurality of light-emitting elements, wherein the contact electrodes do not contact a bottom surface of the passivation layer connected to the side surface of the passivation layer.

2. The display device of claim 1, wherein the groove extends around a periphery of the plurality of light-emitting elements and is between the plurality of light-emitting elements.

3. The display device of claim 1, wherein the groove is between two adjacent ones of the contact electrodes, and wherein a width of the groove is smaller than a distance between the two adjacent ones of the contact electrodes.

4. The display device of claim 1, wherein the passivation layer has openings exposing the pixel electrodes, and wherein the groove is between the openings.

5. The display device of claim 1, wherein the groove has a mesh shape.

6. The display device of claim 1, wherein a length of the groove is smaller than or equal to a width of the plurality of light-emitting elements.

7. The display device of claim 1, wherein a depth of the groove is smaller than or equal to a thickness of the passivation layer.

8. The display device of claim 1, wherein the groove comprises a plurality of grooves, and wherein the plurality of grooves comprises a first groove adjacent to the plurality of light-emitting elements and a second groove adjacent to the first groove.

9. The display device of claim 8, wherein a width and a depth of the first groove is greater than a width and a depth, respectively, of the second groove.

10. The display device of claim 8, wherein the second groove comprises a (2-1)th groove and a (2-2)th groove that are spaced apart from each other, and wherein each of the (2-1)th groove and the (2-2)th groove overlaps the first groove in one direction on a plane.

11. The display device of claim 10, wherein the first groove comprises a (1-1)th groove and a (1-2)th groove that are spaced apart from each other, and wherein each of the (1-1)th groove and the (1-2)th groove overlaps the (2-1)th groove in one direction on a plane.

12. The display device of claim 8, wherein the first groove extends around a periphery of one of the plurality of light-emitting elements, wherein the second groove extends around a periphery of another one of the plurality of light-emitting elements, and wherein the first groove and the second groove have a closed loop shape.

13. A display device comprising:

a substrate comprising pixel electrodes;

a passivation layer on the substrate and having a groove between the pixel electrodes, the groove extending less than entirely through the passivation layer in a thickness direction of the passivation layer such that a bottom of the groove is formed by the passivation layer;

a contact electrode on the pixel electrode; and a light emitting element layer comprising:

a plurality of light-emitting elements respectively bonded onto the contact electrodes and having a plurality of semiconductor layers thereon; and a partition wall between the plurality of light-emitting elements, wherein the partition wall is above the passivation layer, wherein the groove overlaps the partition wall, and wherein the partition wall is spaced apart from the bottom of the groove.

14. The display device of claim 13, wherein the partition wall protrudes toward the groove, and wherein a width of the partition wall is smaller than that of the light-emitting elements.

15. The display device of claim 13, wherein the partition wall is in the groove.

16. The display device of claim 13, wherein a width of the partition wall is smaller than that of the groove.

17. The display device of claim 13, wherein the plurality of semiconductor layers of the light emitting element layer comprises a second semiconductor layer and a third semiconductor layer on the second semiconductor layer, wherein each of the plurality of light-emitting elements comprises a first portion of a first semiconductor layer, a first portion of an active layer on the first portion of first semiconductor layer, a first portion of the second semiconductor layer on the first portion of the active layer, and a first portion of the third semiconductor layer on the first portion of the second semiconductor layer, and wherein the partition wall comprises a second portion of the-first semiconductor layer, a second portion of the-active layer on the second portion of the first semiconductor layer, a second portion of the-second semiconductor layer on the second portion of the active layer, and a second portion of the-third semiconductor layer on the second portion of the second semiconductor layer.

18. The display device of claim 17, wherein the second semiconductor layer portion and the third semiconductor layer are common layers that are continuously in the plurality of light-emitting elements and the partition wall.

19. The display device of claim 17, further comprising a first insulating layer extending around a periphery of the first semiconductor layer, the active layer, the second semiconductor layer, and the third semiconductor layer, wherein the first insulating layer exposes a portion of the first semiconductor layer of the plurality of light-emitting elements and covers the first semiconductor layer of the partition wall.

20. An electronic device comprising:

a substrate having a first light emission area, a second light emission area, a third light emission area, and a fourth light emission area;

pixel electrodes on the substrate and overlapping each of the first light emission area, the second light emission area, the third light emission area, and the fourth light emission area;

a passivation layer on the substrate, the passivation layer having a groove between the pixel electrodes; and a plurality of light-emitting elements respectively bonded to the pixel electrodes and having a plurality of semiconductor layers thereon, wherein the groove extends around a periphery of the first light emission area, the second light emission area, the third light emission area and the fourth light emission area, and wherein the groove does not overlap the first light emission area, the second light emission area, the third light emission area, and the fourth light emission area, and wherein at least one of the plurality of semiconductor layers extends over the groove in a direction normal to the substrate without being in the groove.

* * * * *